United States Patent [19]
Rodriguez et al.

[11] Patent Number: 5,483,176
[45] Date of Patent: Jan. 9, 1996

[54] LOW POWER MODULE

[75] Inventors: Louis Rodriguez, Austin; Clark R. Williams, Plano; Bradley M. Harrington, Carrollton, all of Tex.

[73] Assignee: Dallas Semiconductor Corporation, Dallas, Tex.

[21] Appl. No.: 15,506

[22] Filed: Feb. 9, 1993

Related U.S. Application Data

[63] Continuation-in-part of Ser. No. 728,229, Jul. 10, 1991, abandoned.

[51] Int. Cl.$^6$ .................................................. H03K 19/094
[52] U.S. Cl. .................................. 326/21; 326/34; 326/83
[58] Field of Search ................................. 307/443, 446, 307/451, 475, 273, 296.1; 326/21, 34, 83

[56] References Cited

U.S. PATENT DOCUMENTS

| | | | |
|---|---|---|---|
| 3,651,340 | 3/1972 | Cliff | 326/34 X |
| 4,209,713 | 6/1980 | Satou et al. | 326/21 X |
| 4,833,350 | 5/1989 | Frisch | 307/475 |
| 4,853,560 | 8/1989 | Iwamura et al. | 307/475 X |
| 4,897,564 | 1/1990 | Chen | 307/475 |
| 5,151,622 | 9/1992 | Thrower et al. | 307/451 X |
| 5,179,298 | 1/1993 | Hirano et al. | 307/443 |
| 5,276,365 | 1/1994 | Maekawa | 307/443 X |

OTHER PUBLICATIONS

Hayt & Kemmerly, *Engineering Circuit Analysis*, McGraw-Hill Book Co., New York 1962, pp. 27–28.

*Primary Examiner*—David R. Hudspeth
*Attorney, Agent, or Firm*—Jenkens & Gilchrist

[57] ABSTRACT

A timekeeping integrated circuit with devices partitioned into areas with different power supplies and level translators between the areas; the level translators use a memory cell for isolation and to shorten the signal active time for low power consumption. Also a one-wire communication port with low power input buffers may be used to detect very slowly varying voltages. The input buffers include staged decreasing resistors as a power dissipation limitation.

46 Claims, 56 Drawing Sheets

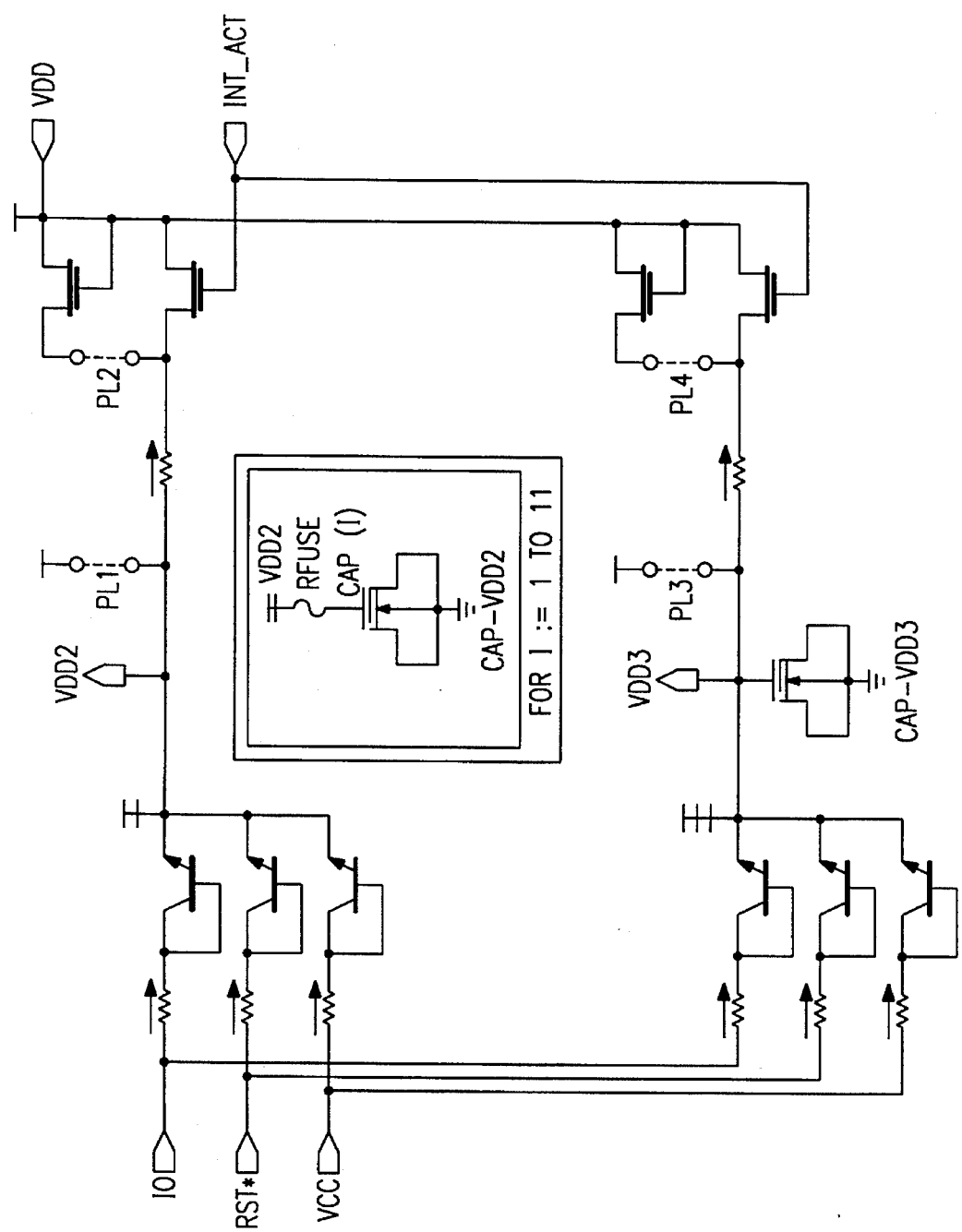
FIG. 4A1

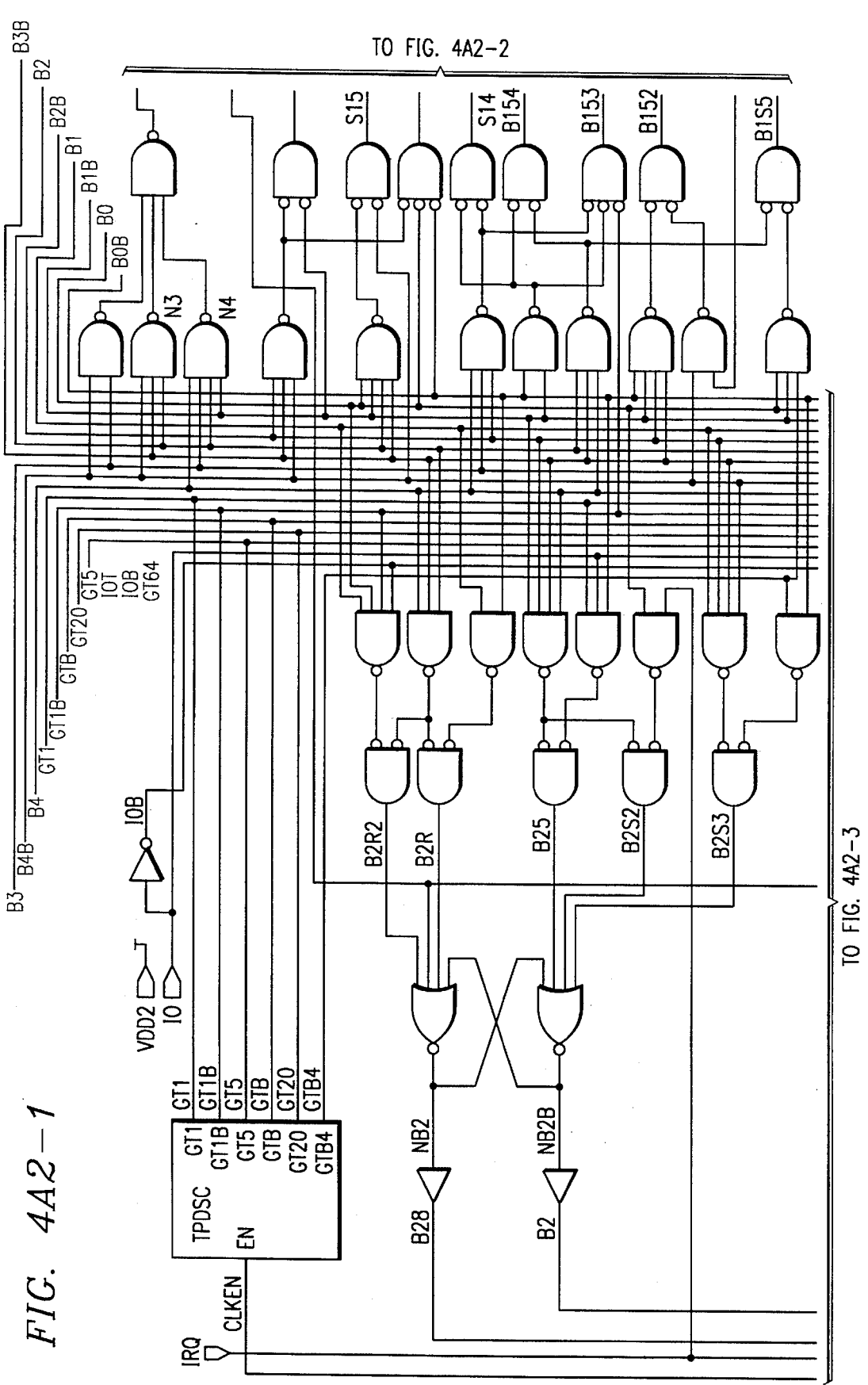
FIG. 4A2-1

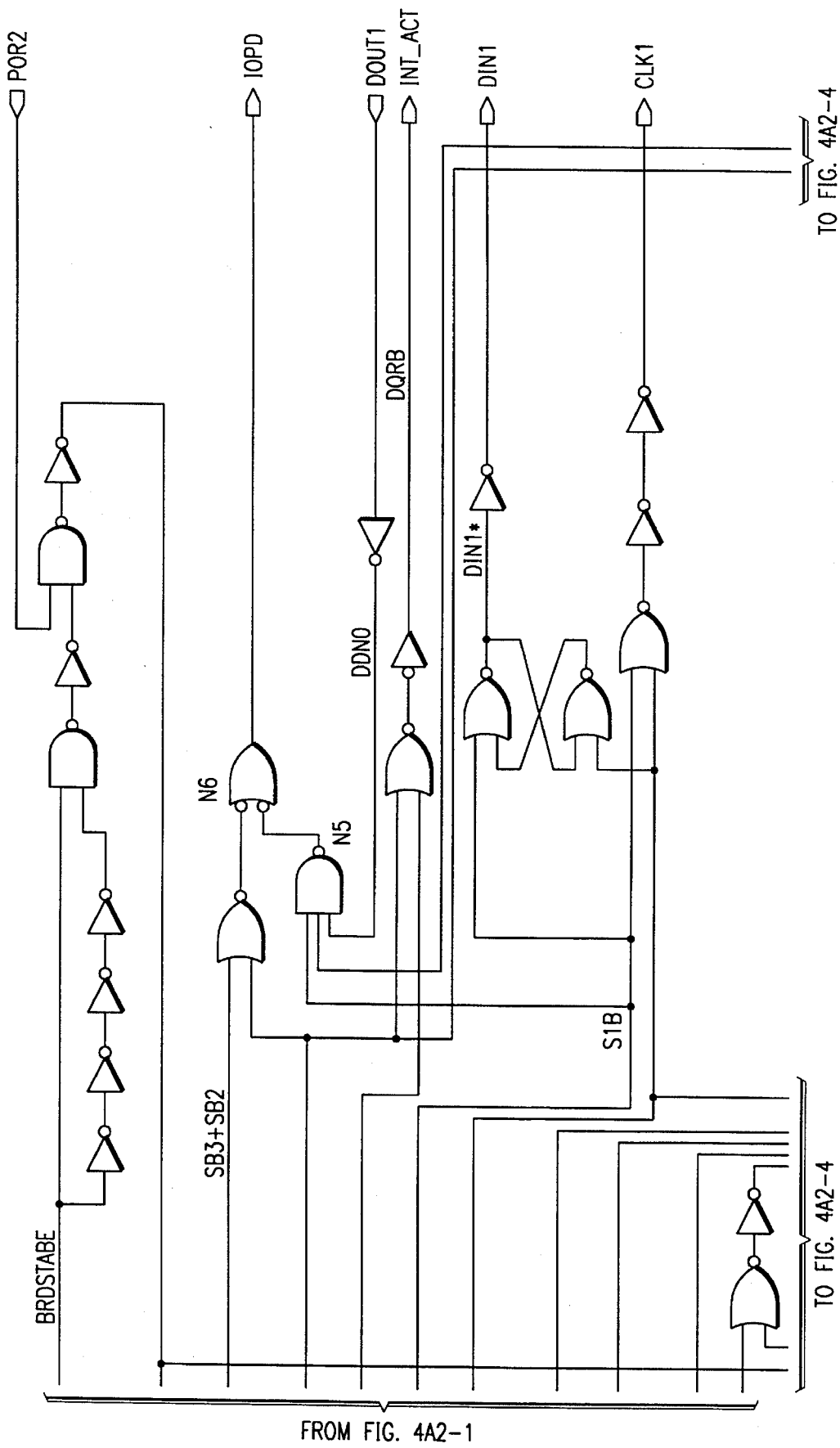
FIG. 4A2-2

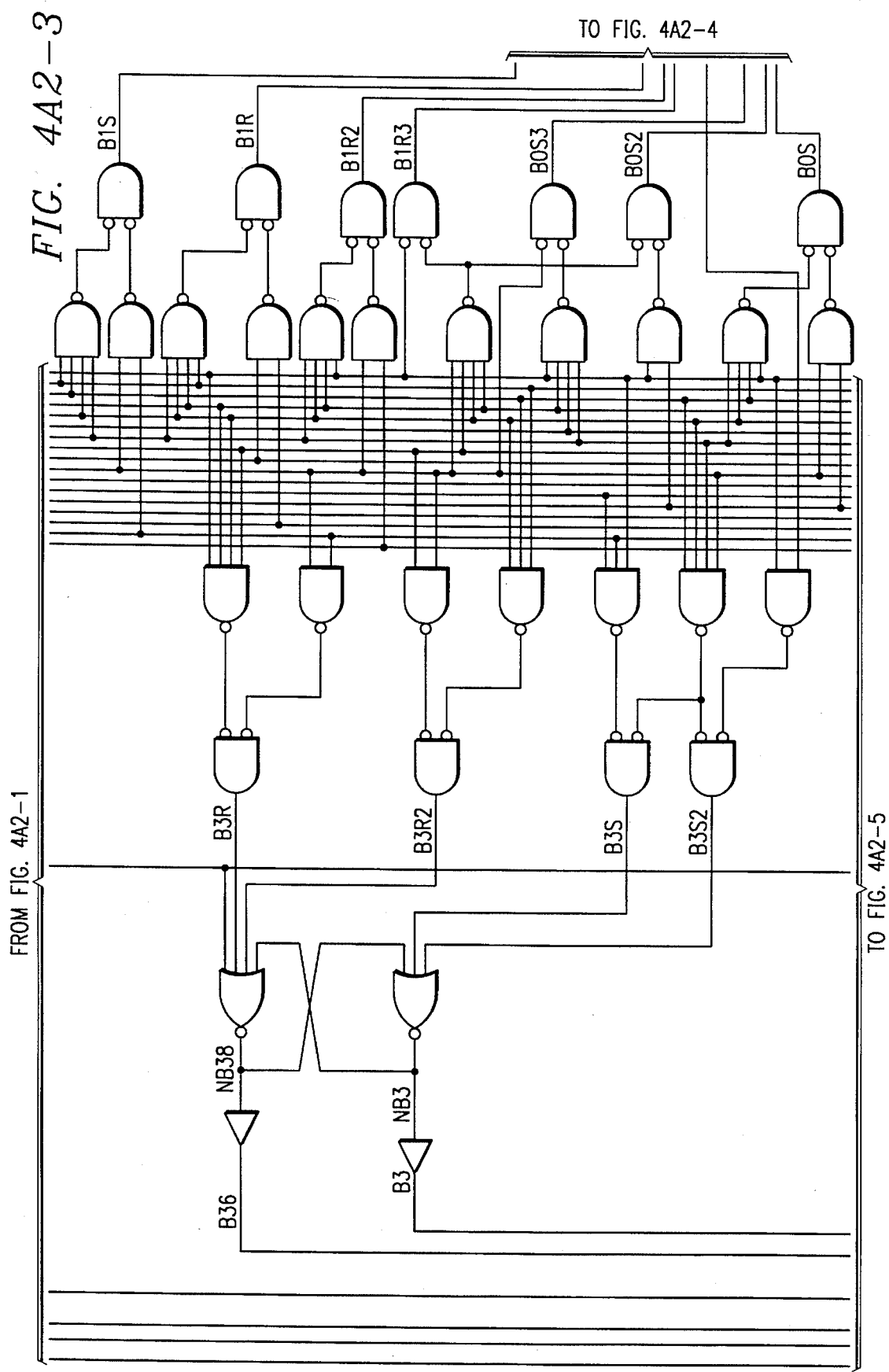

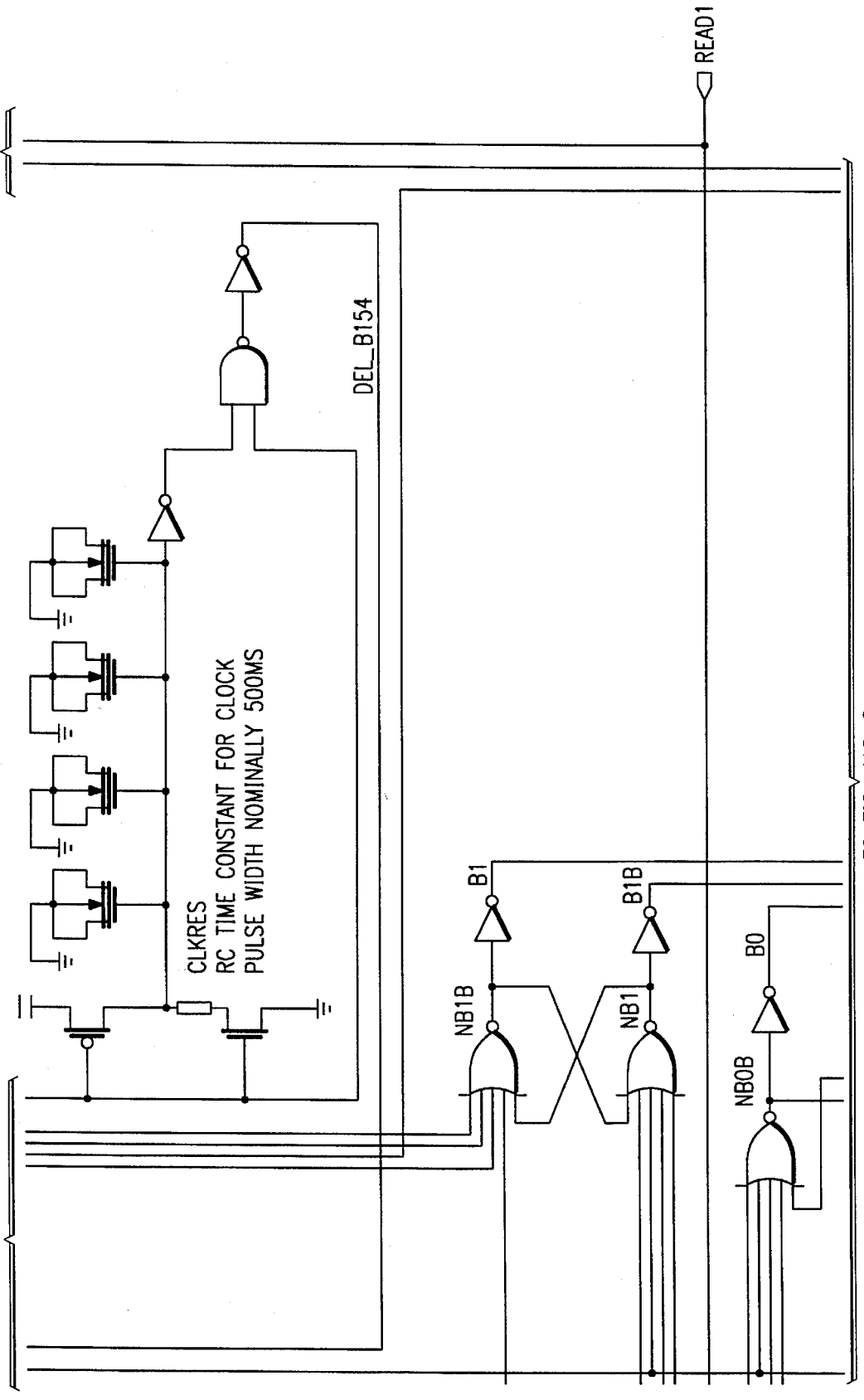

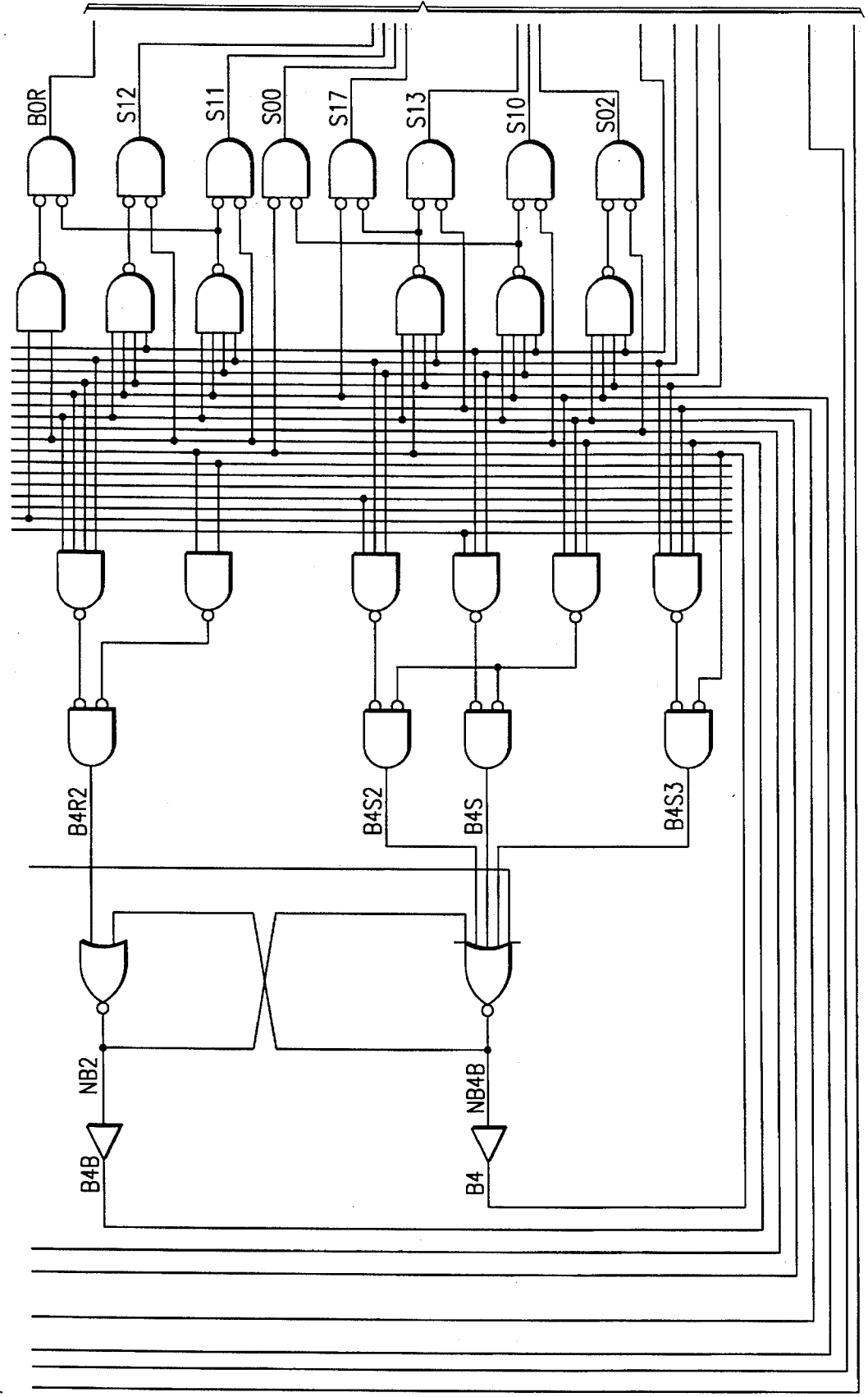
FIG. 4A2-5

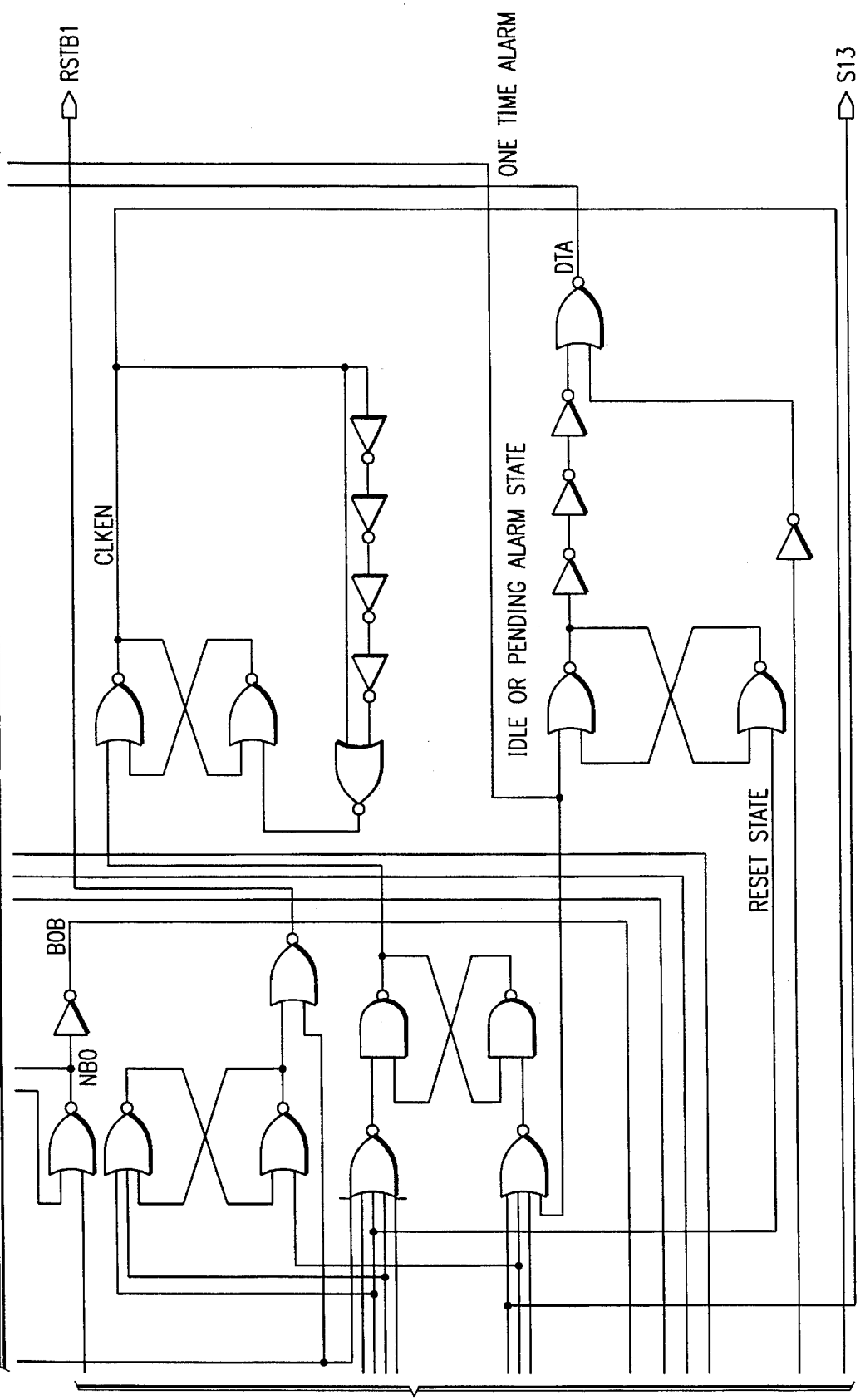
FIG. 4A2-6

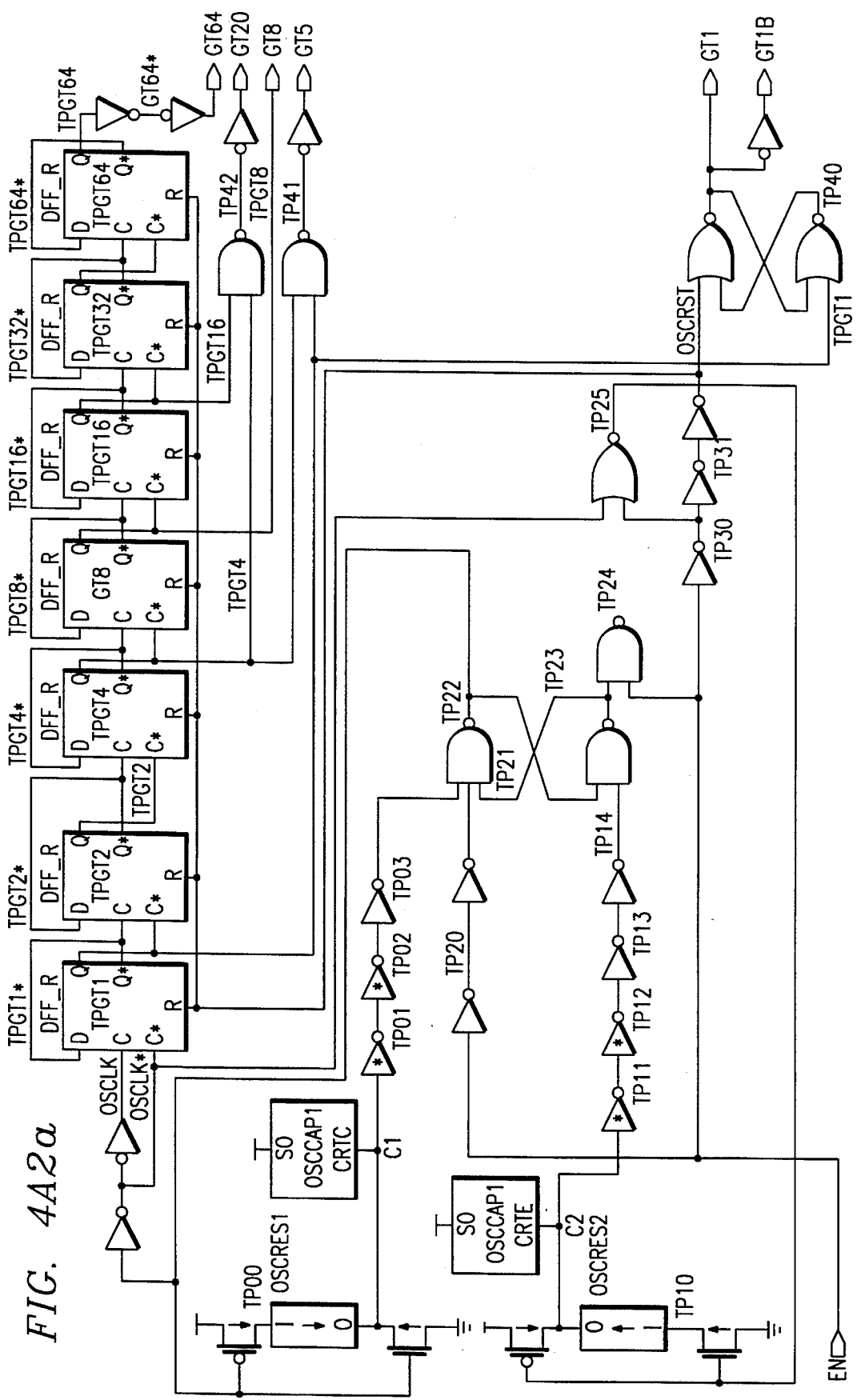
FIG. 4A2a

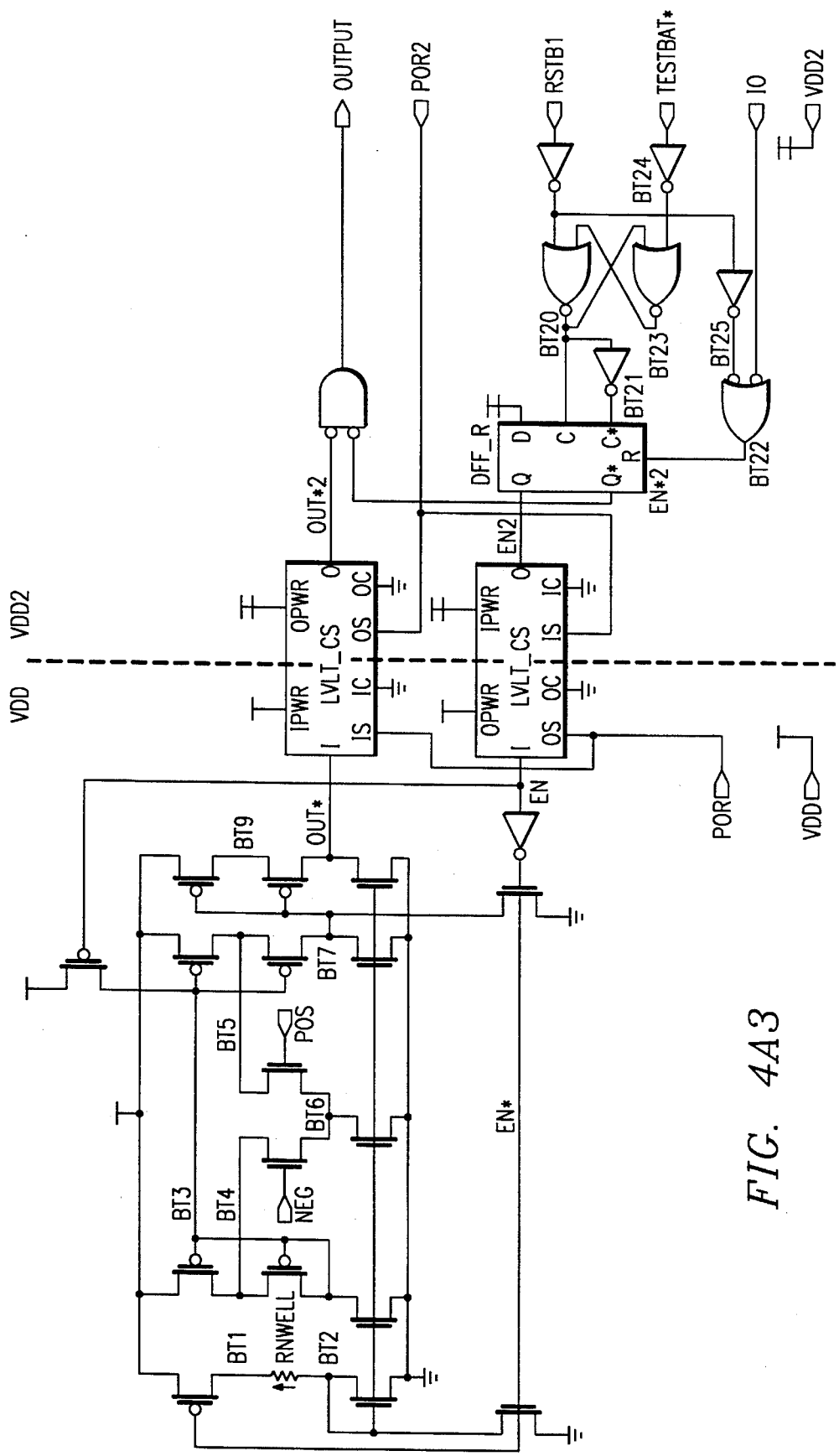
FIG. 4A3

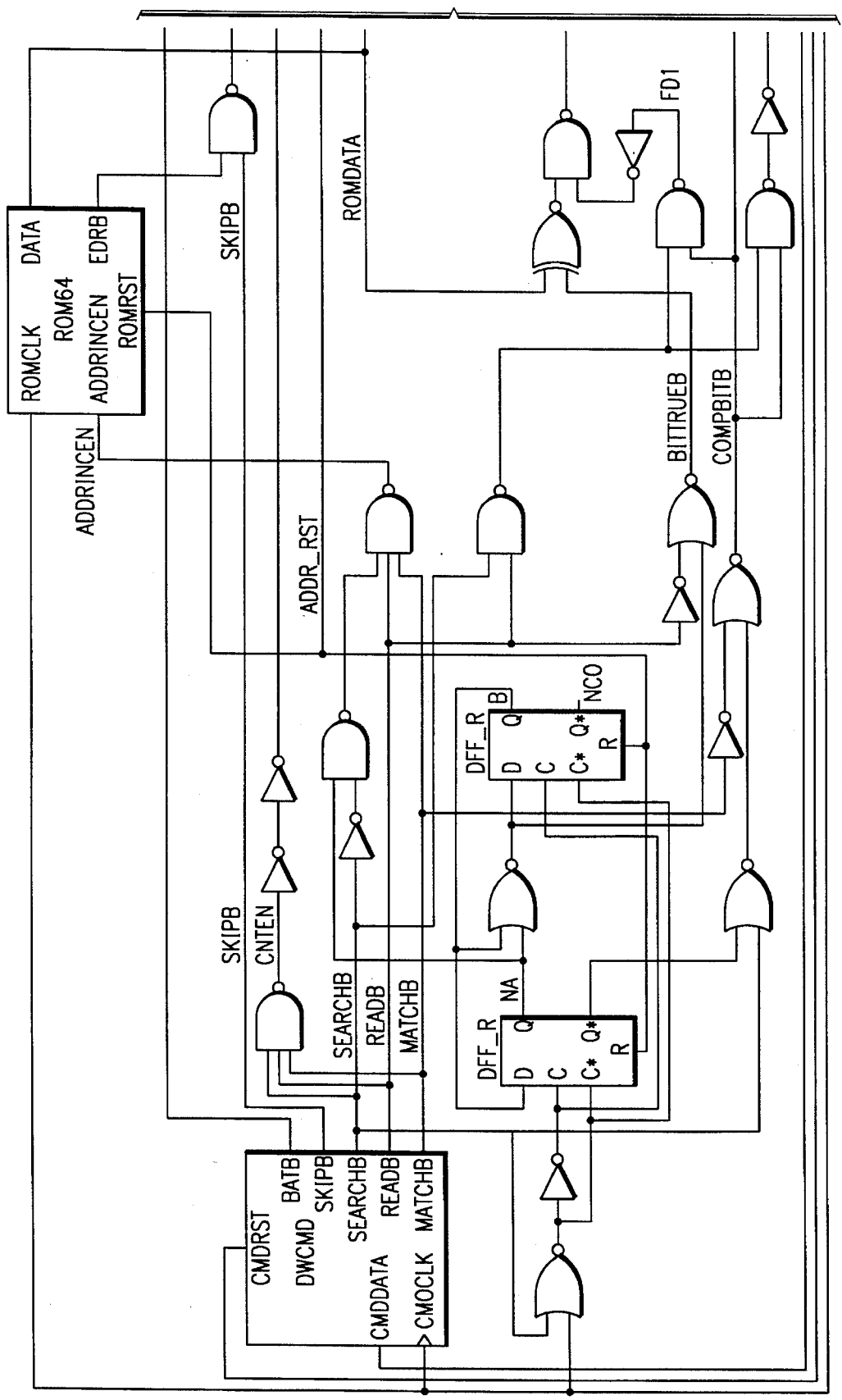
FIG. 4A4-1

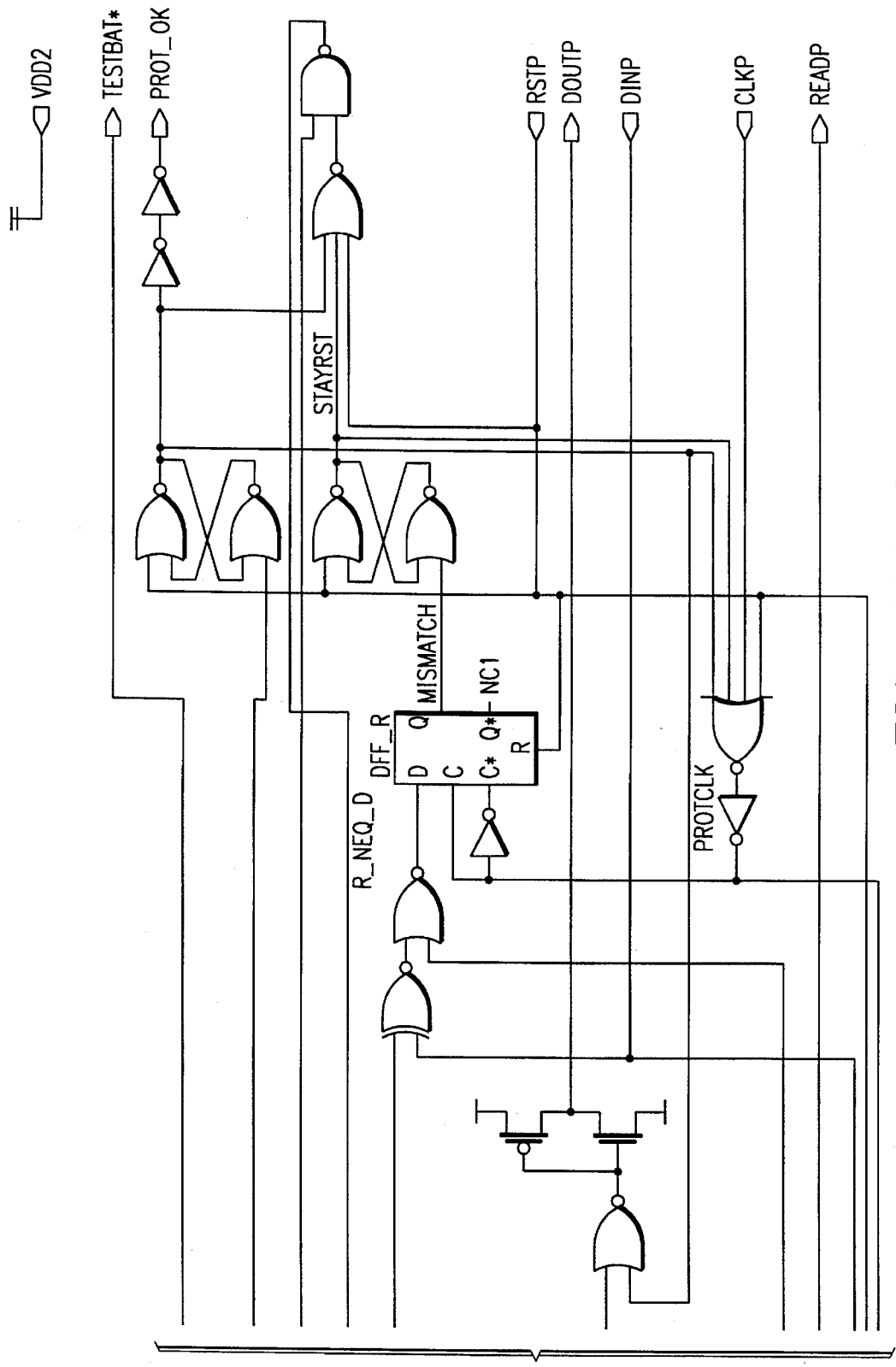
FIG. 4A4-2

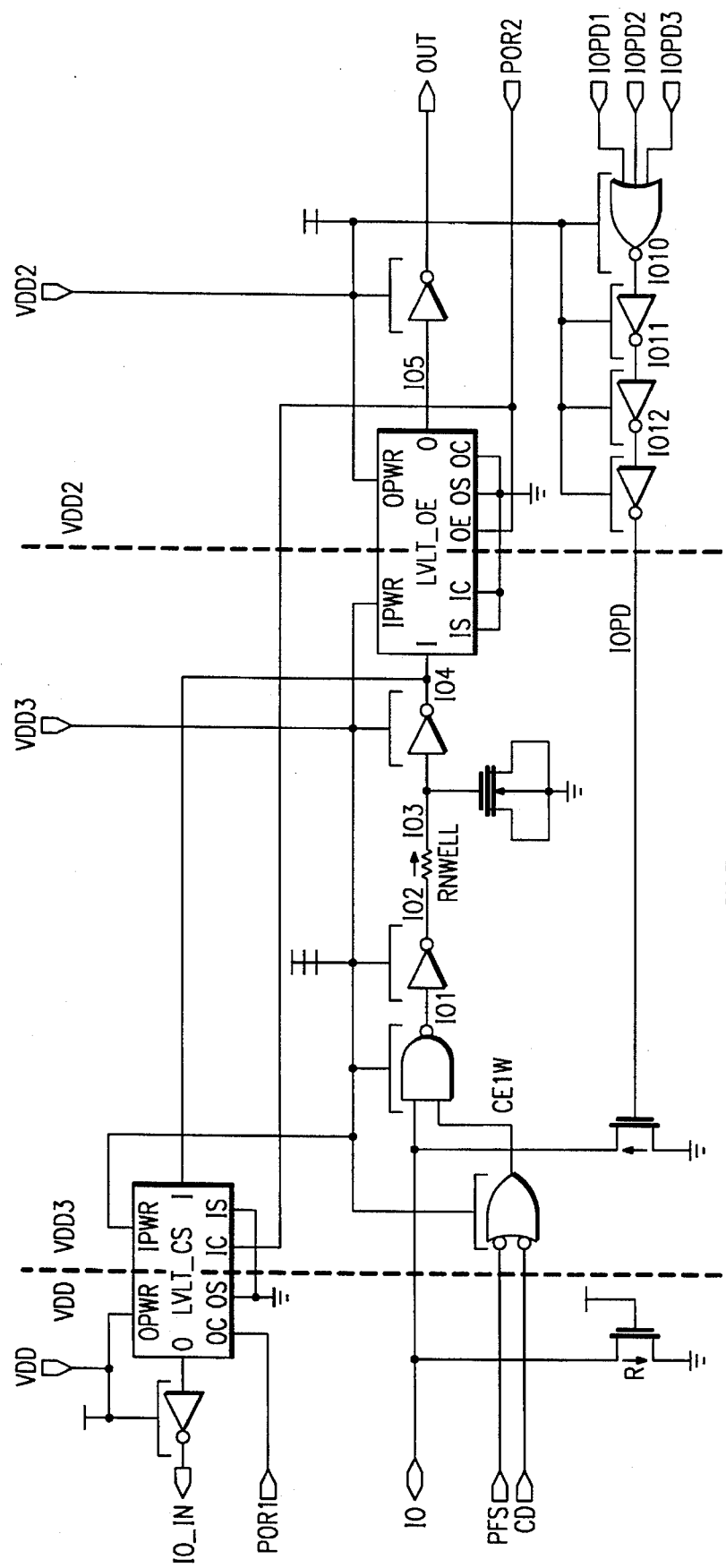
FIG. 4A5

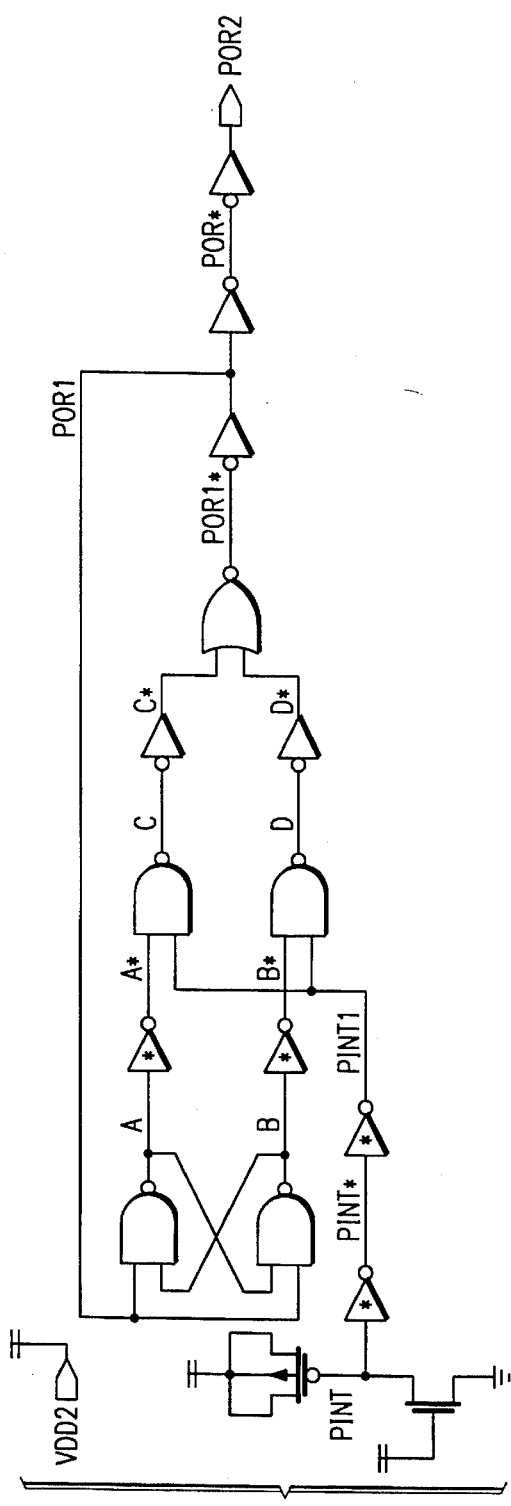
FIG. 4A6
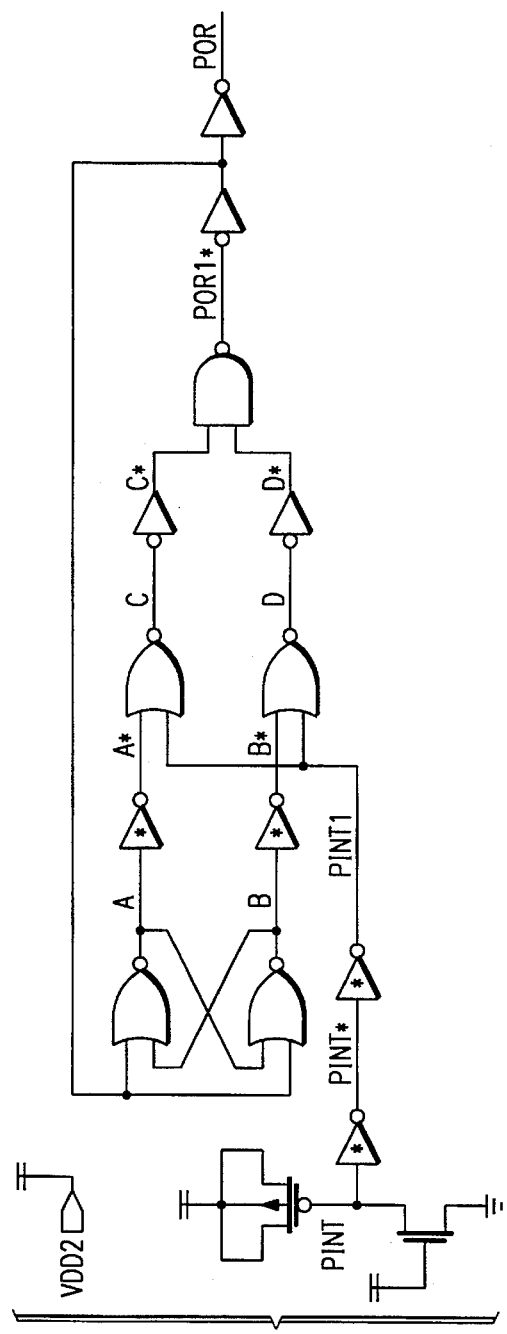
FIG. 4A6a

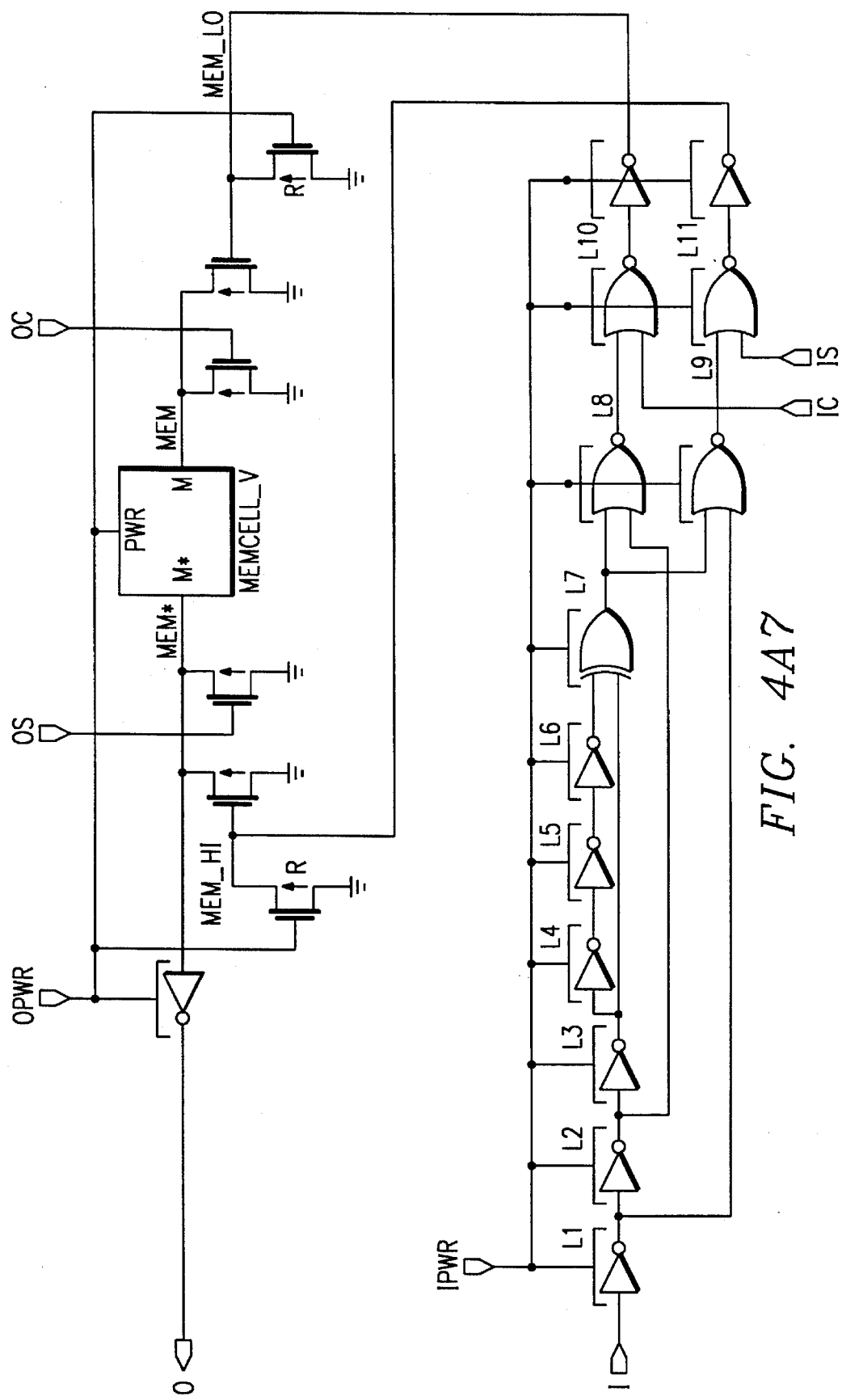
FIG. 4A7

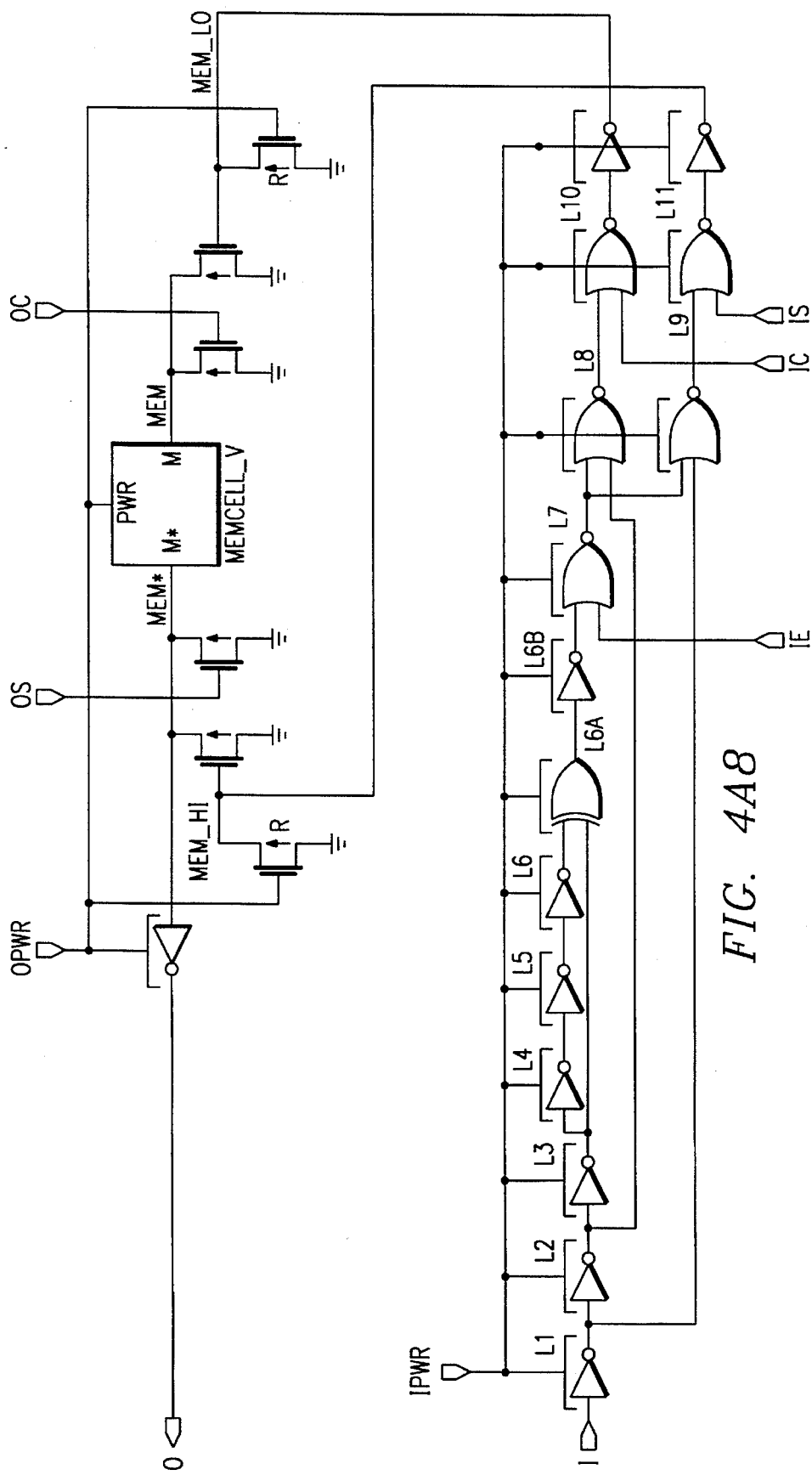
FIG. 4A8

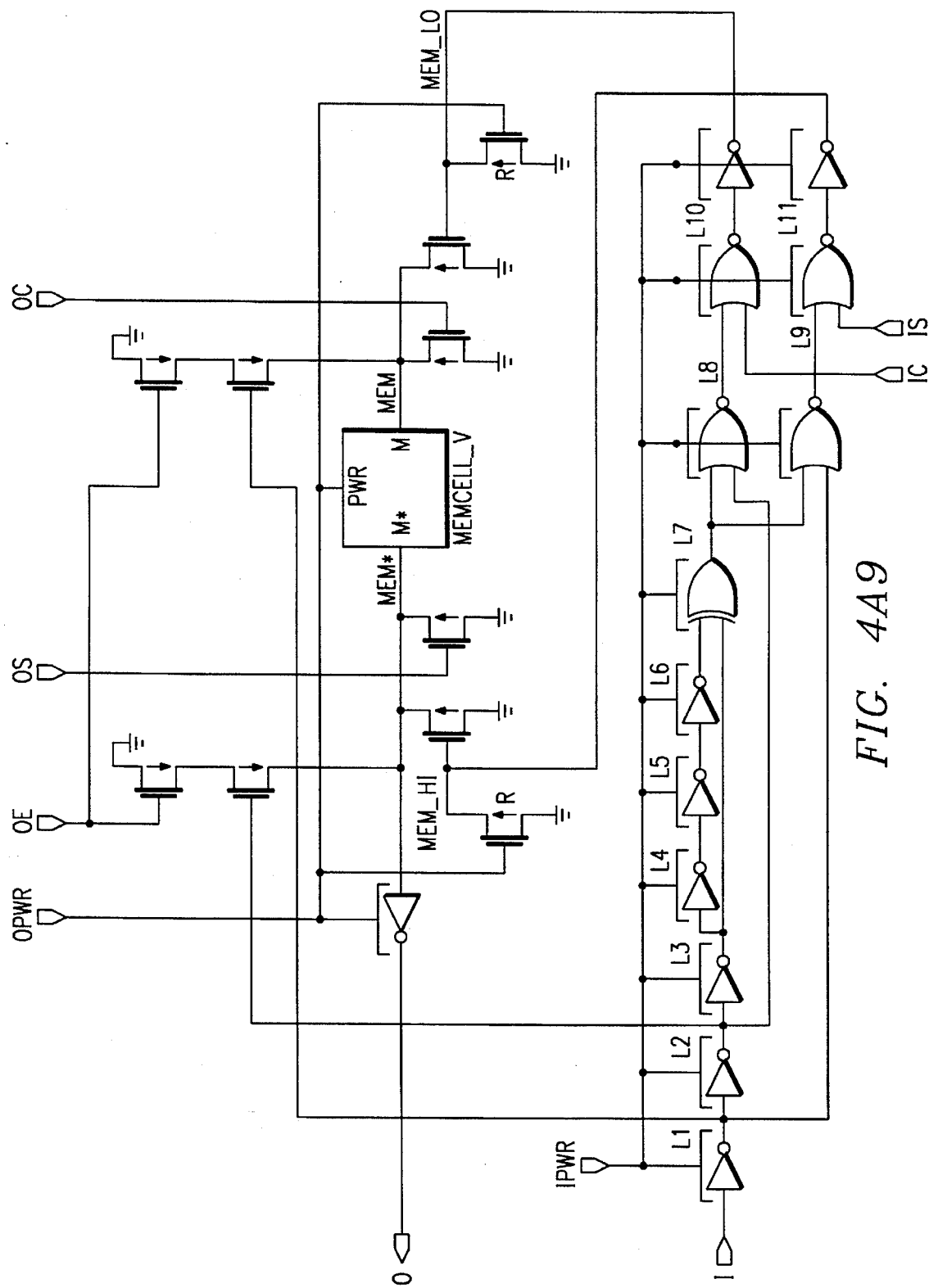
FIG. 4A9

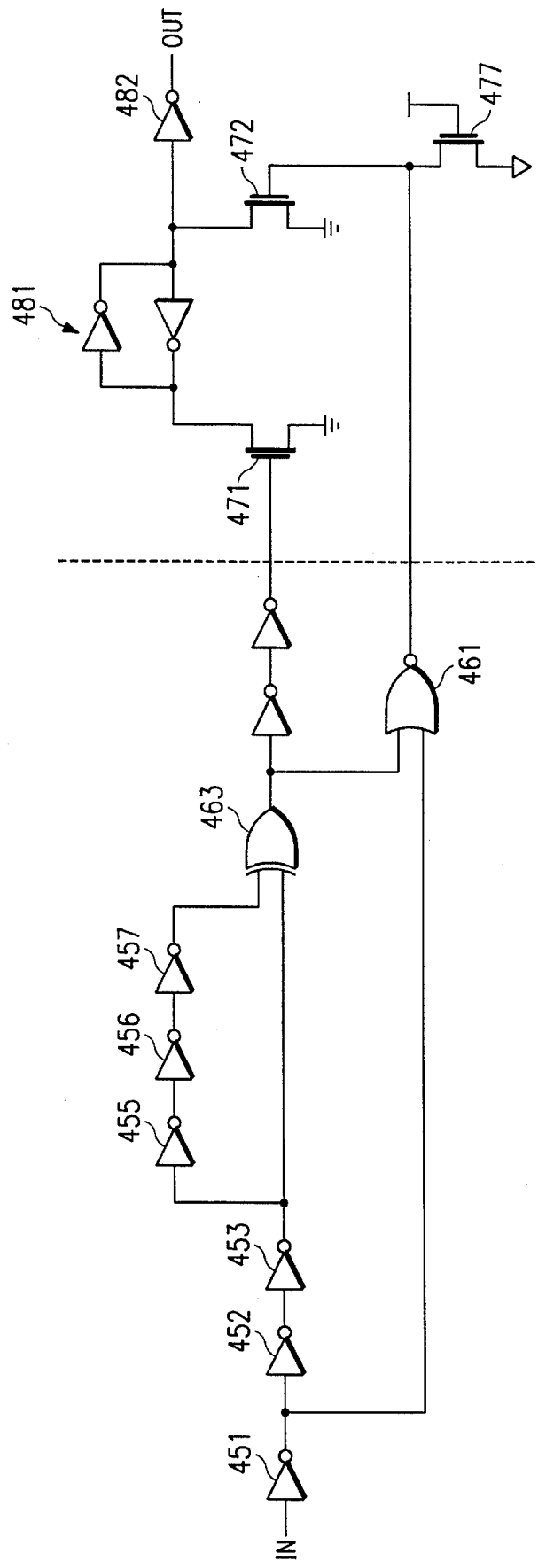
FIG. 4A10

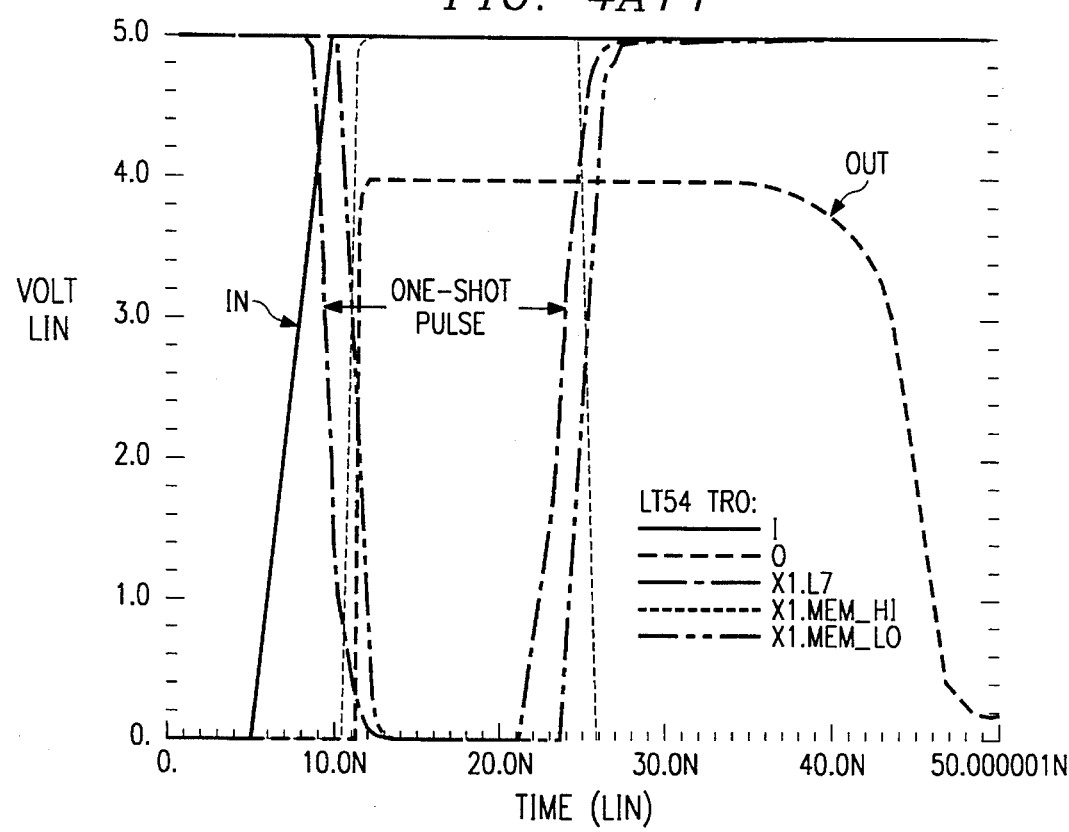
FIG. 4A11
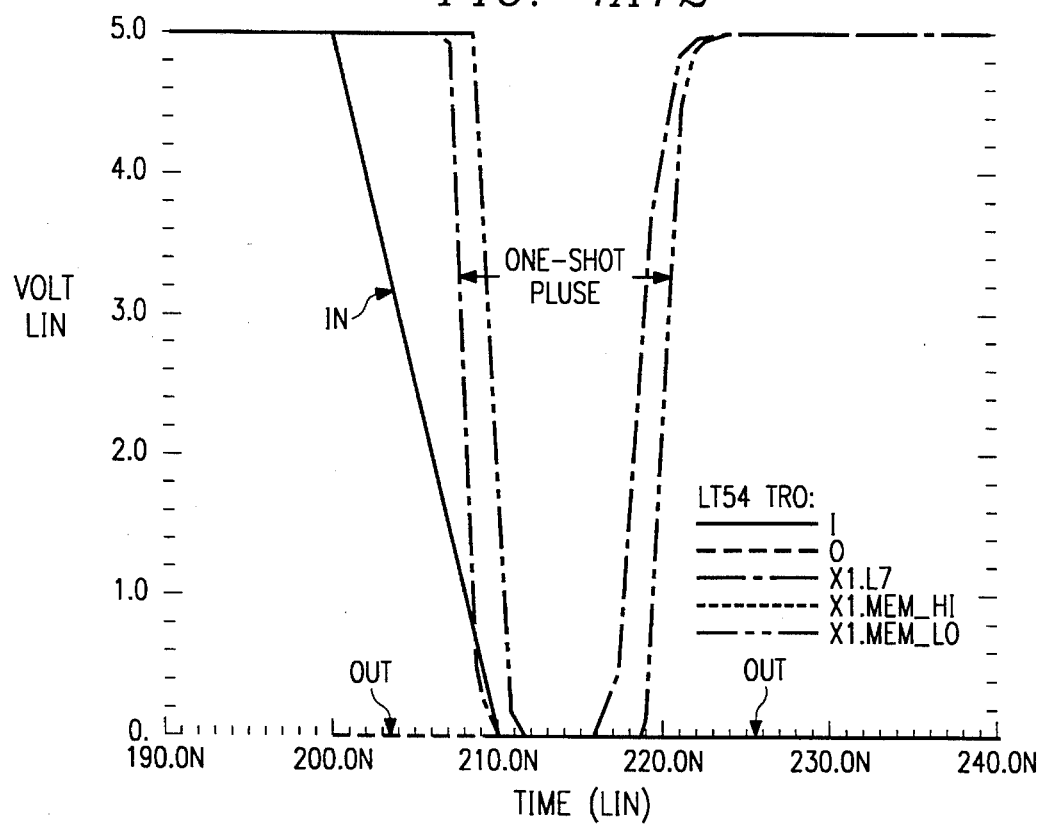
FIG. 4A12

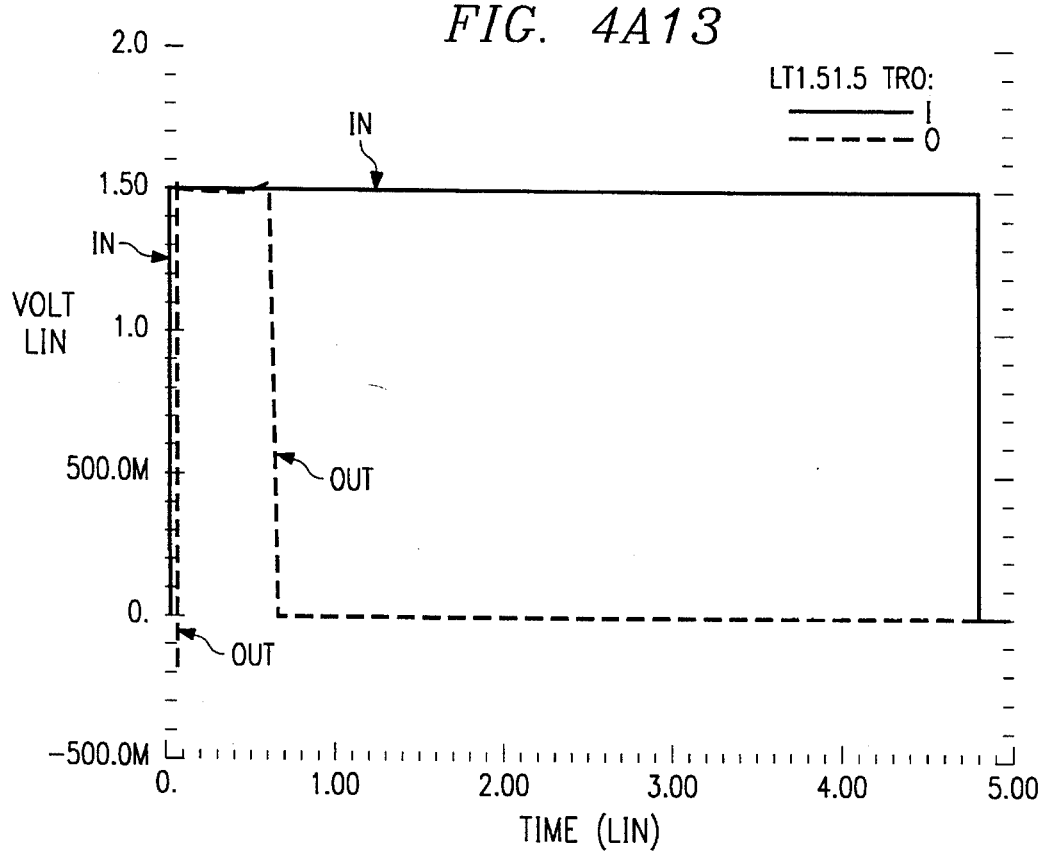
FIG. 4A13
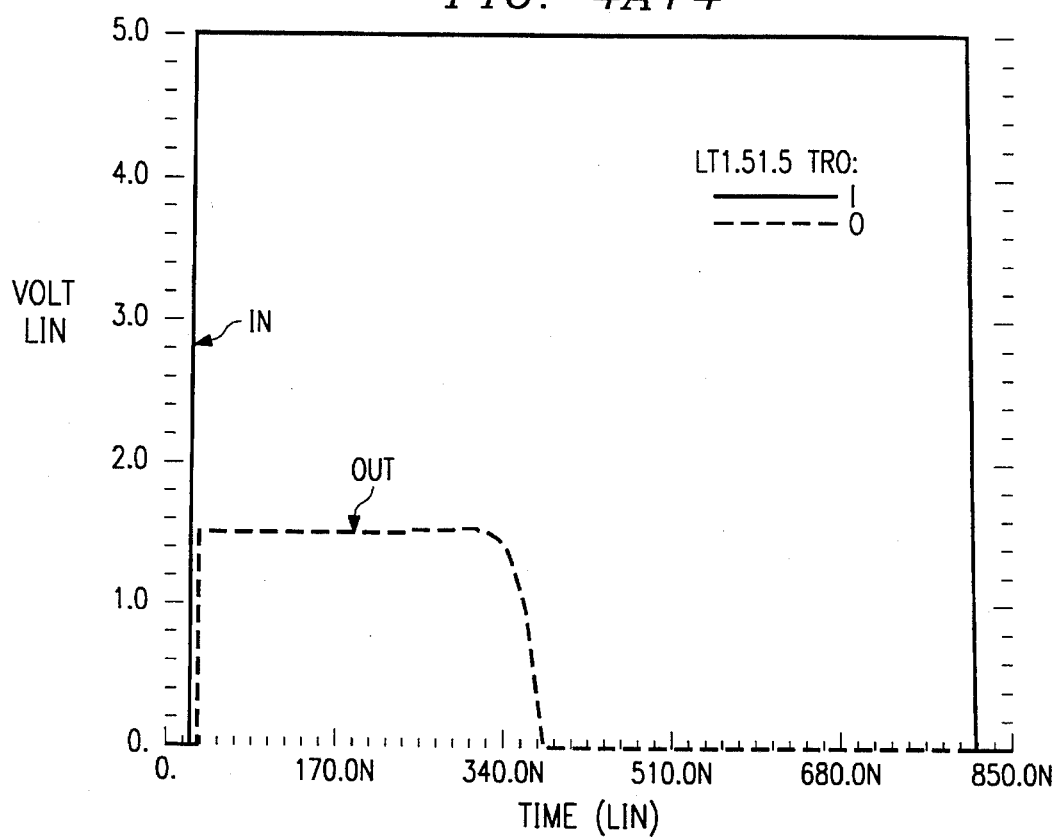
FIG. 4A14

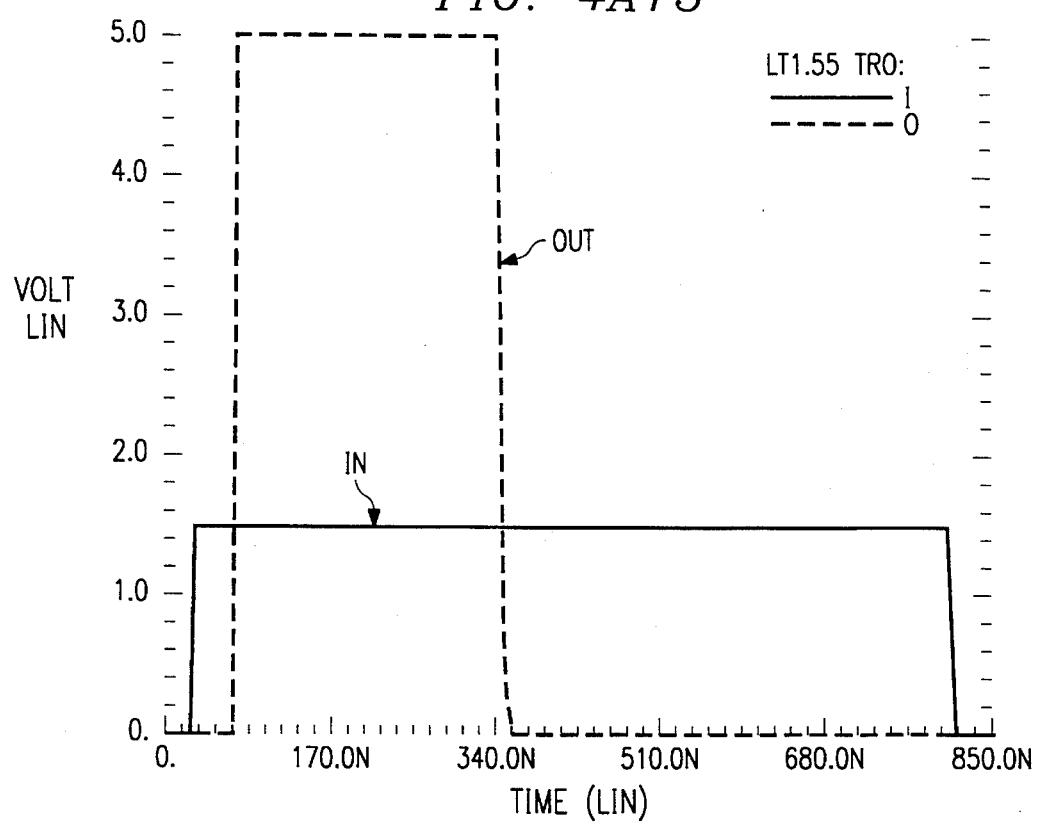
FIG. 4A15
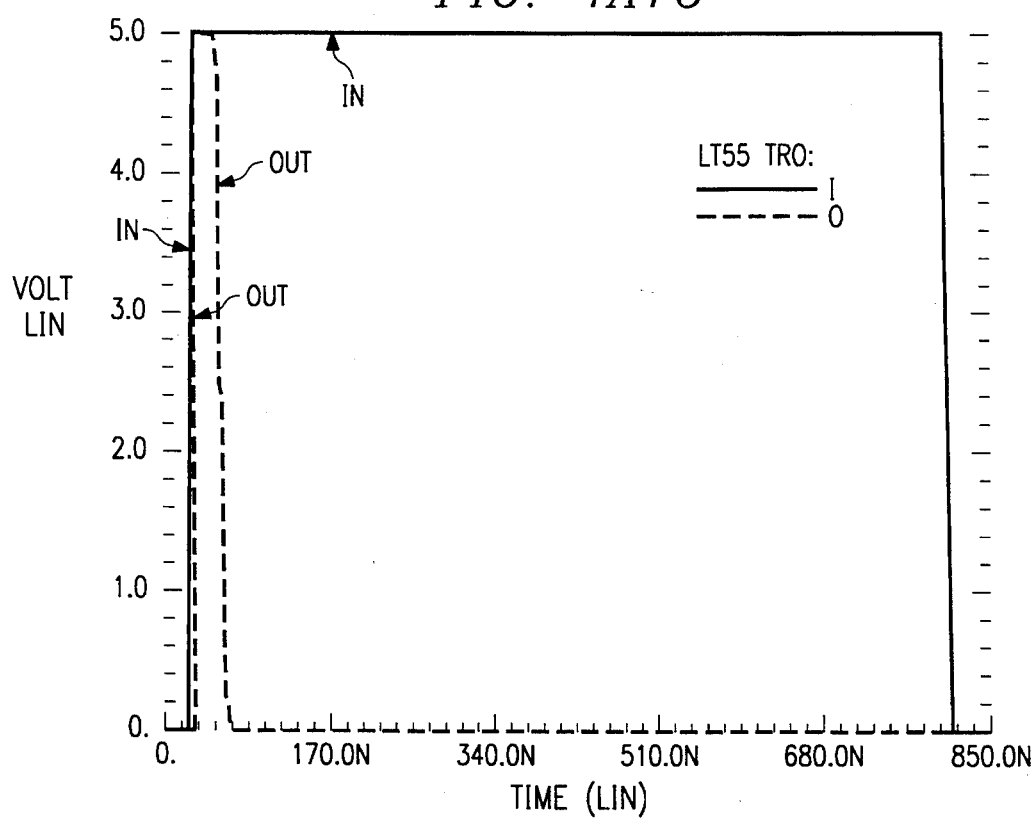
FIG. 4A16

FIG. 4B-1

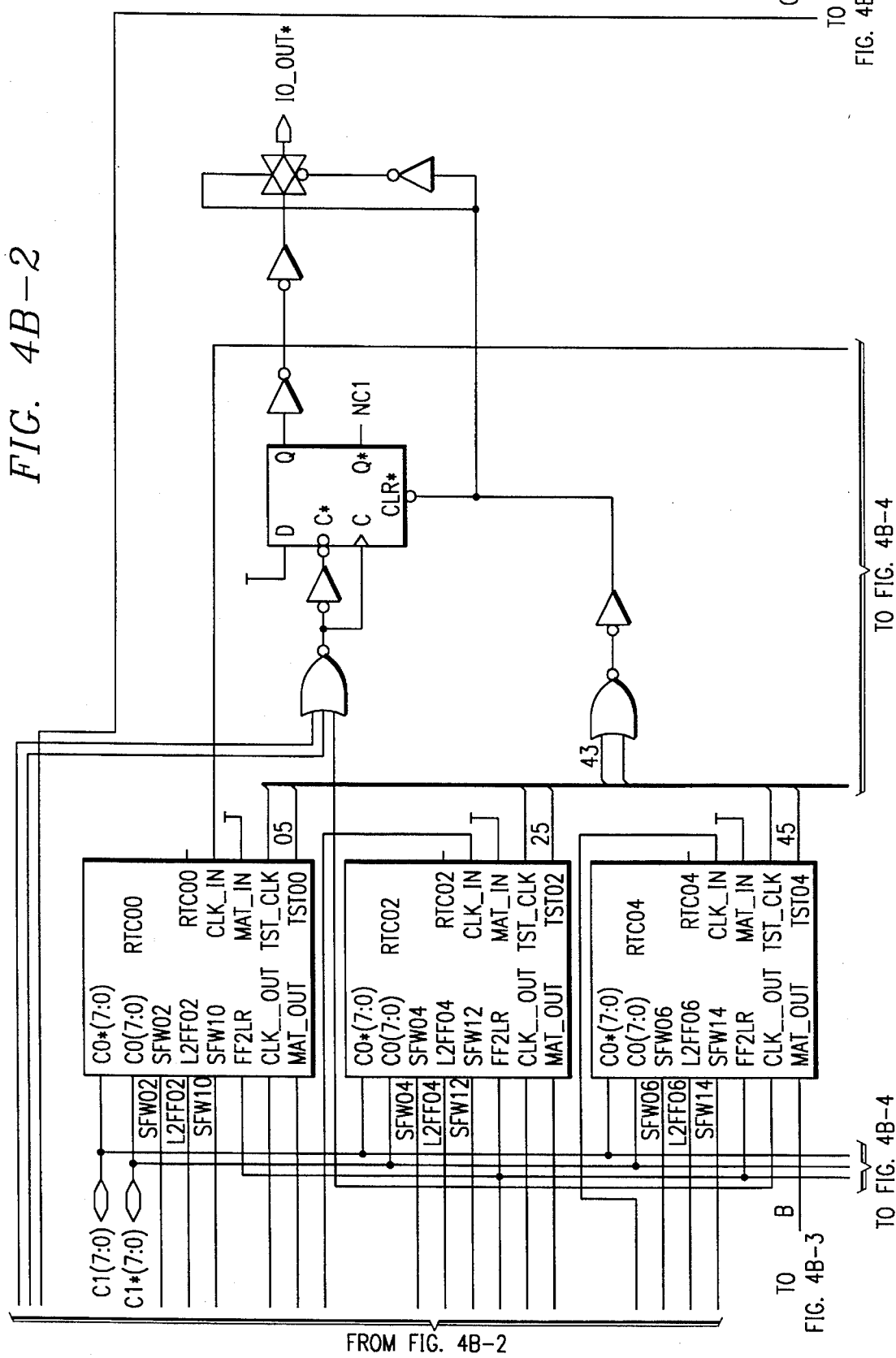

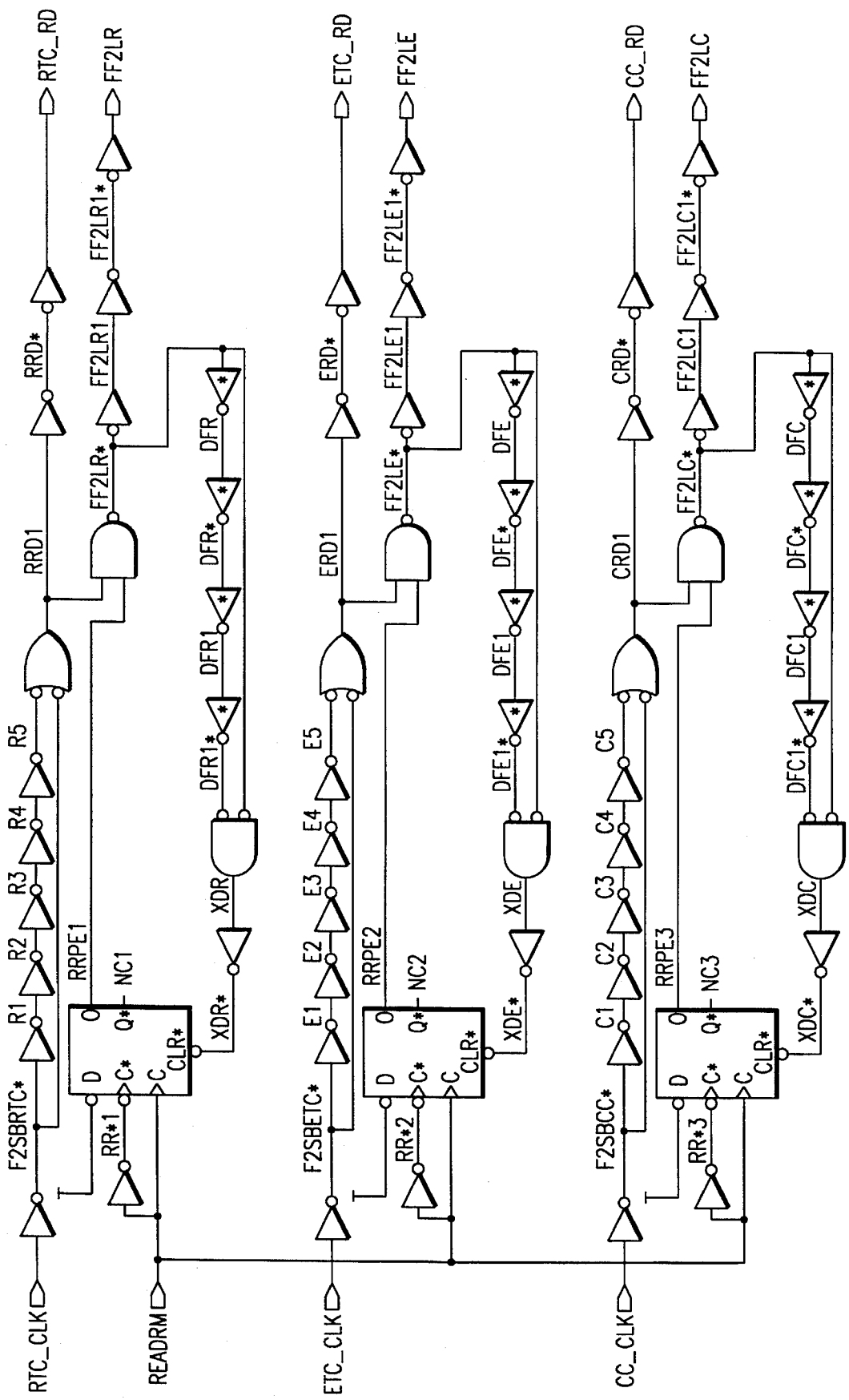
FIG. 4B1

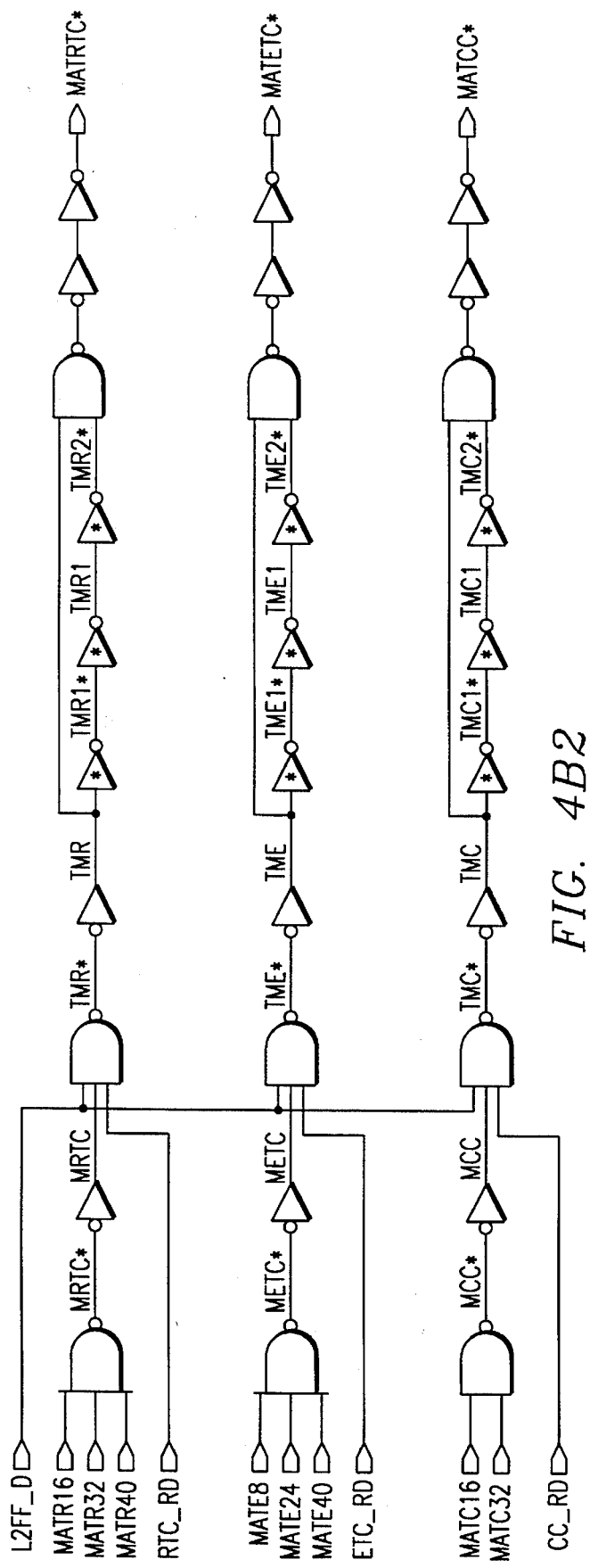
FIG. 4B2

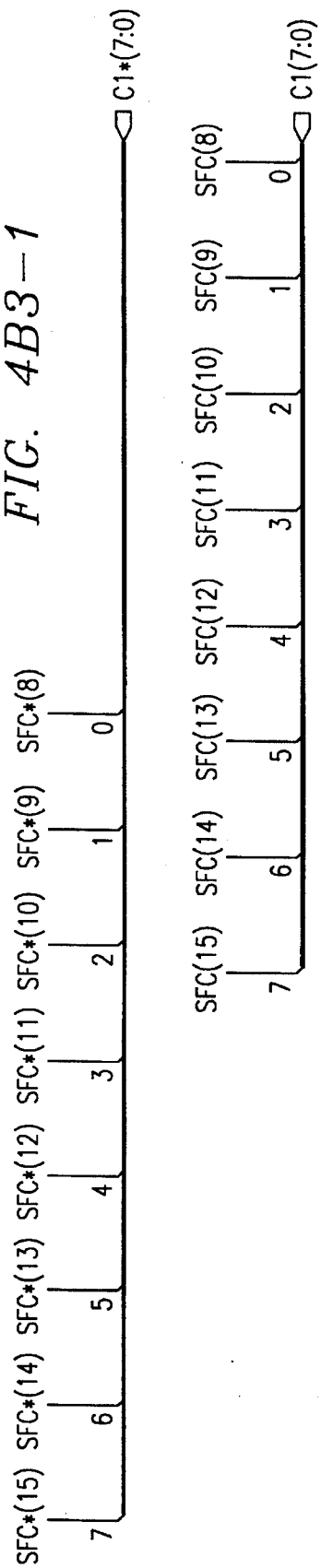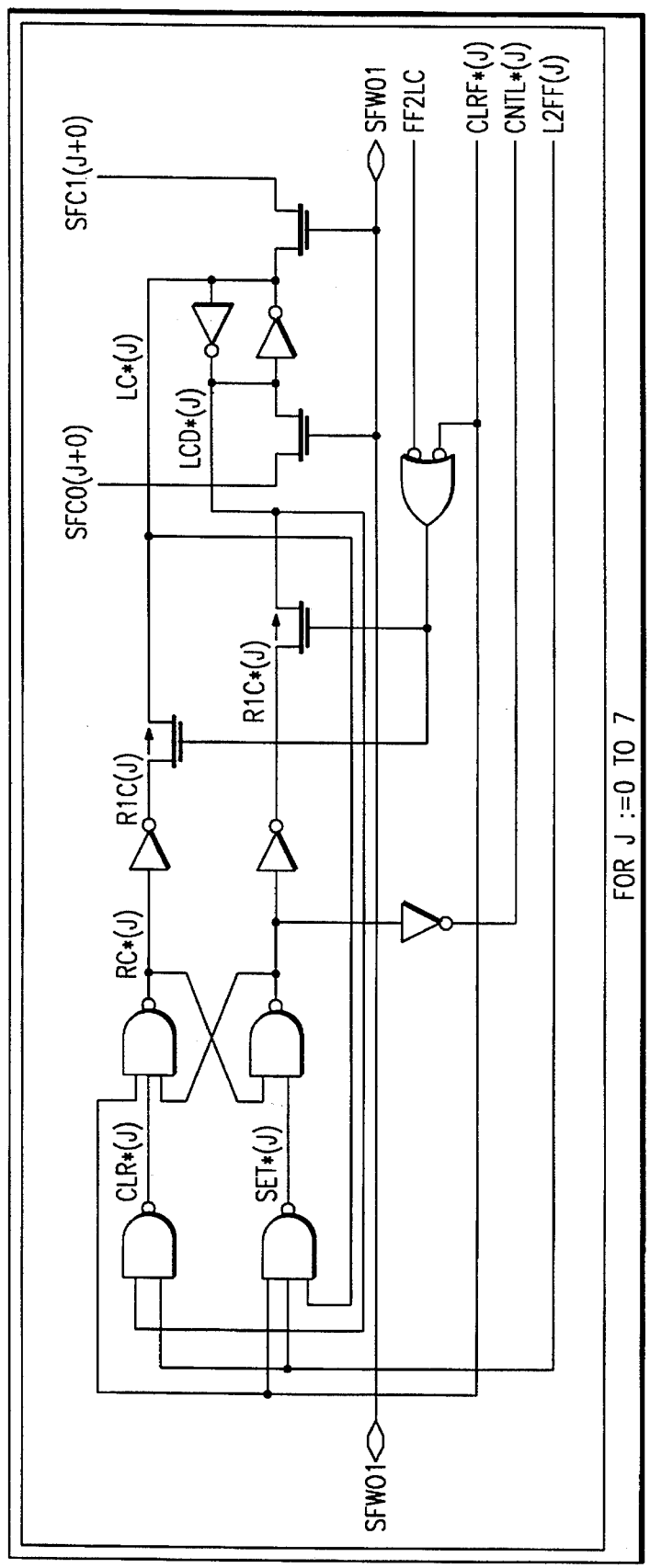
FIG. 4B3-1

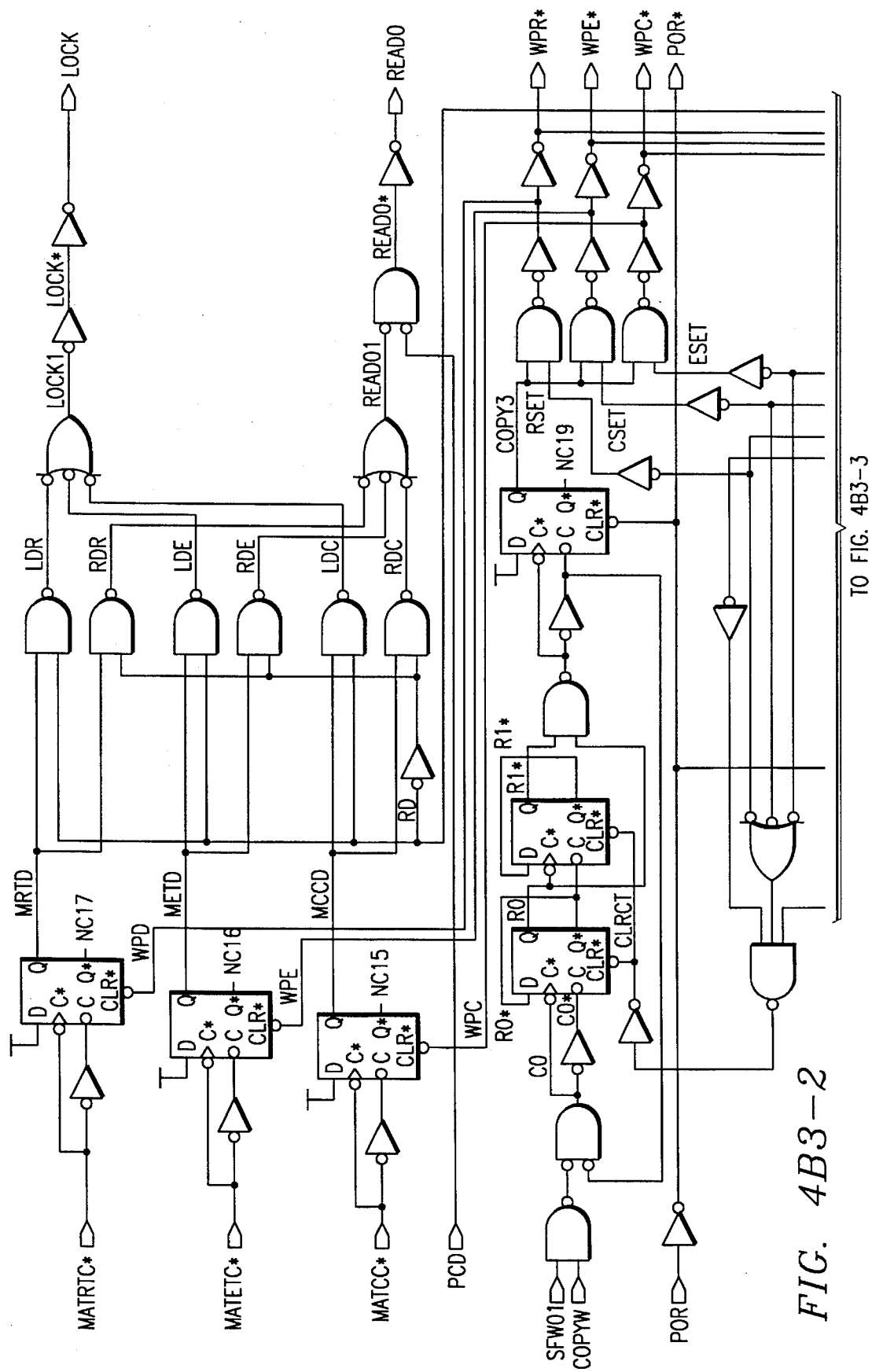
FIG. 4B3-2

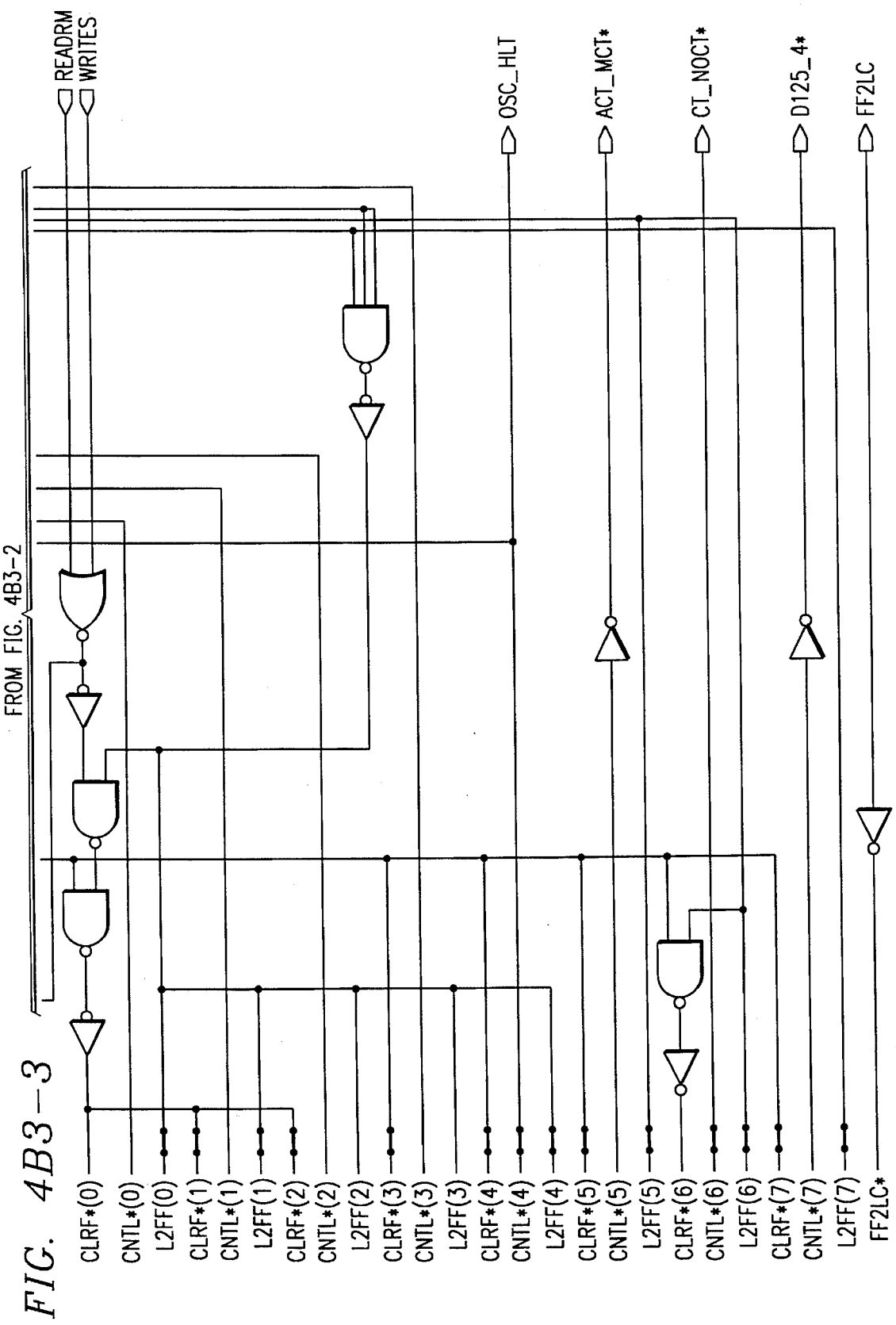
FIG. 4B3-3

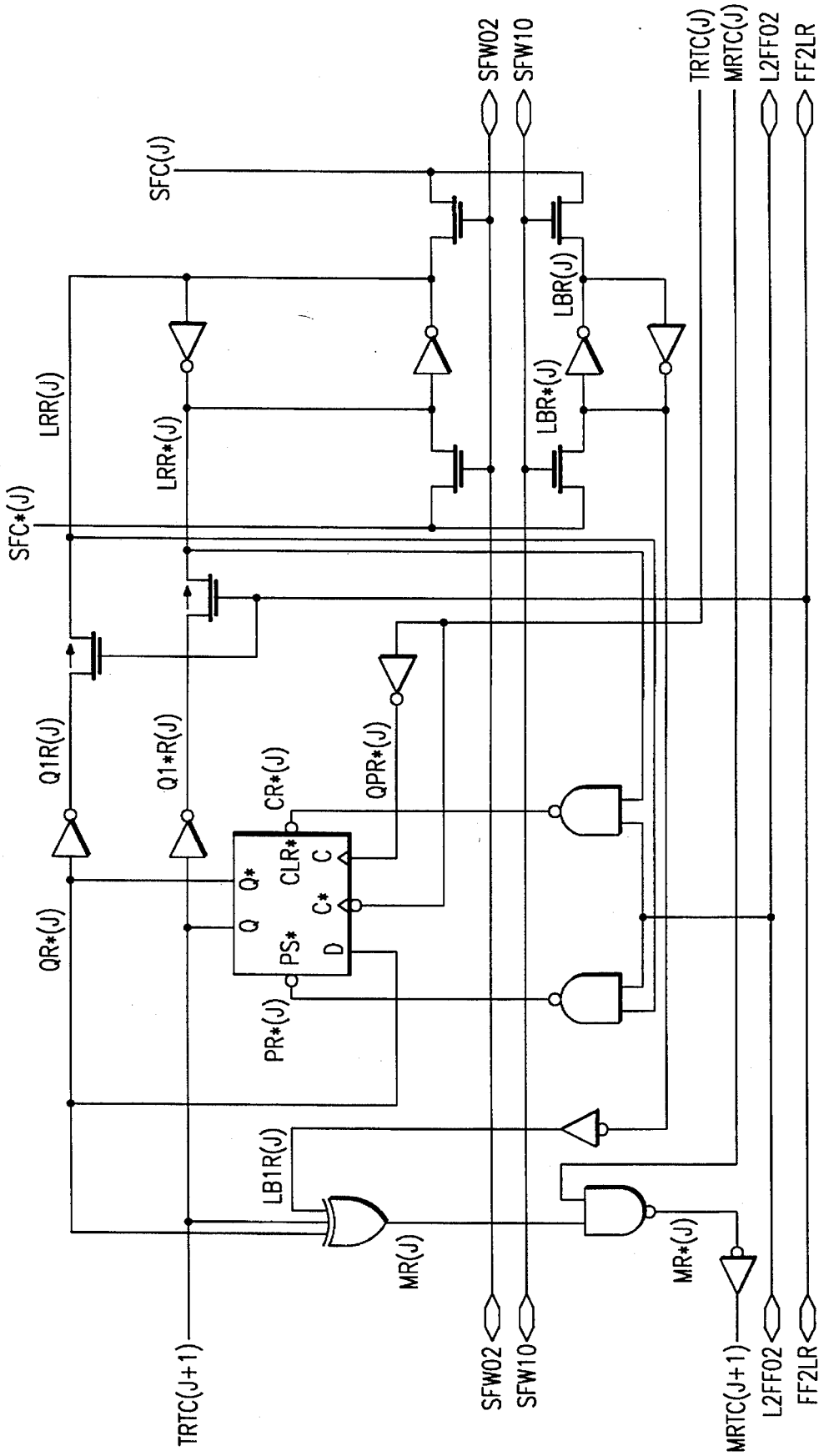
FIG. 4B4

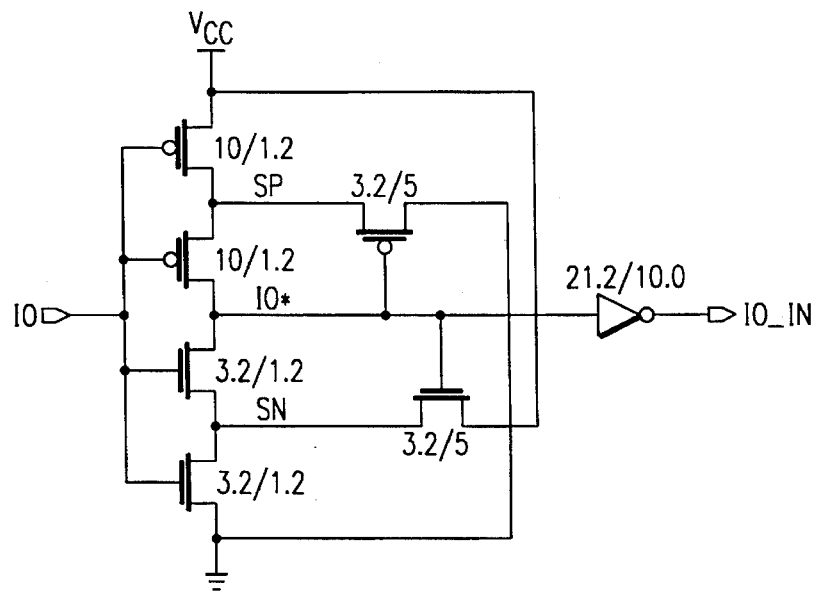
*FIG. 4C1*
(PRIOR ART)
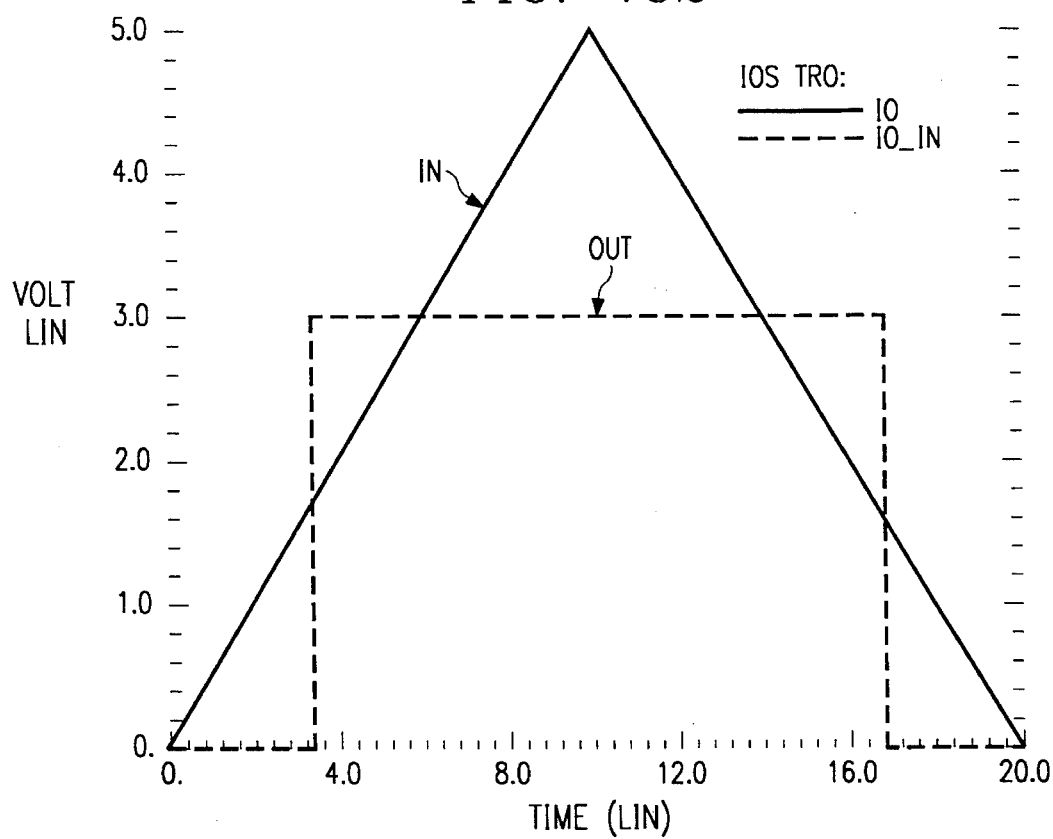
*FIG. 4C2*

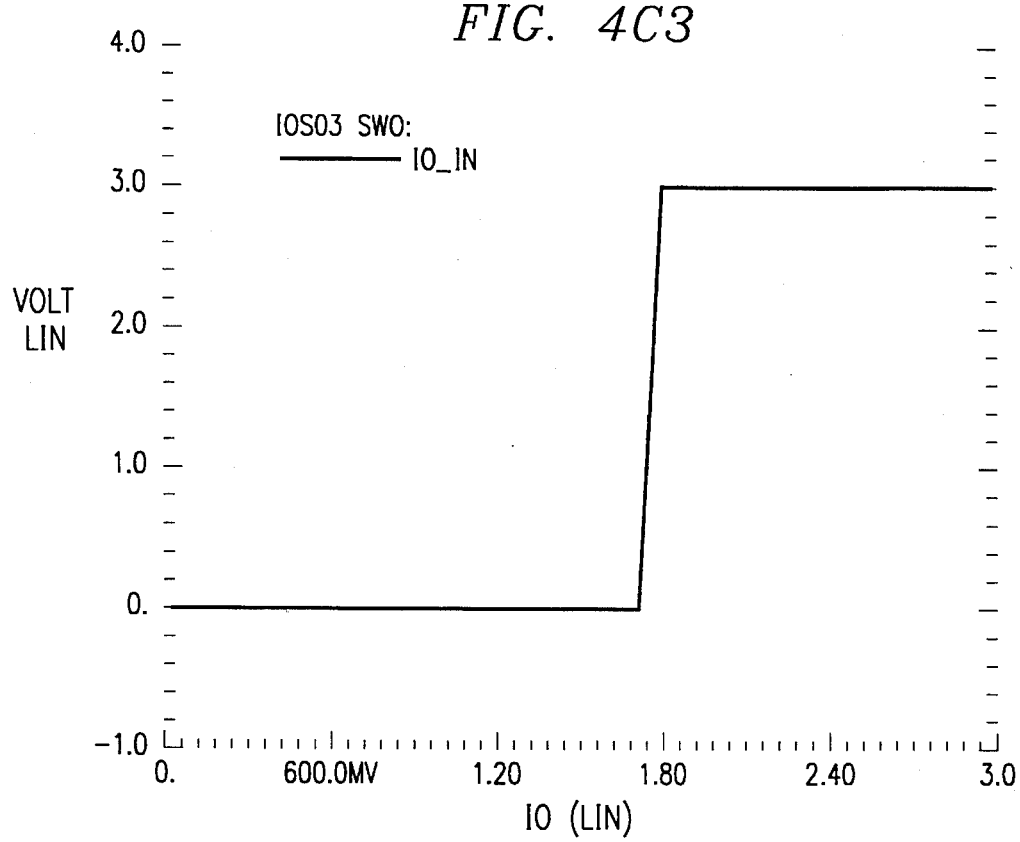
FIG. 4C3
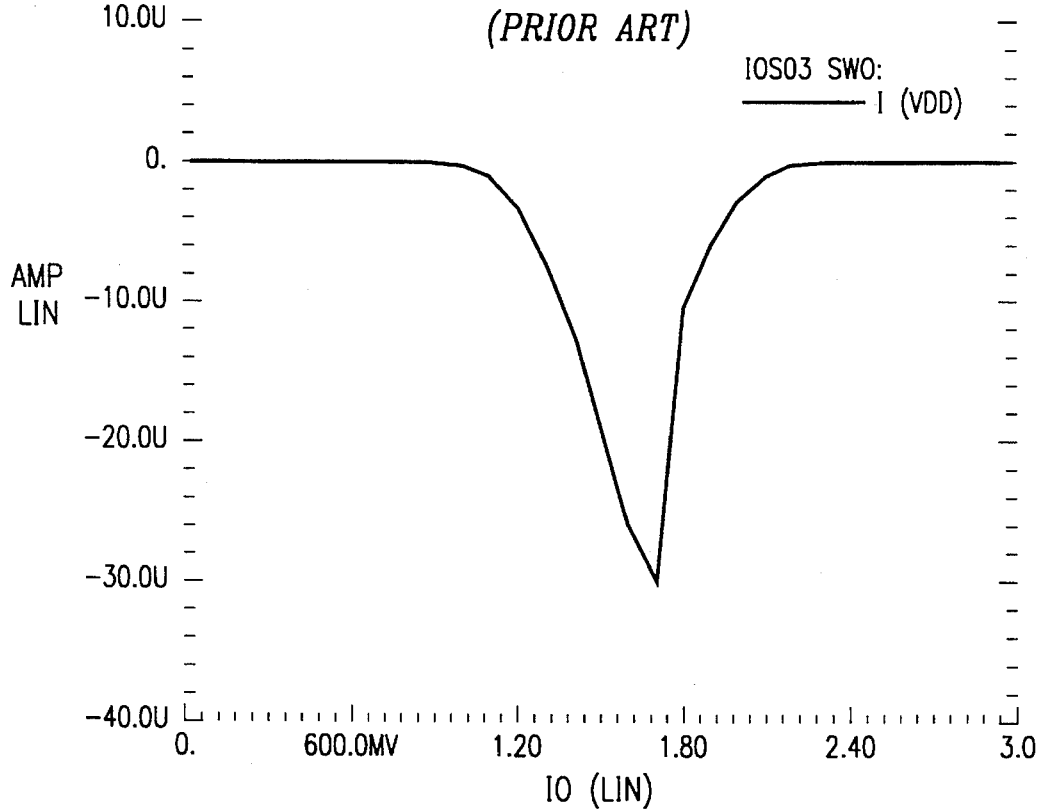
FIG. 4C4
(PRIOR ART)

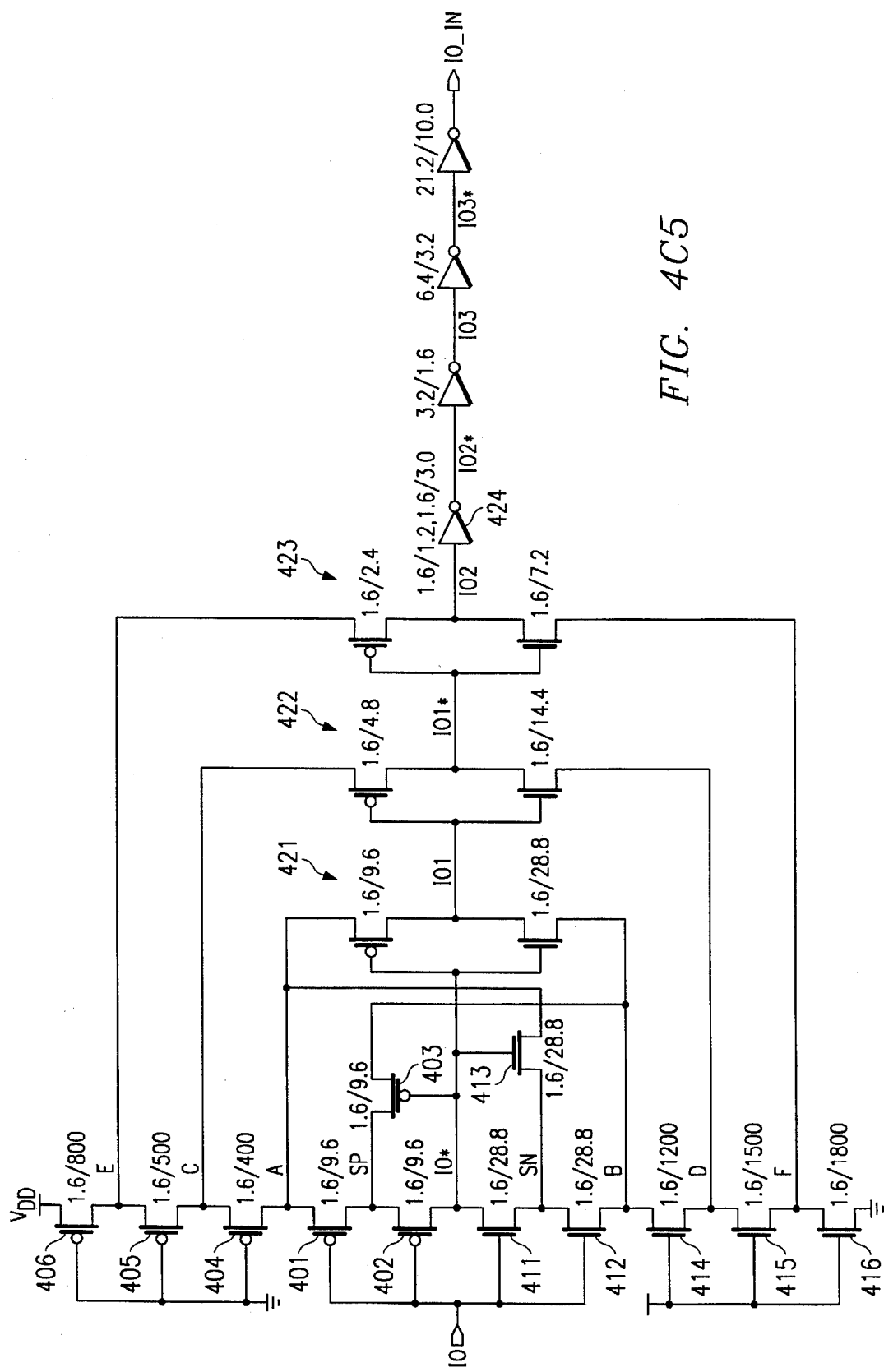
FIG. 4C5

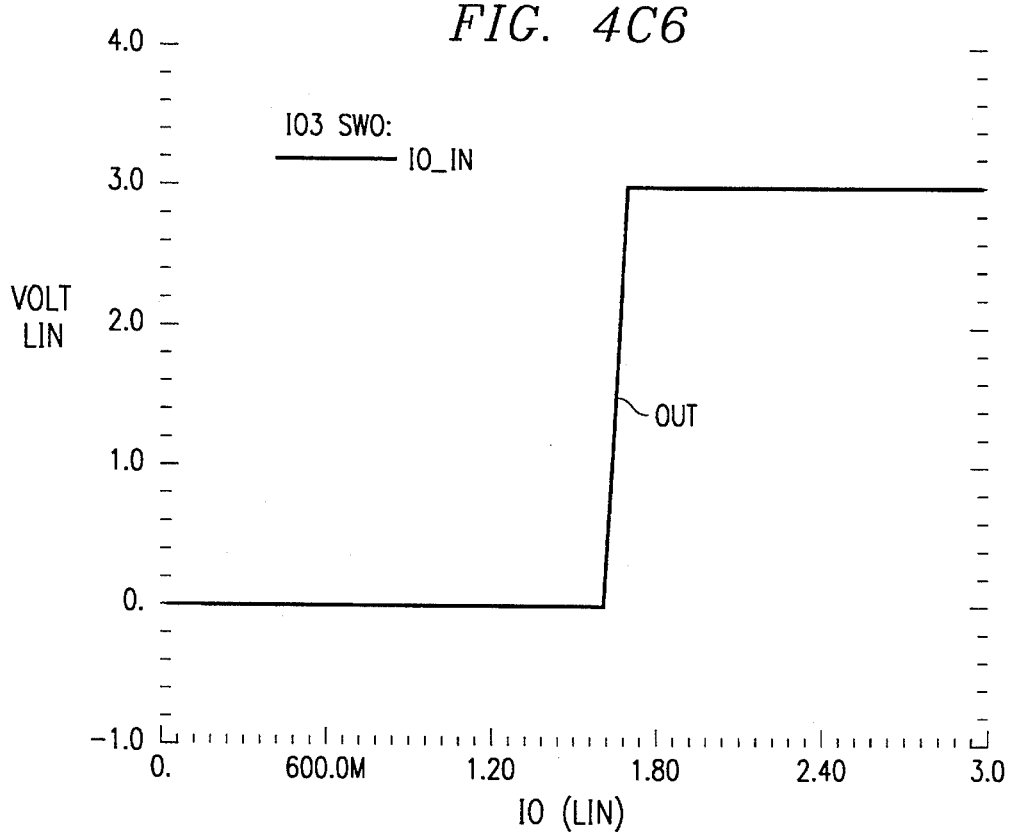
FIG. 4C6
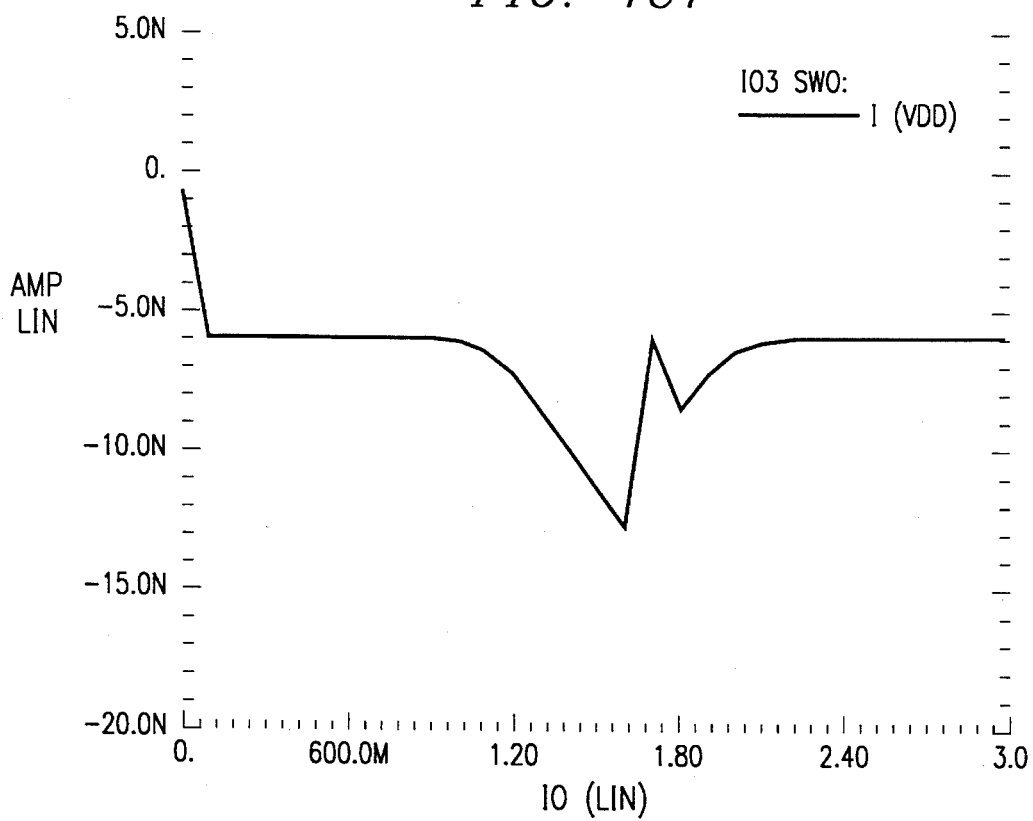
FIG. 4C7

LOW POWER MODULE

CROSS-REFERENCE TO RELATED APPLICATIONS

This application is a continuation-in-part of application Ser. No. 07/728,229, filed Jul. 10, 1991 now abandoned. The following applications are related to parent application Ser. No. 07/728,229 and have the same filing date of Jul. 10, 1991: Ser. Nos. 07/728,230; 07/727,618; 07/727,619; 07/727,638; 07/727,255all abandoned; 07/727,639 now U.S. Pat. No. 5,297,098, 07/727,270abandoned; and 07/727,273, now U.S. Pat. No. 5,166,545. The following application is assigned to the assignee of this application and is incorporated by reference in the parent application: Ser. No. 07/725,793 filed Jul. 9, 1991 abandoned. All of these cross-referenced applications are hereby incorporated by reference.

PARTIAL WAIVER OF COPYRIGHT PURSUANT TO 1077 O.G. 22 (Mar. 20, 1987)

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork fights has no objection to the facsimile reproduction by anyone of the patent document or patent disclosure, as it appears in the United States Patent and Trademark Office patent file or records, but otherwise reserves all copyright and maskwork rights whatsoever.

BACKGROUND AND SUMMARY OF THE INVENTION

The present invention relates to semiconductor integrated circuits, and, more particularly, to low power integrated circuits.

Many applications call for low power integrated circuits, such as battery powered or parasitically powered integrated circuits used for cordless identification tags, medical diagnostics devices, and data and communication modules. For example, the DS1992 Touch Memory™ manufactured by Dallas Semiconductor Corporation in Dallas, Tex. includes a read/write memory with battery in a coin-sized can with the front and back of the can forming two electrodes for 1-wire communication with the memory. The memory retains data for 10 years, and thus the memory must have very low power consumption. Similarly, the DS1287 real time clock module for AT-class personal computers includes a battery and crystal plus an integrated circuit for timekeeping even when a personal computer is powered down.

The preferred embodiment illustrated in FIGS. 1A–C limits power consumption by, among other methods, subdividing the integrated circuit into different portion which are separately powered by different power sources. In particular, the one-wire communication portion derives its power by parasitic tapping power from the communication bus; thus upon disconnection, the communication portion has a power failure. Contrarily, the memory and clock portions remains continually powered up by a battery. The use of two power sources requires a voltage level translator between the portions because the battery and the parasitic power sources may be at different voltages. And such a level translator must also have low power consumption, especially when the communication portion has its power source removed: floating nodes could lead to significant leakage currents and drain the battery. Also, the input buffers in the communication portion must not permit large transition currents when the voltage slowly rises and falls on the communication bus due to the possibly large capacitive loading of the communication bus in certain applications.

Indeed, the preferred embodiment has level translators which provide communication between domains of different power supplies by one-shot pulses, and the input buffer includes CMOS inverters with resistive current limitations to reduce power consumption during slowly varying inputs while retaining fast switching.

BRIEF DESCRIPTION OF THE DRAWINGS

The present invention will be described with reference to the accompanying drawings which are schematic for clarity.

FIG. 4A1 shows the circuit organization of circuit block PWRCAP, which was referred to in FIGS. 4A-1 and 4A-2.

FIGS. 4A2-1 through 4A2-6 shows the circuit organization of circuit sub-block RTOS, which was referred to in FIGS. 4A2-1 through 4A2-6.

FIG. 4A2a shows the circuit organization of circuit block TPOSC, which was referred to in FIGS. 4A2-1 through 4A2-6.

FIG. 4A3 shows the circuit organization of circuit block BATTEST, which was referred to in FIGS. 4A-1-4A2.

FIGS. 4A4-1 and 4A4-2 shows the circuit organization of circuit block OWPROT, which was referred to in FIGS. 4A-1 and 4A-2.

FIG. 4A5 shows the circuit organization of circuit block IOBUF, which was referred to in FIGS. 4A-1 and 4A-2.

FIG. 4A6 shows the circuit organization of circuit block POR2, which was referred to in FIGS. 4A-1 and 4A-2.

FIG. 4A6a shows a variation of the circuit of FIG. 4A6.

FIG. 4A7 shows the circuit organization of level-translator circuit block LVLT__CS, which is referred to in FIGS. 4A-1 and 4A 2 and elsewhere.

FIG. 4A8 shows the circuit organization of level-translator circuit block LVLT__IE, which is referred to in FIGS. 4A-1 and 4A-2 and elsewhere.

FIG. 4A9 shows the circuit organization of level-translator circuit block LVLT_OE, which is referred to in FIGS. 4A-1 and 4A-2 and elsewhere.

FIG. 4A10 shows the circuit organization of level-translator circuit block LVLT_IS, which is referred to in FIGS. 4A-1 and 4A-2 and elsewhere.

FIGS. 4A11–4A16 show the operation of the level-translator of FIG. 4A10.

FIGS. 4B-1 through 4B-6 shows the special function register block SFR, which was referred to in FIG. 4.

FIG. 4B1 shows the circuit organization of block XFER which is referred to in FIGS. 4B-1 through 4B 6.

FIG. 4B2 shows the circuit organization of block MATCH, which was referred to in FIGS. 4B-1 through 4B-6. This block detects the occurrence of an alarm condition in any of the counters.

FIGS. 4B-1 through 4B3-3 shows the circuit organization of block CONTROL, which was referred to in FIGS. 4B-1 through 4B-6. In addition to performing routine control functions, note that this circuitry generates a signal LOCK when a match occurs within any of the three counters.

FIG. 4B4 shows the actual detailed implementation of one bit of these counter chains.

FIG. 4C1 shows a known input buffer.

FIGS. 4C2–4C4 illustrate the operation of the buffer of FIG. 4C1.

FIG. 4C5 shows a preferred embodiment input buffer.

FIGS. 4C6–4C7 illustrate the operation of the buffer of FIG. 4C5.

FIG. 5 shows an innovative socket which can be used in combination with the chip of the preferred embodiment.

FIGS. 6A–6D show the timing of voltages appearing at various nodes in the power-on-reset circuit of FIG. 4A6.

DESCRIPTION OF THE PREFERRED EMBODIMENTS

Figure 1A:
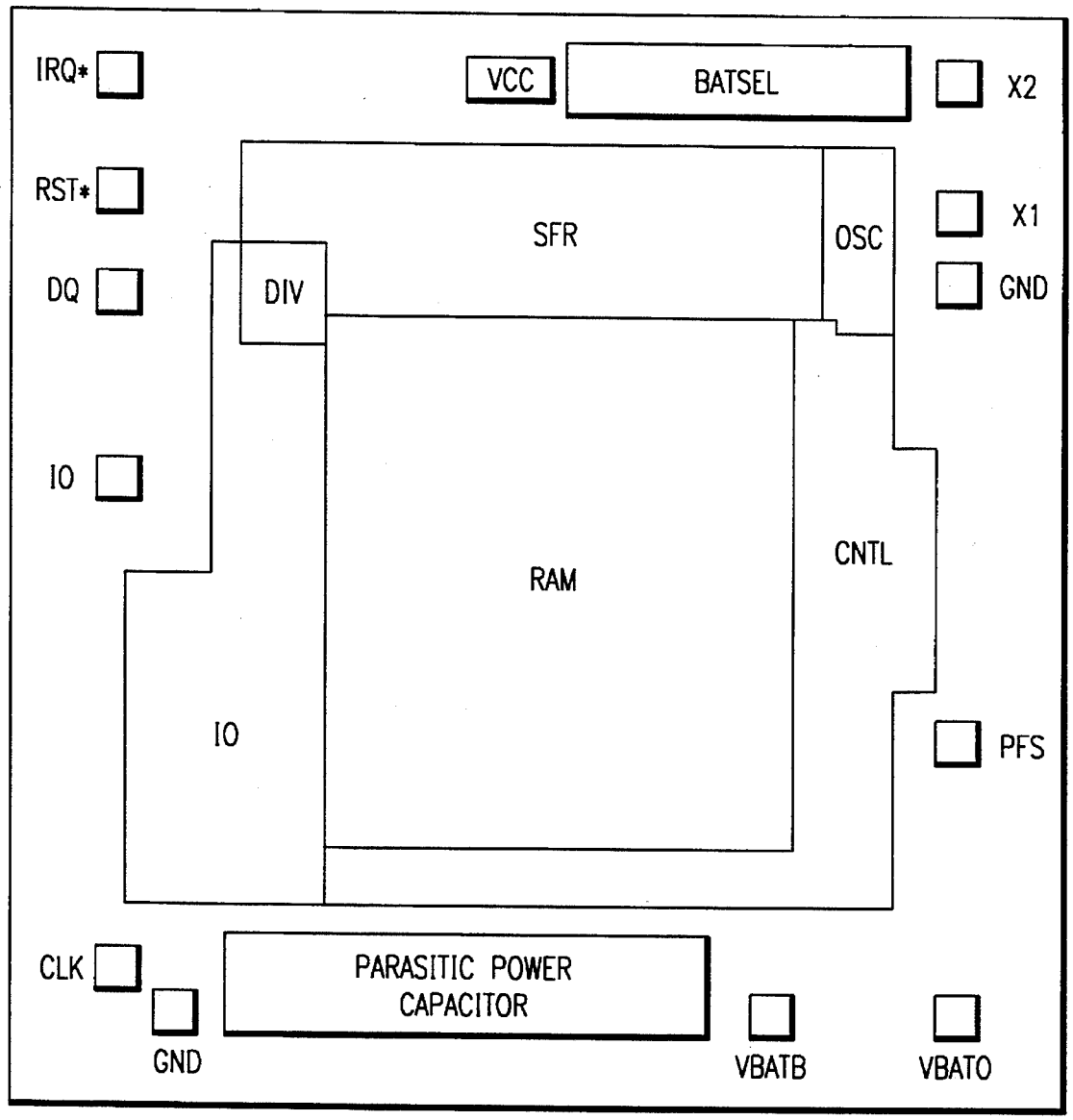
FIGS. 1A–C show packaged, schematic and the high-level physical chip layout of a first preferred embodiment.
Figure 1B:
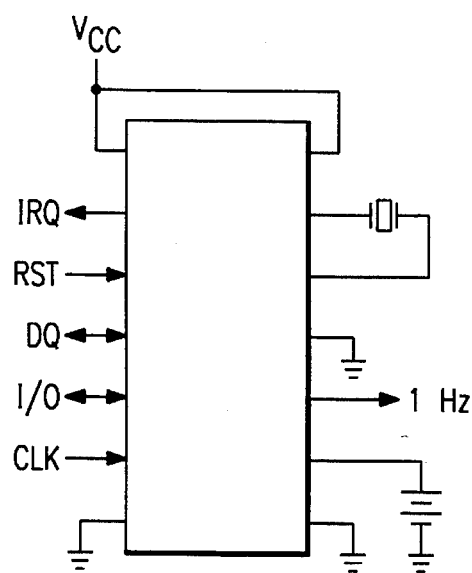

FIG. 1A shows a preferred embodiment integrated circuit chip layout in block format with FIG. 1B schematically illustrating the chip connected to a battery and a crystal for use as a timekeeping system with read/write memory and both 3-wire and one-wire communication ports. The one-wire communications use the I/O pin and the three-wire communications use the RST\, DQ, and CLK pins. IRQ\ is an interrupt output, and 1 Hz is a 1 Hz square wave output.

Figure 1C:
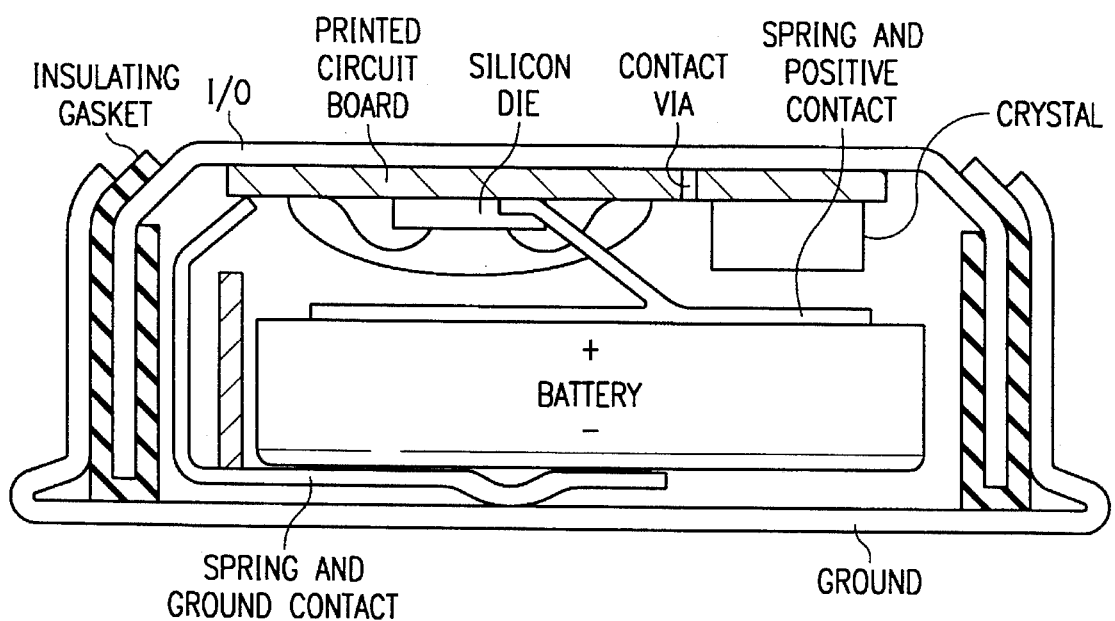

FIG. 1C shows in cross-sectional elevation view the system of FIG. 1B packaged in a coin-sized can which only provides two terminals (the top and the bottom-side of the can) and thus only provides one-wire communication. Such a can may have dimensions of about 17 mm diameter and 6 mm thickness. Note that FIG. 1C shows the integrated circuit of FIG. 1A as a die directly mounted on a printed circuit board and covered with a sealer. Alternatively, the integrated circuit of FIG. 1A could be packaged as an SOIC, DIP or PLCC or other standard IC package and this package mounted on the printed circuit board.

Figures 1, 4:
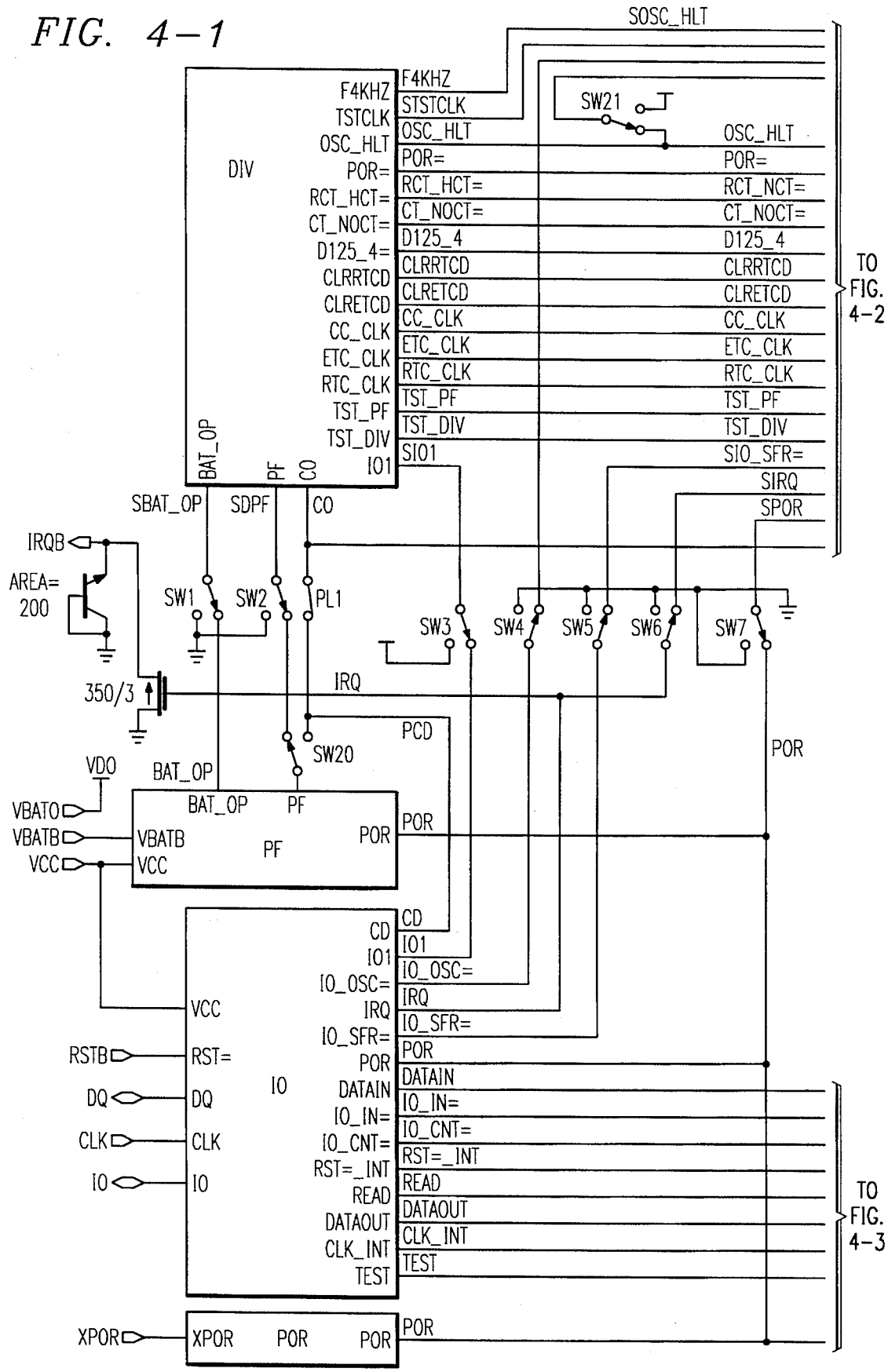
FIG. 4 shows the high-level circuit organization of the preferred embodiment.
FIGS. 4A-1 and 4A-2 shows the circuit organization of circuit block IO, which was referred to in FIG. 4.
Figures 2, 4:
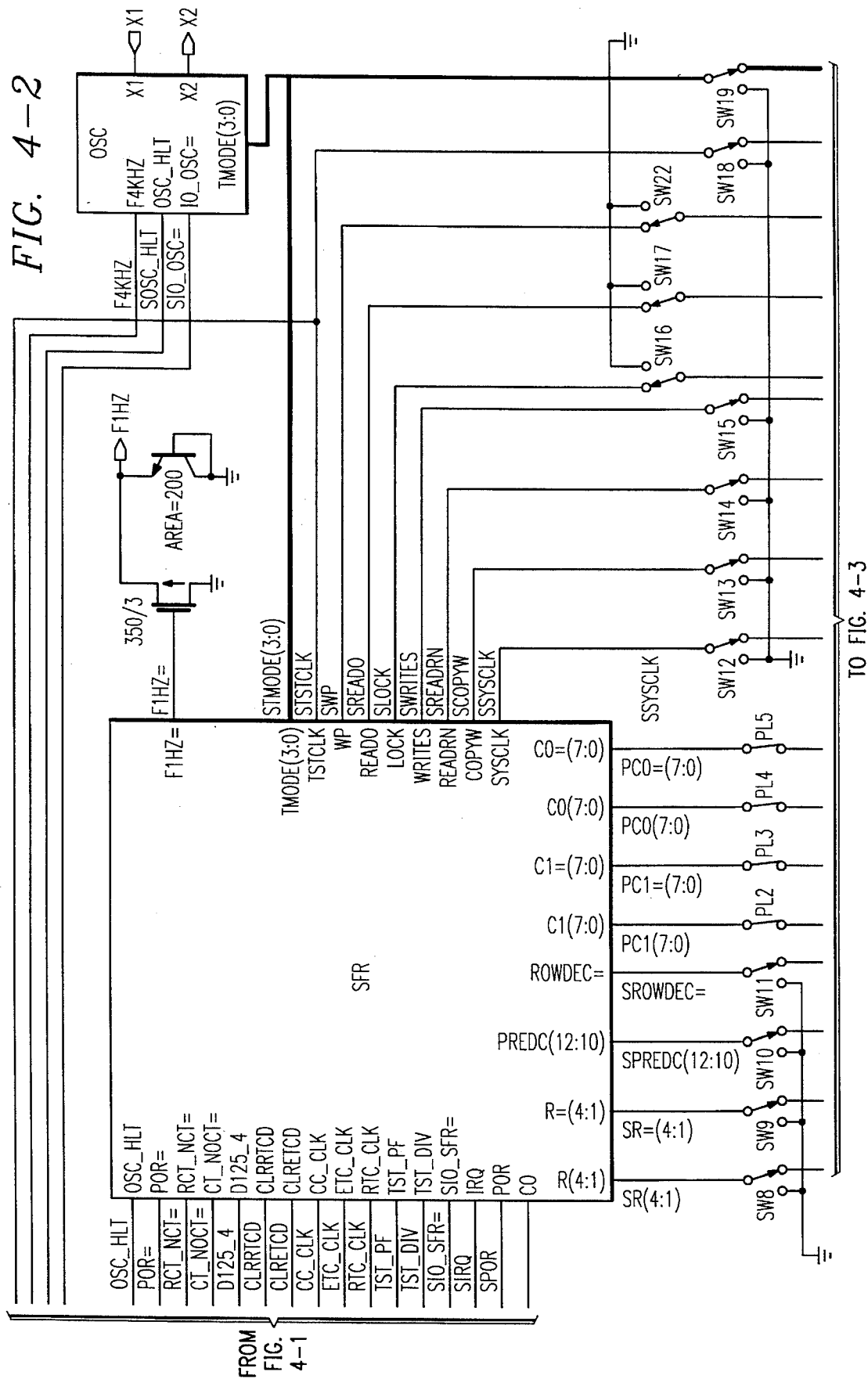

For the FIG. 1C packaging, the Vcc input is grounded, the backup battery terminal grounded, and a power battery connected. In this configuration the integrated circuit has some devices powered by the power battery and other devices powered by energy extracted from the one-wire communication bus. Thus devices in these two power domains may have different power levels, depending upon battery voltage (typically 3 volts) and communication bus voltage (typically 5 volts), and require level translators. Preferred embodiment level translators for signals passing between these different power domains are shown in FIGS. 4A7–4A16 and described in the following sections "Use of Separate Power-Spply Domains" and "Input/Output: Block IO".

One application of the preferred embodiment, either in the FIG. 1B or FIG. 1C form, counts power cycles for items such as printed circuit boards (PCBs) or electrical machinery. A power supply voltage (maybe after rectification and division) is detected at the one-wire communication port, and such a voltage may be very slowly varying due to capacitive loading. In this case, the input buffers for the preferred embodiment must have low power switching as the input voltage slowly crosses a threshold to avoid battery drain. Thus the input buffer cannot draw much current and the switching should be rapid to insure small energy consumption. Preferred embodiment input buffers are shown in FIG. 4C5 and described in following section "Divider Block: DIV".

Functional Description

Some notable features of the integrated circuit of FIG. 1A and the system of FIG. 1B–C include the following:

one-wire interface requires only one port pin for communication

Contains real-time clock/calendar in binary format 4096 bits of SRAM organized in 16 pages, 256 bits per page Programmable elapsed time meter Programmable cycle counter which can sample and store the number of system power-on/off cycles Programmable alarms can be set to generate interrupts for elapsed time, real-time clock alarms, and/or cycle counter Lock-out feature provides tamper-proof data Data integrity assured with strict read/write protocols 3-wire I/O for high speed data communications (not for FIG. 1C)

Replaces bar code labels with unique 64-bit factory lasered solid state serial number Space-saving 16-pin SOIC package (within package of FIG. 1C)

Operating temperature range=–40° C. to +85° C.

Battery operating voltage range =2.0 Volts to 5.5 Volts.

The embodiment of FIG. 1A offers a simple solution for storing and retrieving vital information with minimal hardware. Only one port pin is required for communication. This I/O gives the user access to a unique lasered identification number, a real-time clock/calendar, elapsed time clock, cycle counter, programmable interrupts and 4096 bits of SRAM. All these features are available with or without system power applied. The lasered identification number can replace bar codes for tracking purposes. Using the one-wire port, this ID can be read when assembly is without power. Utilizing backup energy sources, the data is nonvolatile and allows for stand-alone operation. A strict protocol for accessing the preferred embodiment insures data integrity. For high speed communication, the traditional Dallas Semiconductor three-wire interface is provided.

Extensive additional material regarding the one-wire-bus architecture of the preferred embodiment may be found in cross-referenced U.S. patent application Ser. No. 07/725, 793, filed Jul. 9, 1991, entitled "Memory," which is hereby incorporated by reference.

| Pin Description | | |
|---|---|---|
| PIN | SYMBOL | DESCRIPTION |
| 1,16 | Vcc | Power input pins for 3.0 to 5.5 volt operation. Either pin can be used for Vcc. Only one is required for normal operation. (See VBATO & PFS definitions). |
| 2 | IRQ\ | Interrupt output pin - Open drain |
| 3 | RST\ | Reset input pin for 3-wire operation |
| 4 | DQ | Data in/out pin for 3-wire operation |
| 5,7 | NC | No connection pins |
| 6 | CLK | Clock input pin for 3-wire operation |
| 8,13 | GND | Ground pin - Either pin can be used for ground. |
| 9 | VBATB | Battery backup input pin -Battery voltage should be 3.0 volts for power fail protection mode. See VBATO & PFS pin definition. |
| 10 | VBATO | Battery operate input for 2.0–5.5 volt operation. Battery with 2.0–5.5 volts can be used to power the chip. The Vcc & VBATB pin must be grounded when this pin is used to power the chip. |
| 11 | I/O | One-Wire input/output - Complete communication with the chip can be done using this pin. See definitions of One-Wire protocol for complete description. Open drain. |
| 12 | PFS | PFS Power fan select - To activate the power fail protection circuitry when using Vcc and battery backup, this pin must be connected to the VBATO. In this mode the power monitor circuitry is enabled and will write protect all inputs when Vcc < VBATB. When operation is required from 2.0–5.5 volts, use VBATO for power. This pin must be connected to ground. In this mode, no input pin can be held in an intermediate voltage level, i.e., 0.7 < VIN < 2.3 V. All inputs must be at VIL or VIH levels. See DC Characteristics for VIL & VIH. Operational voltage range is restricted in this mode to VBATB to 5.5 V. |
| 14,15 | X1,X2 | Crystal input pins. Connections for a standard 32.768 KHz quartz crystal, Daiwa part number DT-26S (be sure to request 6 pf load capacitance). |

The real-time clock, elapsed timer, real-time alarm, elapsed time alarm, cycle counter and control/status register are all read/write registers. Flag bits in the status register are read-only bits. Data is sent from the host via the serial interface(s), least significant bit (LSB) first. All data is in binary format. The following briefly describes the one-wire protocol: The host generates a reset pulse that clears all previous commands and begins communications. The preferred embodiment then sends a presence pulse to acknowledge that reset has occurred and it is ready for a new command. As an example to illustrate how the protocol works, a typical command for one-wire communications is Read ROM Data. The host sends a command byte 33h; after which it drives the I/O line to a low state for less than 15 μsec. It then releases the I/O line and samples the line condition (high or low level) at a time greater than 15 μsec but less than 60 μsec. If the voltage level on the I/O is high, VIH, the bit is a one. The host drives and samples the I/O line 64 times to complete the reading of the lasered ROM. The model number (for example, 04h) is the first byte read. The unique serial number contained in the next 6 bytes is read second; the CRC byte used to verify the data is read last. The process then begins again—the host sends a reset pulse and the preferred embodiment responds with a presence pulse.

In order to ensure data integrity, multiple commands are required to read or write to the preferred embodiment. (See the flow chart in FIGS. 2A–2B.) All data written to the preferred embodiment must be written to a 256-bit scratch page. Data can be read from the scratch page or secure memory, which is 16 pages with 256 bits per page. There are four basic commands that enable reading and writing: Write to Scratch Page, Read Scratch Page, Read Secure Memory, and Copy Scratch Page to Secure Memory. See the section entitled "Command Byte" for definitions.

An important feature of the Copy Scratch to Secure Memory command is the authorization code required for data transfer. This code is located in the first three bytes of the scratch page. The first two bytes are the target address that the host sent to the preferred embodiment when data was written to the scratch page. The third byte, generated by the preferred embodiment when data was written to the scratch page, contains the ending address within the scratch page. That is, if 256 bits were written, then a 0Fh would be the third byte read.

This ending address also includes status bytes to verify that data wasn't corrupted while being sent to the preferred embodiment. A partial byte flag is set if less than a full byte was written into the scratch page; an overflow flag is set if more than 256 bits are sent. The last flag bit, the Authorization Accepted flag, is set if the authorization code matches and the data is transferred from scratch memory to secure memory.

Here is an example of how this transfer is accomplished. The Skip command (CCh) is issued from the host, followed by the Copy Scratch to Secure Memory command (A5h). Then the unique authorization code is sent; this consists of two address bytes along with the ending address byte read when verifying scratch page data. If these three bytes match the scratch page bytes, the data is transferred to secure memory and the Authorization Accepted (AA) bit is set to a one. The preferred embodiment remains in a busy state until the data transfer is complete. Having sent a reset, the host then reads the third byte in the scratch page to verify the AA bit is set and data has been transferred. See the section entitled "Command Byte" for more information.

The 3-wire interface bypasses the Read ROM, Match ROM, Search ROM, and Skip ROM commands used with the one-wire protocol. Consisting of Reset\, DQ, and Clock, the 3-wire is a high-speed communications interface that transmits/receives at a rate of 2 MHz. To communicate via this interface, only the command bytes for access to secure memory and scratch memory are required. No reset or presence pulses are available.

Communication Protocol

The following steps should be noted in relation to the one-wire/three-wire protocol:

1. One-wire Interface

When the one-wire interface is used, all communications to and from the preferred embodiment are accomplished via a single interface lead. Dam is read and written through the use of time slots to manipulate bits and a command word to specify the transaction.

2. Write Time Slots

A write time slot is initiated when the host pulls the data line from a high logic level to a low logic level. There are two types of write time slots: Write One time slots and Write Zero time slots. All write time slots must be a minimum of 60 μsec and a maximum of 120 μsec in duration. There is a minimum of a 1 μsec valid access recovery time between time slots.

For the host to generate a Write One time slot, the data line must be pulled to a logic low level and then released, allowing the data line to pull up to a high level within 15 μsec after the start of the write time slot.

For the host to generate a Write Zero time slot, the data line must be pulled to a logic low level and remain low for the duration of the write time slot.

3. Read Time Slots

The host generates read time slots when data is to be read from the one-wire interface. A read time slot is initiated when the host pulls the data line from a logic high level to a logic low level. The data line must remain at a low logic level for a minimum of 1 μsec and a maximum of 15 μsec. This maximum time of 15 μsec includes the time required for the data line to pull up to a high level after it is released. The state of the one-wire data line must be read by the host within 15 μsec after the start of the read time slot. After this time, the state of the data is not guaranteed. All read time slots must be a minimum of 60 microseconds in duration with a minimum of a one microsecond valid access recovery time between individual read time slots.

4. One-wire Protocol

The one-wire protocol can be viewed as having three distinct layers. These layers are the Presence Detect layer, the Reset layer, and the Command layer.

5. Presence Detect

The Presence Detect layer is used to signal to a host device either 1) that a new device has been attached to the one-wire port, or 2) the device(s) on the one-wire have cleared previous commands (after a reset pulse). This handshake is used for feedback to the host.

After Presence Detect, all devices on the one-wire are ready for the next command. The one-wire port from the host remains at a logic high level during quiescent times between read and write time slots. This high time must be present for a minimum of 15 μsec before the new device can assert a presence detect signal. The presence detect signal will be a logic low level asserted by the newly attached device which remains low for a maximum of 240 μsec and is then released. This low logic level can be detected by the host and used as an interrupt condition for the host processor.

6. Device Reset

The Reset layer is used to reset the attached one-wire devices. This allows the host to place the one-wire device or devices into a known state at any time. The reset signal consists of a logic low level asserted by the host for a minimum of 480 μsec. After this, the host must release the one-wire signal line and allow it to rise to a logic high level. This high logic level must be maintained by the host for a minimum of 480 μsec before any data can be exchanged. During this logic high time, any device present on the one-wire signal line will assert its presence-detect waveform.

Interrupts

The preferred embodiment interrupts are provided on two pins. The IRQ, pin 2, and the I/O, pin 11. The IRQ pin is normally high and will transition to a logic 0 level when an interrupt occurs. The I/O pin will send a high to low pulse when a interrupt occurs. The duration of this pulse is 3.0 msec. If communication is occurring on the I/O pin when an internal interrupt is generated, the interrupt will not be sent until the user generates a reset pulse to stop communications. The reset pulse is normally 480 μsec in duration. When the reset is sent, the interrupt pulse width will be added to the reset pulse. The resultant pulse will be typically 3.5 msec in duration. To use the I/O interrupt, the user must sample the I/O signal after the 480 μsec to determine if the interrupt signal is active. If I/O Signal is in the idle mode, the interrupt pulse will pull the I/O low for 3 msec. Idle mode is defined as: 1. reset pulse has been sent, 2. no communication has occurred for 1 msec after the presence pulse was sent, and the I/O signal is at a VIH level. To reset the IRQ, pin 2, the status register, address 0200h, is read. Reading this register will clear all interrupt flags. See control register definition.

One-wire Commands

There are four commands which can be issued by the host on the one-wire port. These are:

1) [33 hex] read ROM data
2) [55 hex] match ROM data
3) [F0 hex] search ROM data
4) [CC hex] pass-through mode

1. Read ROM Data

Upon recognition of the command word [33 hex], the preferred embodiment is ready to respond to the next eight read time slots with the Type Identifier number. This number is a hexadecimal 02 and is unique to the preferred embodiment part. After receipt by the host of the Type Identifier number, the preferred embodiment is ready to output the unique 48-bit serial number contained within the device. The host must issue 48 read time slots to retrieve this number. Following the 48-bit serial number is an 8-bit Cyclic Redundancy Check (CRC) value. This CRC value has been calculated over the Type Identifier and Serial Number, 56 bits total, using the following polynomial:

$$p(x)=x^2 +x^3, \text{ assuming } x^0 \text{ is the LSB}$$

This calculated value is then lasered into the past at the time of manufacture. To read the CRC value, the host must issue eight additional read time slots.

2. Match ROM Data

The Match ROM data command is used as a device select when multiple one-wire devices are connected to a single bus. This command allows the host to address any one of the multiple one-wire devices on an individual basis. To do a Match ROM data command, the host must issue the command [55 hex] to the device with eight write time slots. Following the command byte, the host must write the desired device's type identifier, serial number, and CRC byte. If all of these values match the data stored internally in the ROM, the preferred embodiment can now be accessed using the standard preferred embodiment commands and protocol. If any of the bit values transmitted by the host fail to match the ROM data pattern, the access will be terminated. To return from a pattern fail condition, the host must issue a Reset command.

3. Search ROM Data

The Search ROM Data command allows the host one-wire device to poll efficiently to determine the unique ROM address of all devices on the one-wire bus. In this mode, each of the bits of the ROM data requires three time slots on the one-wire bus. The first two time slots are read time slots in which the preferred embodiment transmits back to the host the value of the ROM bit followed by its complement. The third time slot is a write time slot in which the host supplies its desired value for the ROM bit. The preferred embodiment then compares the desired value with the actual ROM bit. If they disagree, the preferred embodiment will go to a high impedance state until a RESET is issued by the host. If the bits agree, the preferred embodiment increments its internal counter to point to the next bit in the ROM data and then repeats the same set of three time slots for the next bit. If all bits of the ROM are matched correctly, the host may access the preferred embodiment with the standard command structure for the part.

An Example of a ROM Search

The following example of the ROM search process assumes two different preferred embodiments are connected to the same one-wire bus. The ROM data of the two preferred embodiments begins as shown:
ROM0-00110101 . . .
ROM1-00010001 . . .

The search process is as follows:
1. The host begins by resetting all devices present on the one-wire bus.
2. The host will then issue the Search ROM Data command on the one-wire bus.
3. The host executes two read time slots and receives a zero bit followed by a one bit.

This indicates that all devices still coupled have zero as their first ROM bit.

4. The host executes a write zero time slot as the third slot in the set of three. This action keeps ROM0 and ROM1 coupled.
5. The host executes two read time slots and receives a zero bit followed by a one bit.

This indicates that all devices still coupled (ROM0 and ROM1) have a zero as their second ROM bit.

6. The host supplies a write zero time slot as the third time slot to keep ROM0 and ROM1 coupled.
7. The host executes two read time slots and receives two zero bits. This indicates that both one bits and zero bits exist as the third bit of the ROM I.D.'s of the devices coupled.
8. The host executes as write zero time slot as the third bit. This decouples ROM0, leaving only ROM1 still coupled.
9. The host reads the remainder of the ROM bits for ROM1 using three time slots for each bit. After this, the host can communicate to the underlying logic if desired. This completes the first ROM I.D. search pass, in which one of the devices was found.
10. The host starts a new ROM search by repeating steps 1 through 7 above.
11. The host supplies a write one time slot as the third bit. This decouples ROM1, leaving only ROM0 still connected.
12. The host reads the remainder of the ROM I.D. bits for ROM0 and communicates with the underlying logic if desired.

If more devices are present on the one-wire, the same structure as presented above will be used to determine the unique ROM I.D. of each attached device. As soon as multiple devices are detected, a series of writes will be used to disable that branch in the search path.

The host learns the unique address (ROM data pattern) of one one-wire device on each ROM SEARCH operation. The time required to derive the part's unique address is:

$$960 \ \mu sec+[8+3\times64 \ bits]\times61 \ \mu sec=13.16 \ msec$$

The host is therefore capable of identifying 75 different one-wire devices per second.

Additionally, the data obtained from the two read time slots of each set of three time slots have the following interpretations:
00—There are still devices attached which have conflicting bits in this position.
01—All devices still coupled have a zero bit in this bit position.
10—All devices still coupled have a one bit in this bit position.
11—There are no devices attached to the one-wire bus (this is an error condition).

4. Pass-Thru Mode

The Pass-Thru command is used to allow a host connected to the one-wire bus to gain access to the preferred embodiment directly. It can be used only when there is one preferred embodiment on the one-wire bus. This command bypasses the serial number internal to the preferred embodiment and allows the host to directly control the preferred embodiment with the preferred embodiment commands and protocol.

Three-wire BUS

The three-wire bus is comprised of three signals. These are the RST\ (reset) signal, the CLK (clock) signal, and the DQ (dam) signal. All data transfers are initiated by driving the RST\ input high. The RST\ signal provides a method of terminating a data transfer.

A clock cycle is a sequence of a falling edge followed by a rising edge. For data inputs, the data must be valid during the rising edge of a clock cycle. Command bits and data bits are input on the rising edge of the clock and data bits are output on the falling edge of the clock. All data transfers terminate if the RST\ is low and the DQ pin goes to a high impedance state. When data transfers to the preferred embodiment are terminated by the RST\ signal going low, the transition of the RST\ going low must occur during a high level of the CLK signal. Failure to ensure that the CLK signal is high will result in the corruption of the last bit transferred. The command bytes are the same for one-wire and 3-wire.

1. One-wire/three-wire Arbitration

The preferred embodiment can utilize both the one-wire and the three-wire busses simultaneously. Neither input bus has priority over the other. Instead, if both inputs are being used, the signal arriving first will take precedence. More simply, if the one-wire interface becomes active before the 3-wire interface, all communications will take place on the one-wire bus. The 3-wire bus will be ignored in this case. The same condition occurs for the one-wire interface if the 3-wire interface becomes active first.

2. Command Byte

The command byte is sent to select read memory, read scratch, write scratch, or copy scratch to memory.

3. Write Scratch Memory Page (Command Byte 0Fh)

After the command byte, 0Fh, 2 address bytes must be sent. These bytes define the target page (S0–S15) where the data written into the scratch page will be copied. Addressing is on page boundaries. Data written to the scratch page beyond the 32nd byte will be ignored. This address will be saved in the scratch page and will be sent to the user for verification when the scratch page is read. See Copy Scratch Page to Secure Memory Page and Read Scratch Page definition. After the last address bit (S15) is sent, the user can begin to write to the scratch page at the byte address (S0–S4). If less than 8 bits are written into a byte, the partial byte flag (pf) is set (bit E5). If this flag is set and a Copy Scratch Page to Secure Memory Page command is sent, the bytes will be copied as is to the target address page. If data is sent beyond the last byte in the page, the additional bytes/bits are ignored and the overflow flag (of) will be set to a "1" (bit E6). Flags E5 and/or E6 will be cleared only when new data is written to the scratch page that does not have partial byte and/or overflow condition.

4. Read Scratch Page (Command Byte 5Ah)

After the command byte, 5Ah, the user can start to read scratch page data. The first 3 bytes read will be the last target address (S0–S15) sent by a write scratch command and a byte containing the ending byte address (E0–E4), overflow flag (of) bit E5, partial byte flag (pt) E6, and authorization accepted (aa) bit E7. If a Copy Scratch to Secure Memory command is sent and the authorization code is not accepted, bit E7 is set to zero. This bit will be set to a "1" if the code matches. It will be reset when the next Write to Scratch Page command is sent with a target address. Flags E5 and/or E6 will be cleared only when new data is written to the scratch page that does not have partial byte and/or overflow condition. The data is then read from the starting address. To stop reading, a reset pulse is sent by the user. If reading occurs beyond the end of the page, all "1"s will be read and a reset will be required to regain access to the preferred embodiment.

5. Copy Scratch Page to Secure Memory Page (Command Byte A5h)

After the command byte, the user sends the target address (S0–S15) and the ending address/status byte (E0–E7) that was read from the scratch page during verification of scratch data. This target address and ending address is verified internally and when matched, the data in the scratch page is copied to secure memory. Bit E7 (aa) will be set to a logic '1'. (See Read Scratch Memory for bits E0–E7 definition).

6. Read Secure Memory Page (Command Byte F0h)

The user must send 2 bytes (S0–S15) after the command, F0h. The bits, S0–S4, select the beginning byte address within the page (0–31). Bits S5–S15 select the page address. The user can read bytes until a reset pulse is sent or until the last byte in the last page is read. If reading is attempted beyond the last byte in the last page, only logic "1"s will be read. A reset pulse is required to regain access to the preferred embodiment.

7. Address Select Bytes (S0–S15)

These bits are read/write bits that define the target page address and the byte address within the page. Bits are active when set to a logic "1". S0–S4 define the byte address within a selected page. S5–S15 define the target page address.

These bits are sent LSB to MSB.

8. Page Memory Map Definition

Secure memory pages=0000h-01FFh=sixteen (256 bit) pages. The term "secure memory" is used to define memory that can only be read. To write to this memory, the user must write to the scratch page, verify the data in the page, and authorize the coping of that data to secure memory.

The user can start reading any where in the memory map and continue reading until a reset is sent by the user. If reading continues beyond the last byte in the last page, only logic "1"s will be sent. The user will be required to send a reset pulse (480 μsec) before access will again be granted. If more than 32 bytes are read when reading Scratch Memory Page, only logic "1"s will be read until the user sends a reset pulse.

9. Control Register (0200h)

For better understanding of the preferred architecture, the following is a more detailed analysis of the control register assignments.

Mode Select Register—All alarm flags will be reset to a logic low state when the correct bit of this register is read.

Bit 0=RTCF=The RTC alarm has occurred and set this bit to a logic "1" state. This bit will clear when bit 1 has been read. This is a read only bit.

Bit 1=ETCF=This bit is set to a logic "1" when the elapsed time alarm occurs. This bit will clear when bit 1 has been read. This is a read only bit.

Bit 2=RTCE=This bit, set to a logic "1", will enable the interrupt for the real-time clock alarm. When the alarm condition exists, bit 0 will be set to a logic "1" and an IRQ will be generated. This is a read/write bit. Note: All interrupts will be held in a pending condition if communication is detected on the I/O pin. When the communication has completed, the interrupt will be sent to the host.

Bit 3=ETCE=This bit, set to a logic "1", will enable the interrupt for the elapsed time clock alarm. When the alarm condition exists, bit 1 will be set to a logic "1" and an IRQ will be generated. This is a read/write bit.

Note: Interrupts generate on the one-wire I/O address will be held in a pending condition if communication is detected on the I/O pin. When communication has completed, the interrupt will be sent to the host via the I/O pin.

Bit 4=OSC{=This bit is set to a logic "0" to enable the clock oscillator.

Bit 5=DSEL=Delay select bit. This bit is used to select a delay time for starting the elapsed timer in Auto mode. See bit 7 definition for Auto. When set to a logic 0, the delay for starting and stopping the elapsed timer is 3.4+0.5 msec. When set to a logic 1, the delay will be 123+2 msec.

Bit 6=/ELAP=Manual Start/Stop command bit. This bit is set to a logic "0" to start the elapsed time clock. Setting this bit to a logic "1" will stop the elapsed time clock. Bit 7 must be set to a logic "0" to use the elapsed timer in the manual mode.

Bit 7=AUTO=This bit, when set to a logic "1", enables the elapsed time clock in the automatic mode. The elapsed timer will start or stop depending on the voltage levels on the I/O input and the Bit 5 setting. The requirements for this are listed below. Example: When bit 5 is set to a logic 1, the elapsed time will start when the voltage applied to the I/O pin is greater than 2 volts and has been at this voltage level longer than 123+2 msec with no transitions on the I/O. The elapsed time will stop when the voltage on the I/O pin is less than 0.8 Volts for 123+2 msec with no transitions on the I/O pin. The elapsed time registers will accumulate on time. One start state followed by a stop state is defined as one cycle. When bit 7 is set to a logic "0", the elapsed timer can be controlled by bit 6, and the cycle counter will no longer count cycles until returned to Auto mode.

10. Real-Time Clock (Address bytes 0201–0205h)

The real-time clock register and alarm register are located at address 0201h–0205h and 020Bh–20Fh. The real-time clock is assigned address 0201–0205h. The clock and alarm data is in binary format with the LSB equal to 256th of a second. The total count of the 5 bytes is a calendar of 136 years. The alarm is a match of bits in the alarm bytes to the RTC bytes. The alarm registers are located 020Bh–020Fh.

11. Elapsed time—Address bytes 206h–20Ah

The elapsed time and alarm registers are located at address 206h–20Ah and 210h–214h. The elapsed time registers will accumulate the time in binary format with the LSB=256th of a second. The elapsed time alarm (bytes 10h–14h) is programmed by the user and an alarm condition exists when the alarm byte count matches the elapsed time bytes count.

12. Cycle counter—Address bytes 215h–217h

The cycle count registers require 3 bytes. These registers will accumulate the (binary) number of times the voltage at the I/O pin transitions from low to high level and back to a low level. One cycle is defined in the bit 7 Auto definition. These registers can be cleared only by the user writing "0"s to these registers. The time base for counting cycles is determined by the DSEL bit 5.

Overall Organization

FIG. 1A shows the high-level physical layout of the chip used in the preferred embodiment.

Oscillator

The crystal-controlled oscillator, in the preferred embodiment, is essentially the same as that described in U.S. application Ser. No. 499,853, Filed Mar. 27, 1990, entitled "Feedback-Controlled Oscillator" (DSC-74B), which is hereby incorporated by reference. The parent and grandparent applications have issued as U.S. Pat. Nos. 4,871,982 and 4,912,435, which are both hereby incorporated by reference.

Divider

The oscillator output, in the preferred embodiment, is divided down to produce a "tick" signal at 256 Hz in divider block DIV.

Integrated Counter/SRAM Array

FIGS. 3A through 3F are an overlaid set of maskwork patterns, showing the principal levels of the layout actually used, in the preferred embodiment, for the integrated RAM-counter array.

Figure 3A:
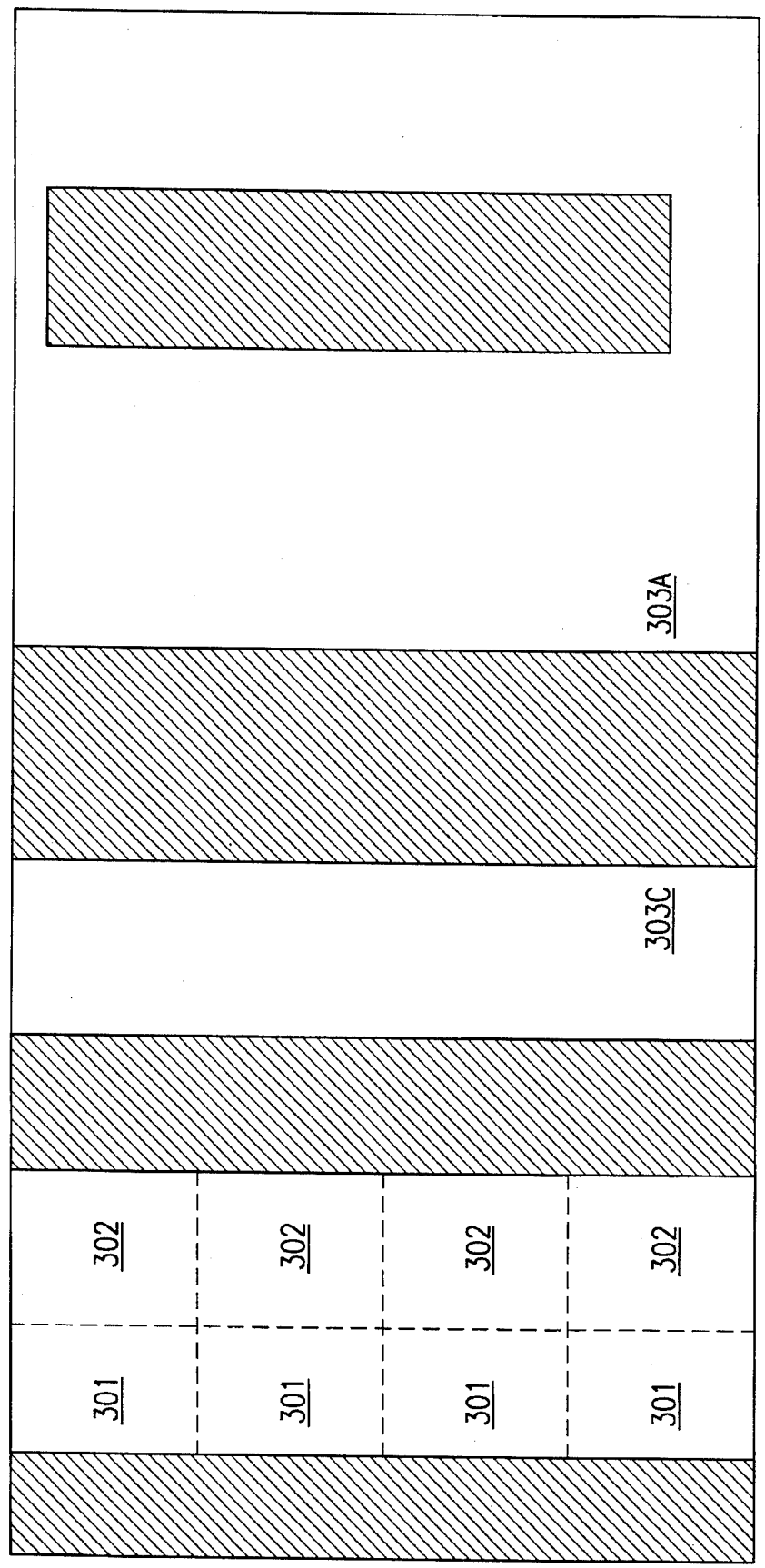
FIGS. 3A through 3F are an overlaid set of maskwork patterns, showing the principal levels of the layout actually used, in the preferred embodiment, for the integrated RAM-counter array.

FIG. 3A shows the N-Well pattern. The black parts of this pattern are areas where N-type dopant ions will be implanted to form N-Well regions (where PMOS devices can be fabricated). In the remaining areas, the doping will remain P–, and NMOS devices can be fabricated there.

Figure 3B:
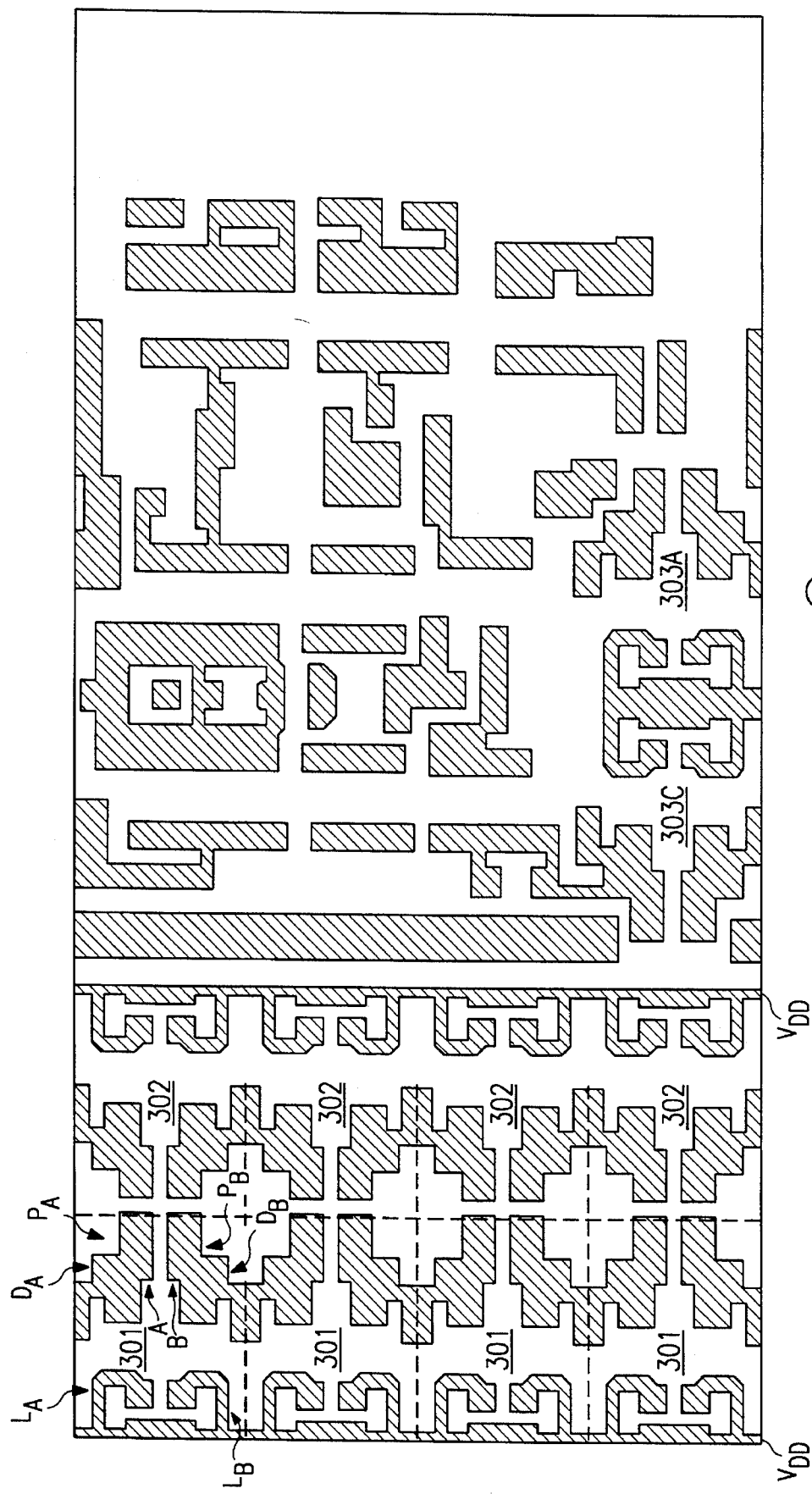

FIG. 3B shows the "active" pattern. In the black areas of this pattern, crystalline semiconductor material will be left exposed, so that a MOS transistor will be created wherever the polysilicon pattern crosses the active pattern. The other areas shown in FIG. 3B will be covered with a thick field oxide.

Figure 3C:
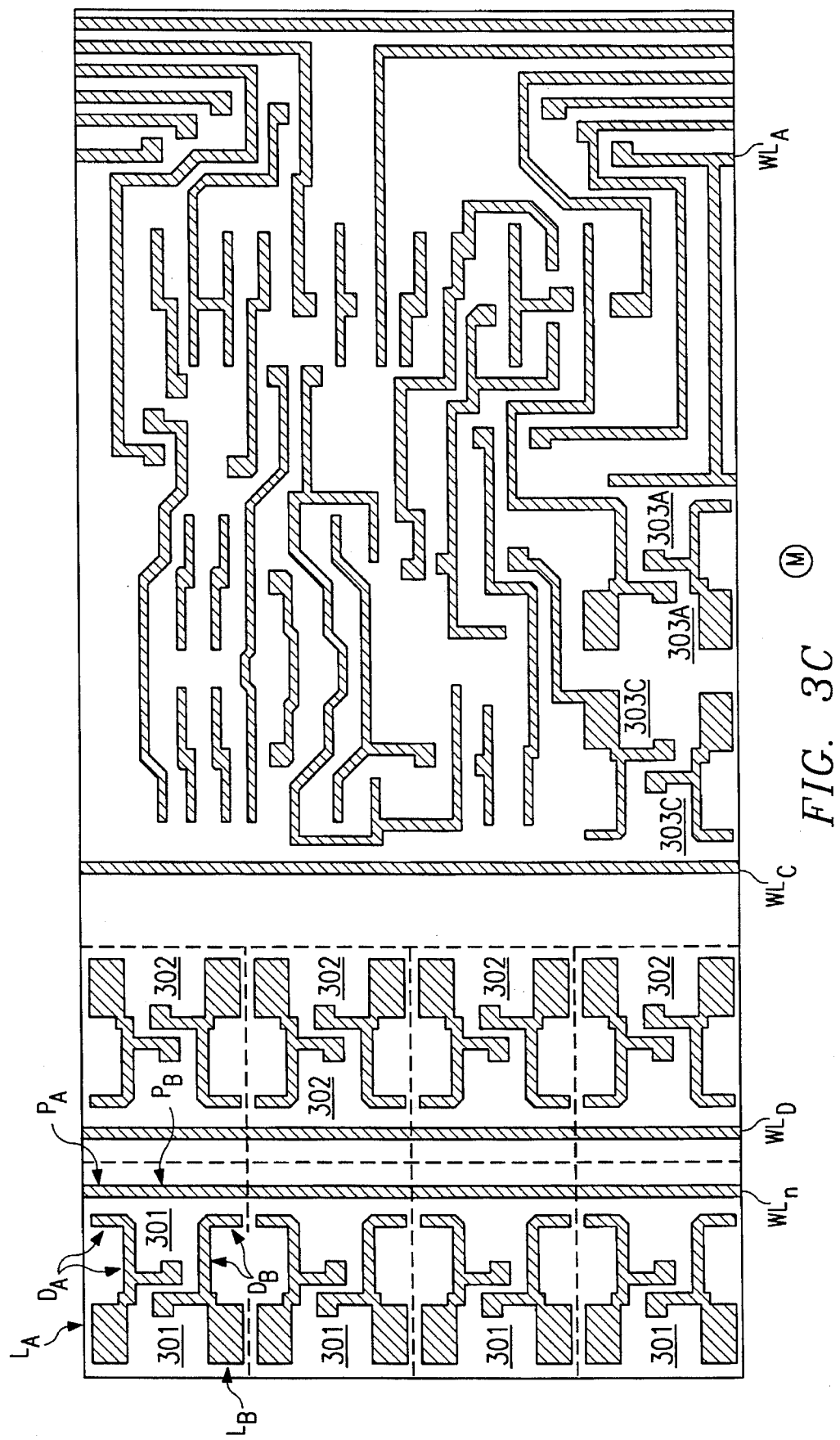

FIG. 3C shows the polysilicon pattern. The polysilicon layer (shown in black) provides transistor gates, and also is used for interconnects.

Figure 3D:
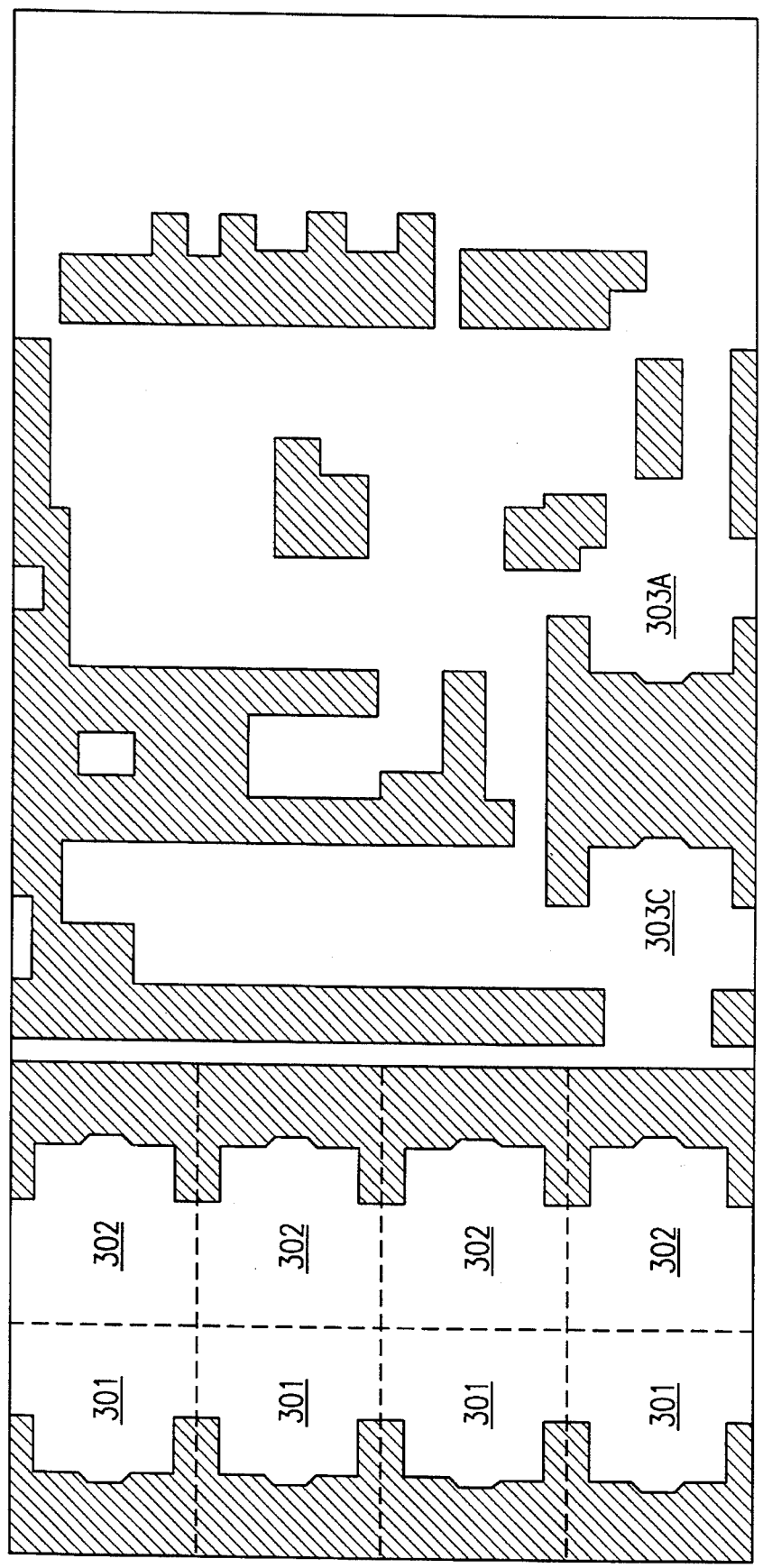

FIG. 3D shows the P+ implant pattern. In the black areas, P-type ions will be implanted. This implant will be blocked by polysilicon (where present) and by thick field oxide, wherever those are present; but in other locations this implant will form the P+ source/drain regions of PMOS transistors. A complementary mask is used to bring the implantation of N+ dopants, to form the N+ source/drain regions of NMOS transistors. Both of these implants are high-dose, low-energy implants, to form shallow, heavily doped source/drain regions.

Figure 3E:
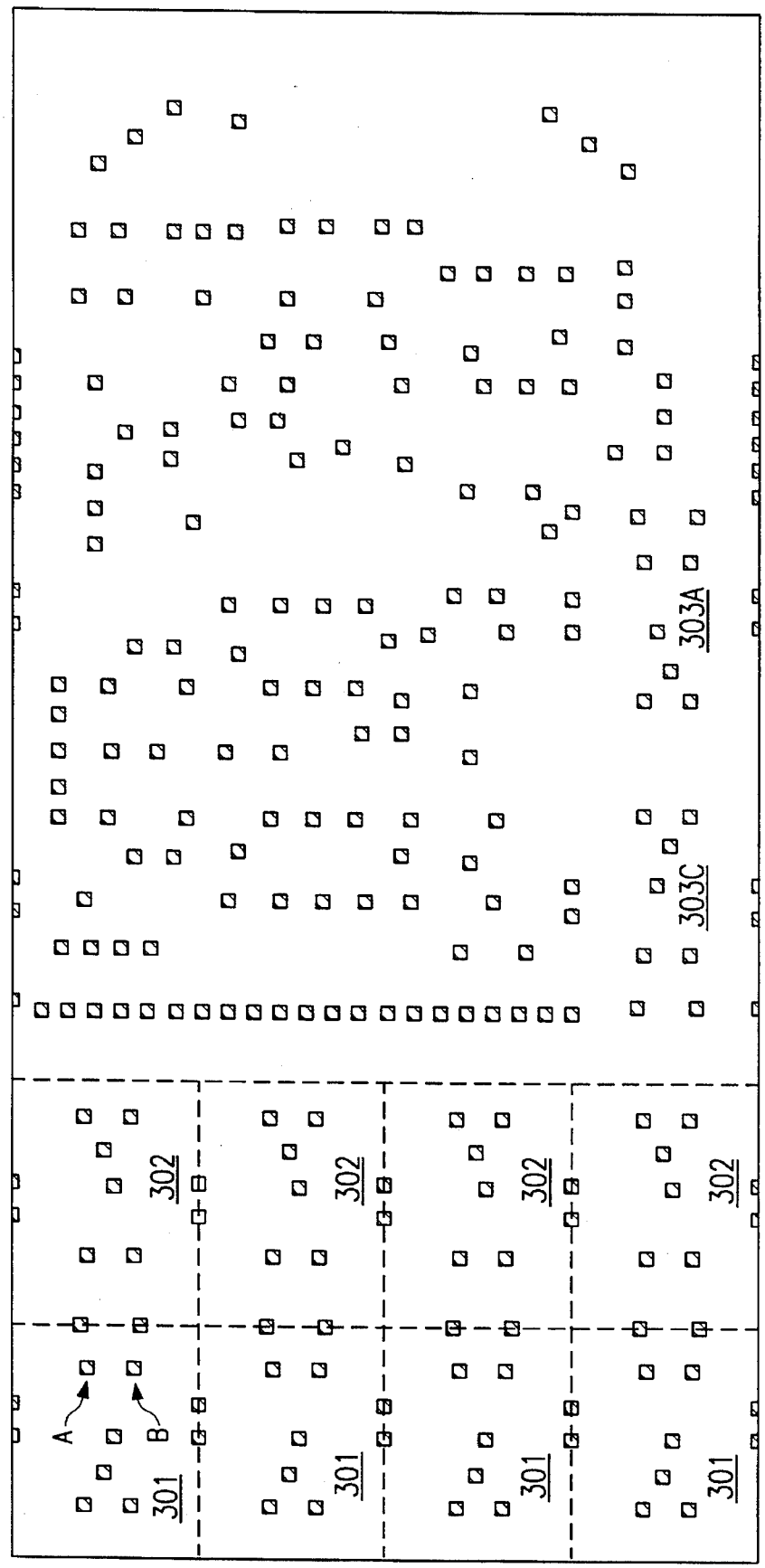

FIG. 3E shows the contact pattern. Each little black square shows a location where a contact hole will be open in the interlevel oxide. Thus, overlying metal layer will make contact to the polysilicon layer, or to the silicon active area, wherever one of these contacts occurs.

Figure 3F:
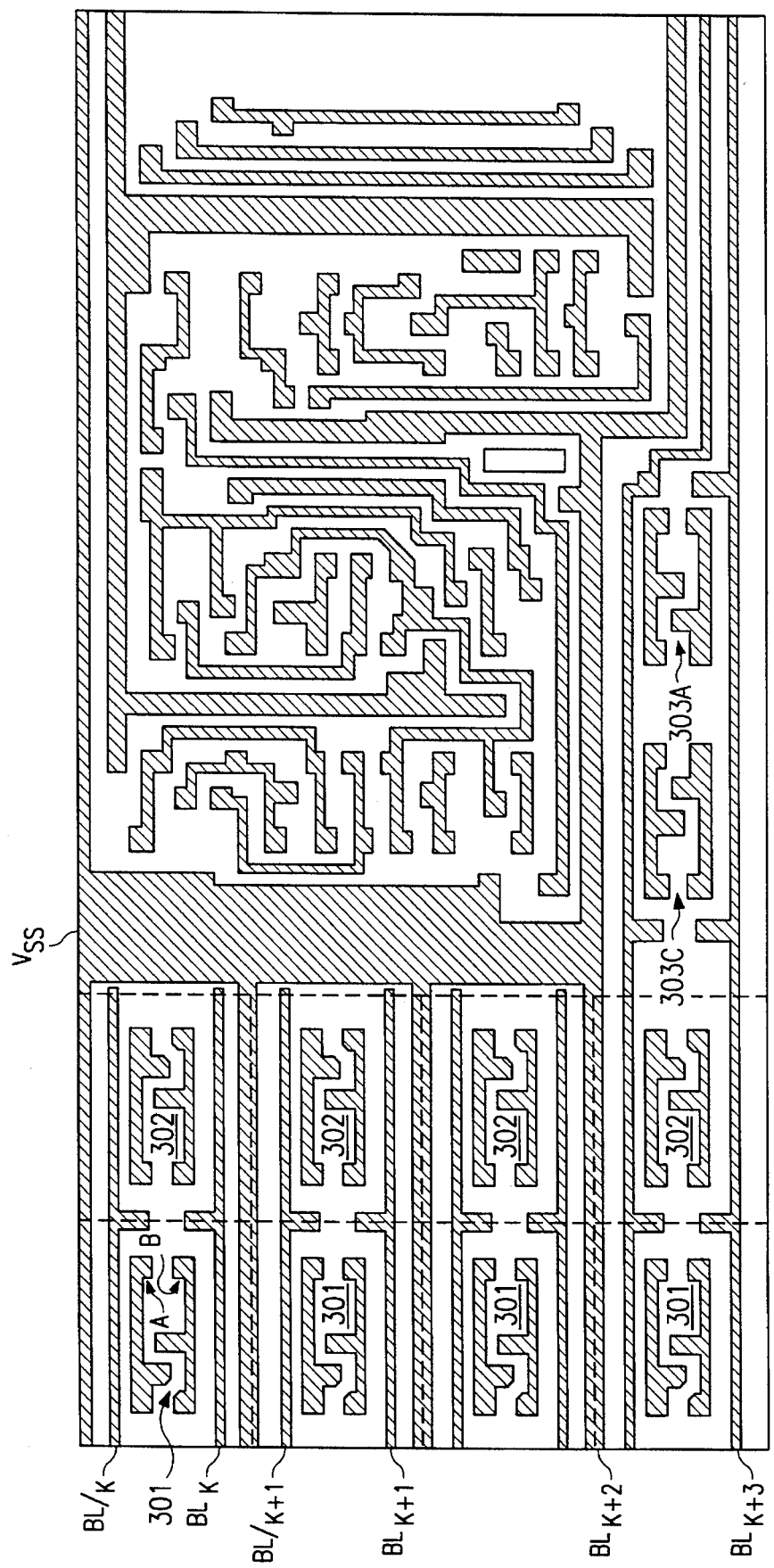

FIG. 3F shows the metal pattern used, in the preferred embodiment.

These figures show accurate relative dimensions, and are all drawn to the same scale. Thus, while these drawings, of course, do not show absolute dimensions, the relative dimensions are accurately shown.

In the SRAM array, each cell 301 contains two principal nodes, which are labeled "A" and "B" for one of the cells shown. Each of these principal nodes is accessed by a pass transistor $P_A$ or $P_B$, and is either being pulled down by a driver transistor $D_A$ or $D_B$, or else is being pulled up by a load transistor $L_A$ or $L_B$. The pass transistors $P_A$ and $P_B$ serve to connect the principal nodes A and B to a pair of metal bit lines, $BL_K$ and $BL_k\backslash$. The ground voltage $V_{SS}$ is routed around the memory array using metal lines. However, note that the power supply voltage, $V_{DD}$, is routed in a direction parallel to the rows, using a long P+ diffused region. (In the counter cell, $V_{DD}$ is brought in on a metal line; but this is not necessary for the RAM array.)

Although there appear to be two rows of memory cells shown, the rightmost row (of cells 302) is actually not functional, but is a dummy: note how the active area is interrupted, so that the pass transistors are not able to make contact to the bit lines (see FIG. 3B). The whole purpose of this dummy row is to provide a capacitance, as seen by the dummy word line $WL_D$, which is exactly equal to the capacitance which an operational row of cells provides to its word line $WL_n$. (Thus, by using the voltage on the dummy word line $WL_D$ to drive a logic transition, the peripheral logic can tell when the selected one of the real word line has been charged up to a high enough voltage to open the pass transistors in the selected cells.)

Note how three of the column line pairs ($BL_k$ and $BL_k\backslash$ through $BL_{k+2}$ and $BL_{k+2}\backslash$) shown simply stop at the edge of the array of memory cells. Only the fourth pair of column lines ($BL_{k+}$ and $BL_{k+3}\backslash$) continues up through the counter arrays.

The layout shown includes only one bit of one counter chain. The column line pair continues upward, through the stage shown, into the corresponding stage of the next counter chain, and then into the corresponding stage of the third counter chain, and so on.

In the preferred embodiment, there are three counter chains, each including 41-bit stages, but of course this number can readily be increased or decreased as desired. In fact, one of the advantages of the disclosed innovations is that they provide a fully saleable architecture for multiple counters of any size.

Note that two word lines run along each counter chain: one word line is used to address the stored count value, and one word line is used to address the stored alarm value.

Note that the one-bit counter stage also includes two bits of SRAM memory. One of these two cells is used to store the one-bit of count value for this stage, and one-bit is used to store the alarm value for this stage. The logic integrated in this counter stage includes a digital comparator, which will pull down the MATCH line if a match is not detected. (Thus, all of these digital comparator circuits are effectively wire-ANDed together, and an overall match will be detected if, and only if, a match is detected at every bit position.)

In addition to the MATCH line, two other lines which run to every cell are FF2L and L2FF. When the line FF2L is driven active (high), each flip-flop will transfer its state to the corresponding gated latch. This latch can then be read out over the column line pair, by driving the time data word line.

In the preferred embodiment, separate FF2L and L2FF lines are provided for each of the three counter chains. However, alternatively, these lines could be connected to be common to all the counter chains.

In the preferred embodiment, the FF2L line is driven high at the start of any user-read operation. The protocol used, in the preferred embodiment, requires address arguments with any read command. Communication of these arguments, in the required serial protocol, provides enough time for any ongoing ripple through the counter to be completed, and for transfer of the counter data to the accessible latch cell of each stage, before the selected word line can go high to begin data access. (A signal Ripple_done is used, in the preferred embodiment, to indicate that any ongoing rippling should be completed.)

Thus, the consumption of battery charge caused by this operation is avoided, except when strictly necessary.

The L2FF signal is wired in a similarly parallel connection, but serves merely to provide a transfer in the opposite direction (from the accessible latch back to the flip-flop stage.)

Each stage provides a one-bit data output TRTC which clocks the next stage of the counter chain. The very first stage of the counter chain is clocked by a divided down signal that is clocked directly by the divided-down oscillator signal.

In the preferred embodiment, the first stage is clocked at a frequency of 256 Hertz, and the total number of stages is 40. Thus, this counter stage will not overflow for approximately 126 years. In the preferred embodiment, the RAM/counter array is laid out as two half arrays, with some peripheral logic in the center. (Of course, other subarray organizations can be used instead if desired.) However, in the preferred embodiment, the gap between the two half-arrays is used for insertion of a test clock signal into the TRTC and TECT lines. (A problem with long counter chains is that, even if a fast test clock is applied, the time to propagate this signal through the whole counter chain would be unacceptably long).

Counter Circuitry

Figures 3, 4:
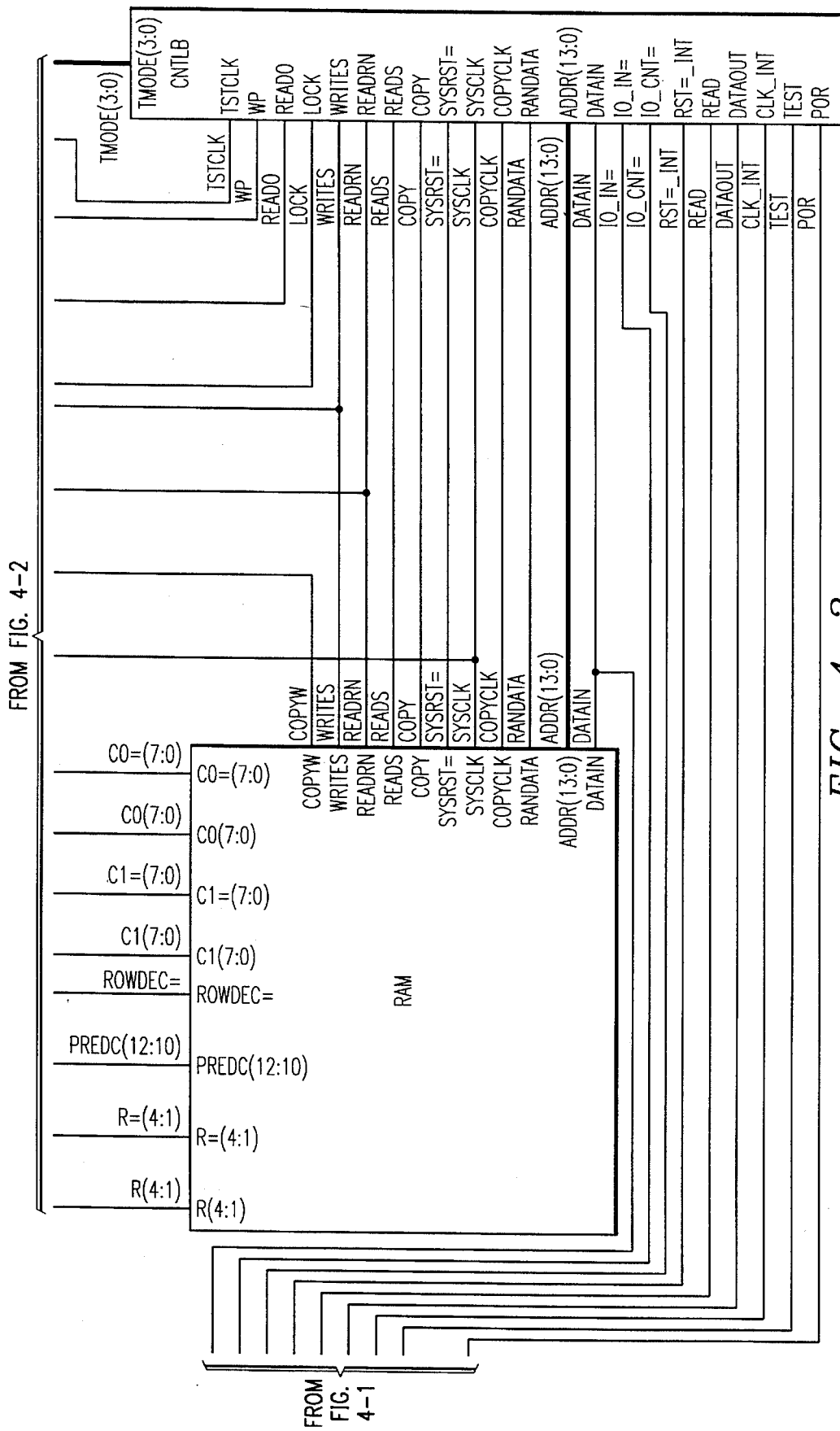
Figures 1, 4A:
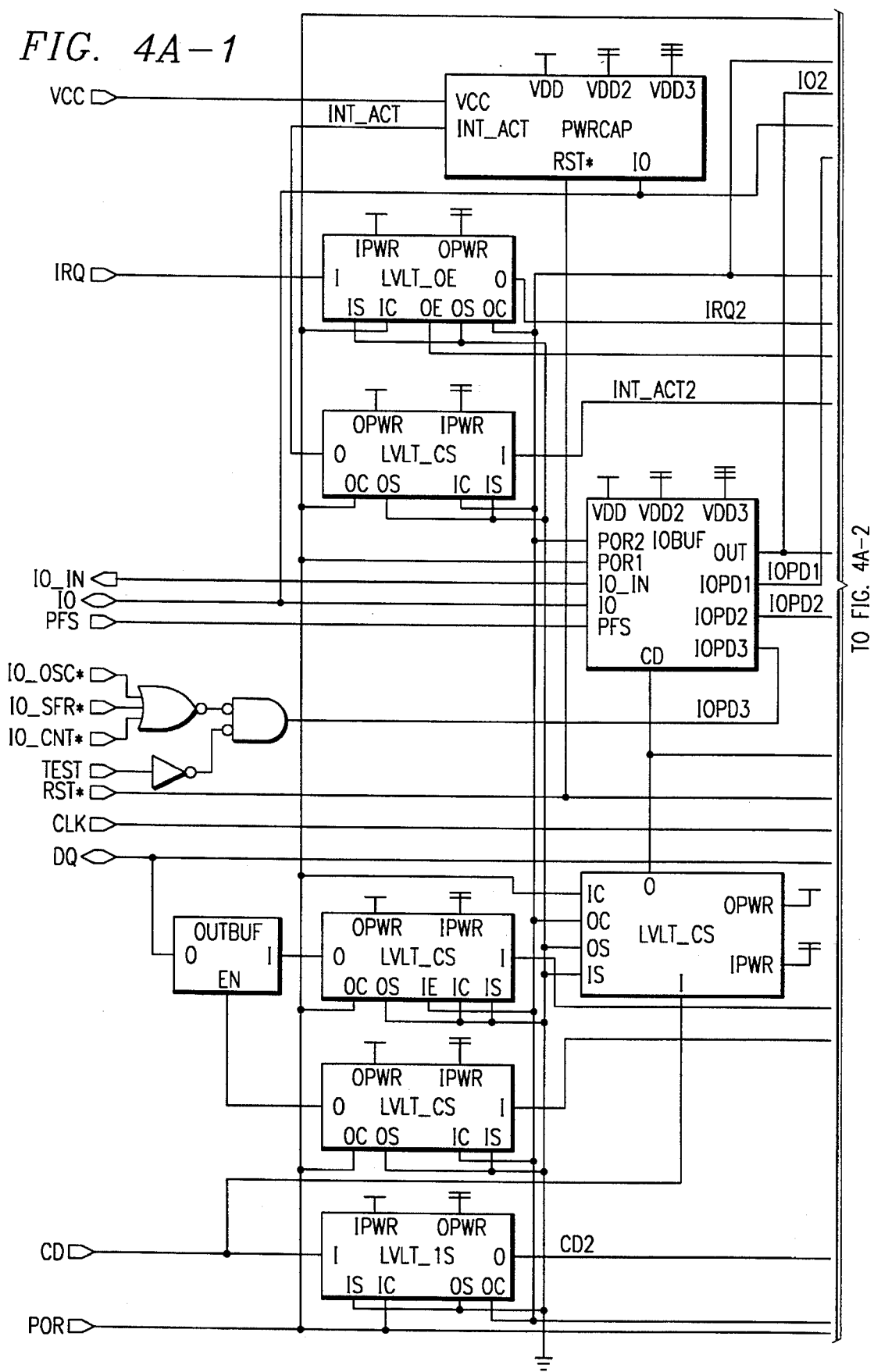
Figures 2, 4A:
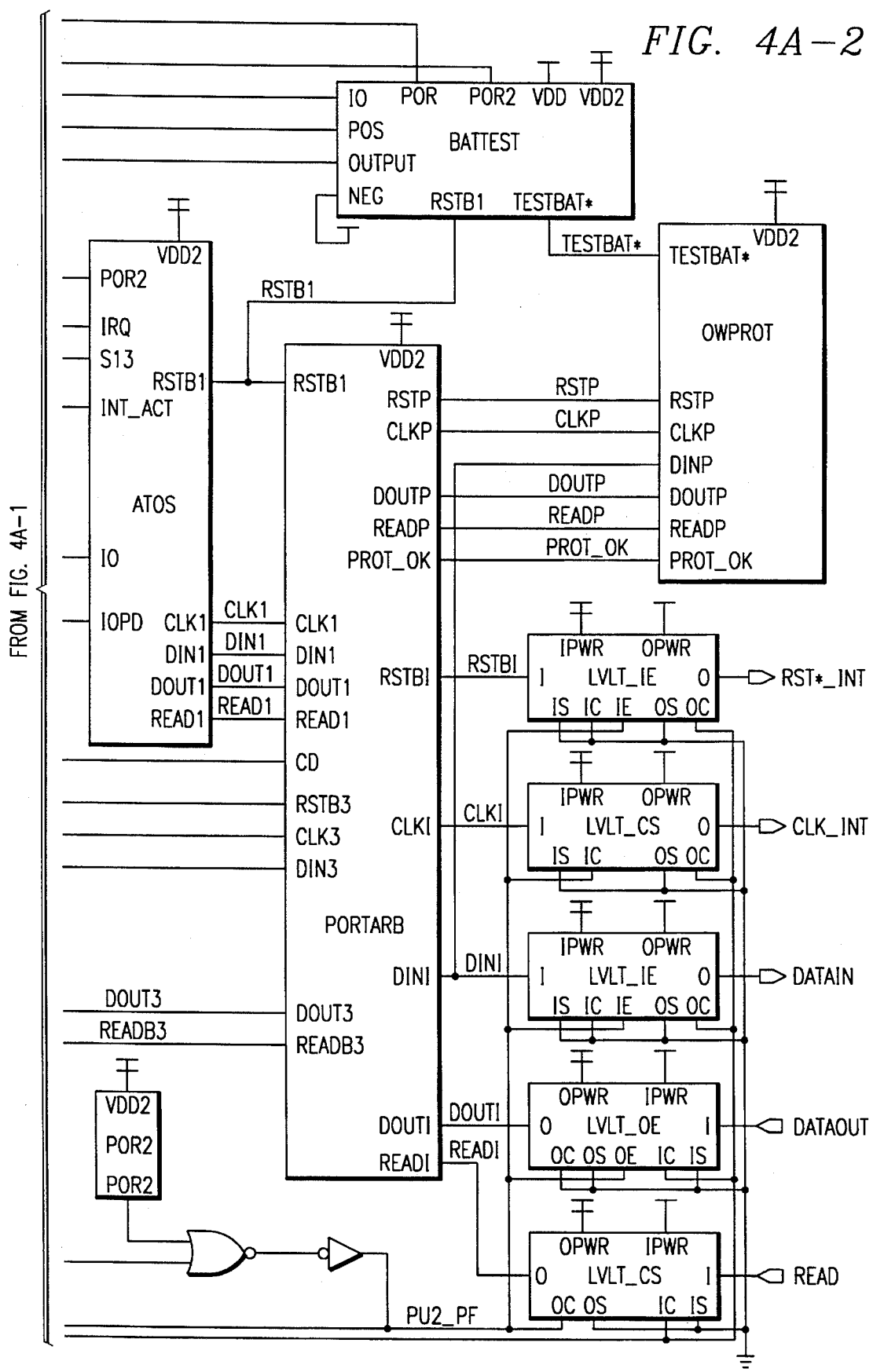

Note that each counter stage, in the layout of FIG. 3, includes two gated latches: one of these holds one bit of the time data, and the other holds one bit of alarm data.

Parallel Transfer from Flip-Flop to Latch

Figures 3, 4B:
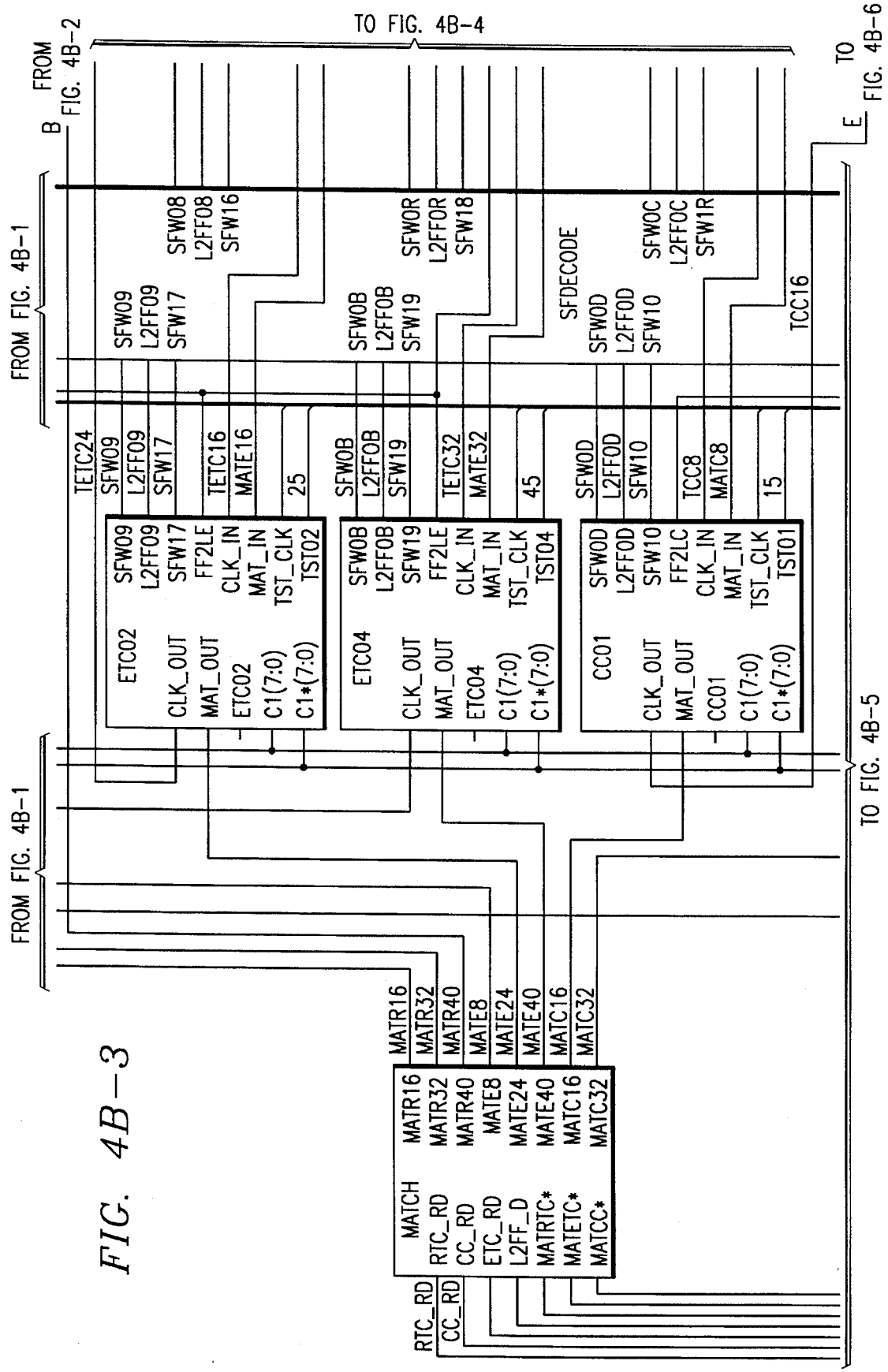
Figures 4, 4B:
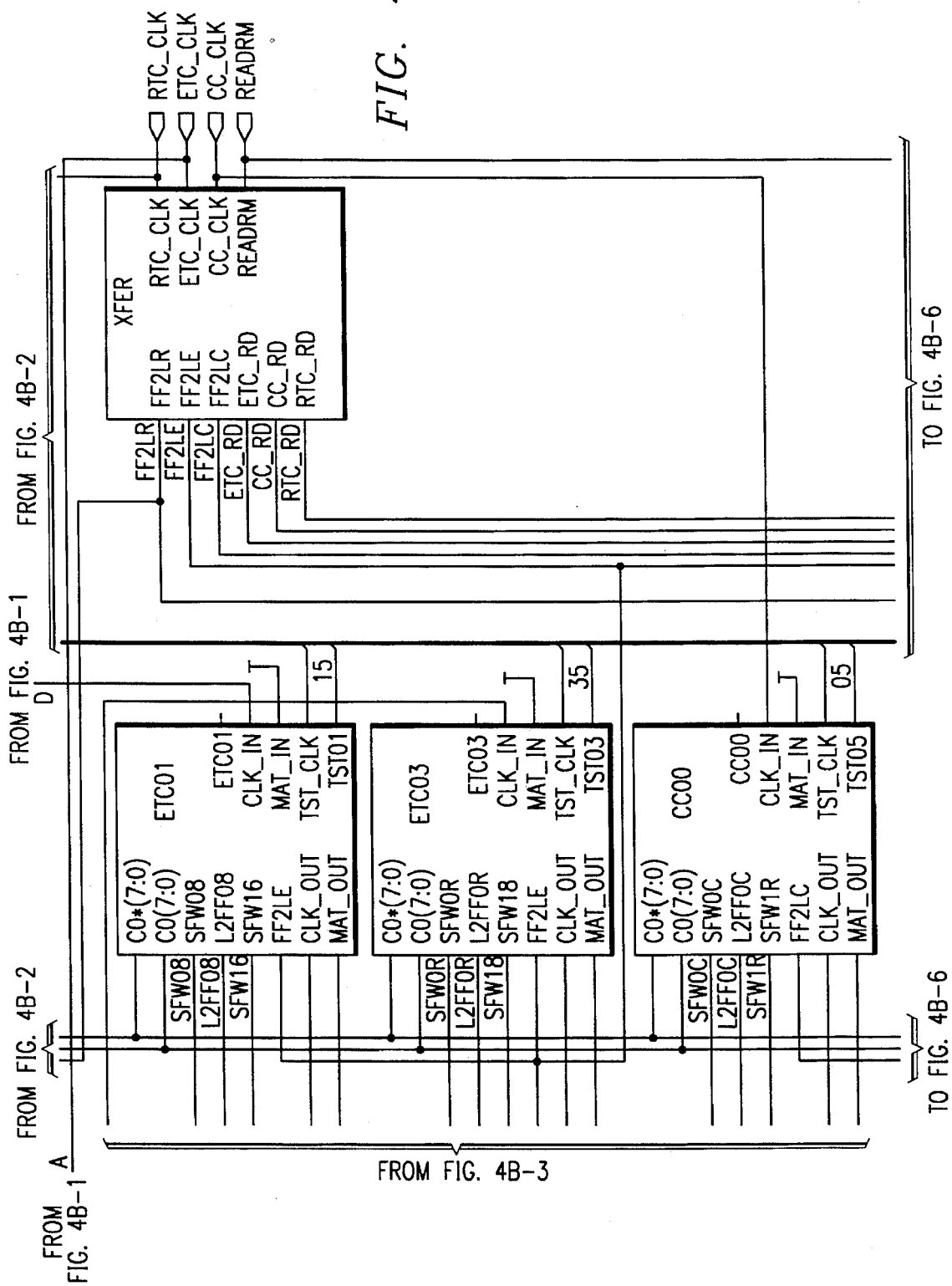
Figures 4, 4B, 5:
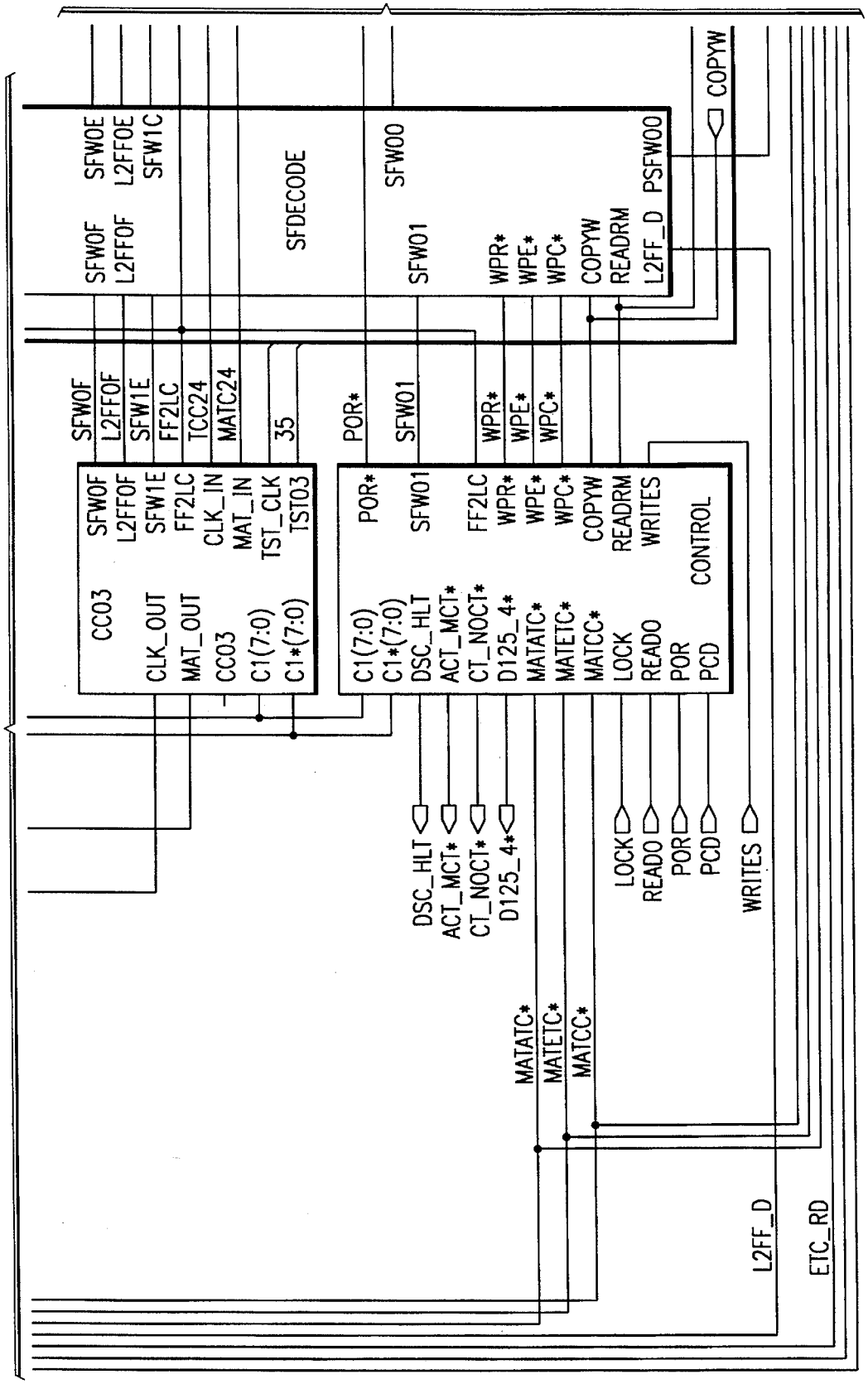

FIG. 4B1 shows the circuitry used, in the preferred embodiment, to generate a parallel transfer signal (FF2L) at the start of every read operation.

Use of Scratchpad to Safeguard Memory Access

Figure 2A:
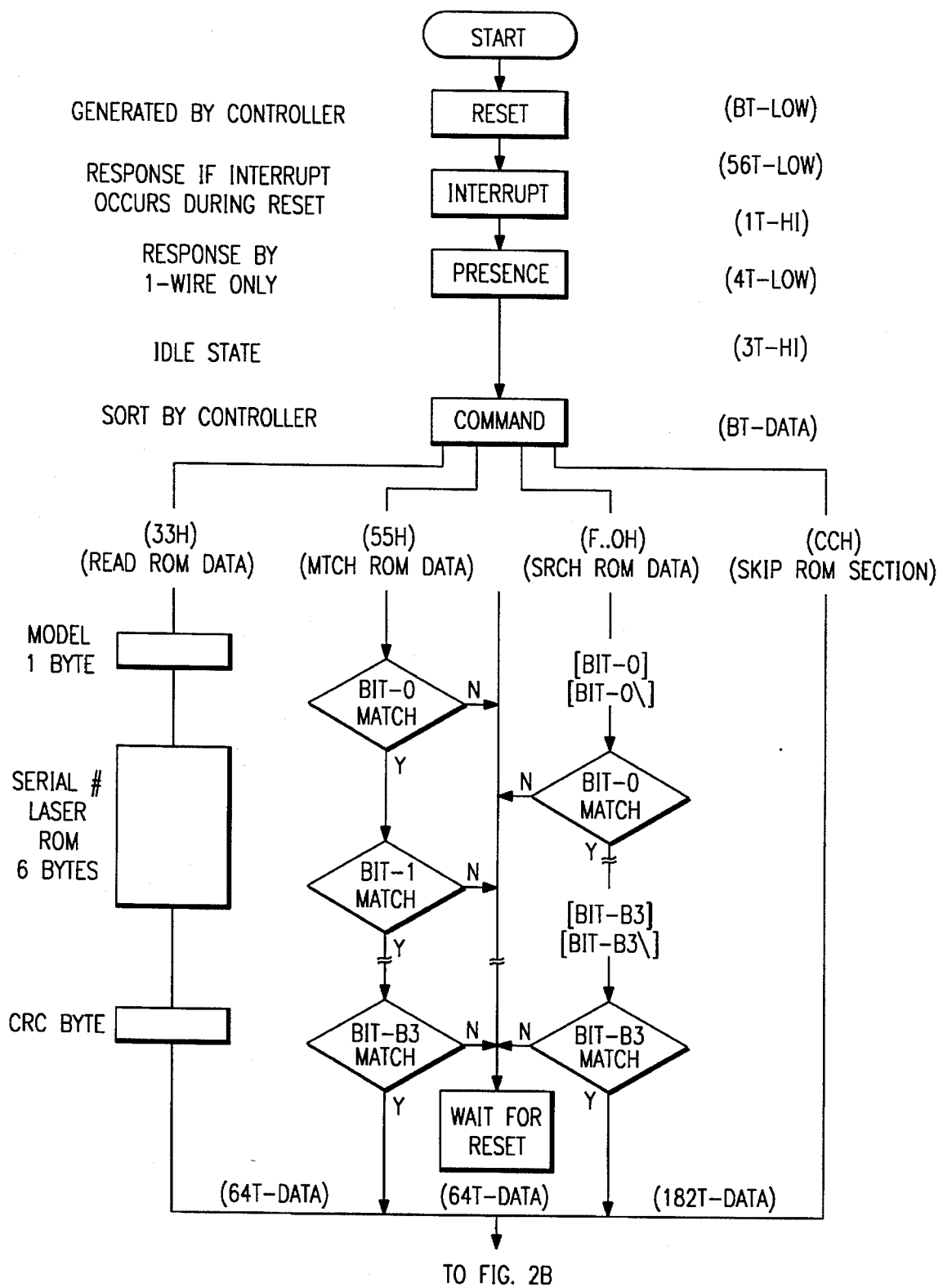
FIGS. 2A and 2B are a single flow chart, on two sheets, showing the sequence of operations used, in the preferred embodiment, to interface to the one-wire bus, and to respond to memory read, scratchpad read, scratchpad write, and scratchpad copy commands.
Figure 2B:
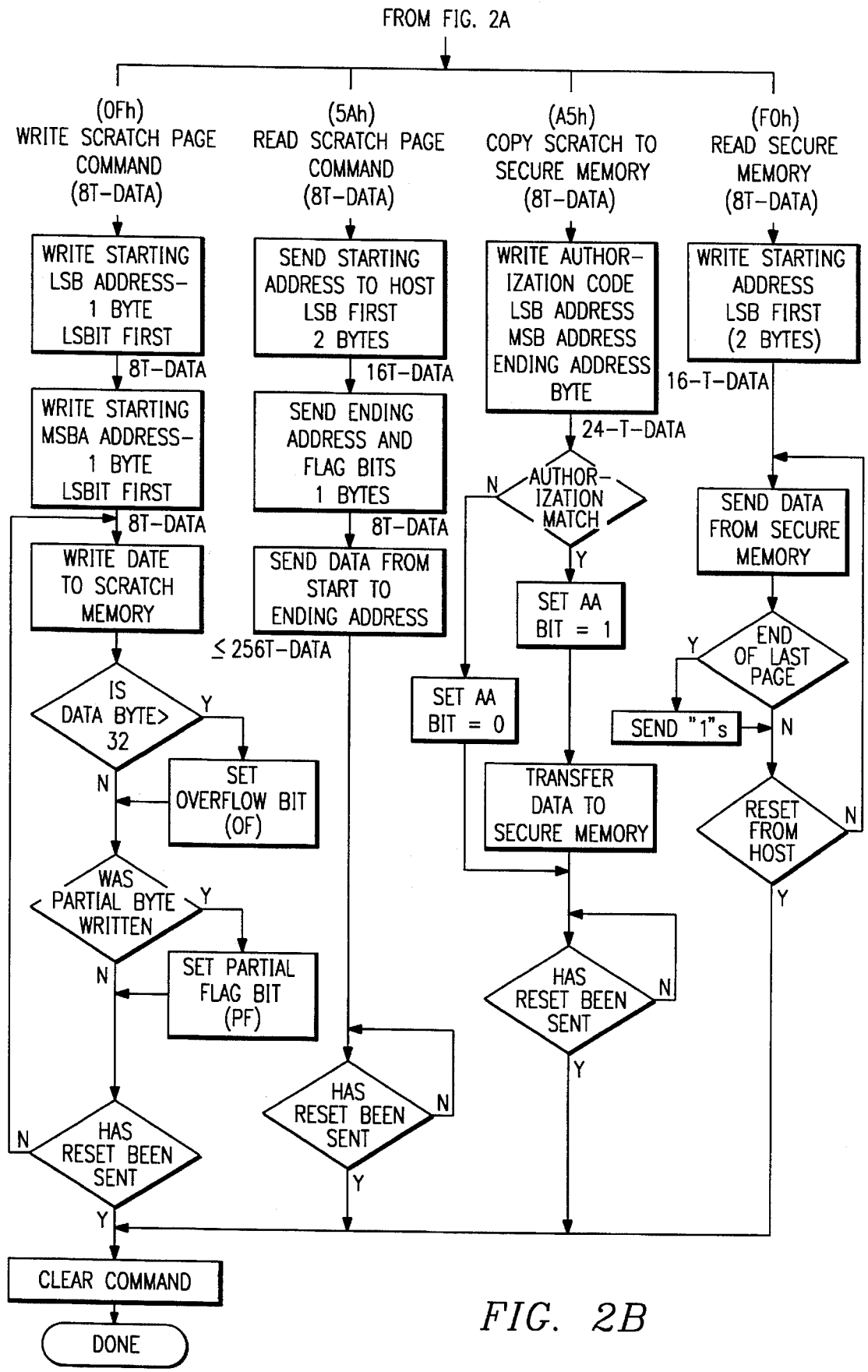

FIGS. 2A and 2B are a single flow chart, on two sheets, showing the sequence of operations used, in the preferred embodiment, to interface to the one-wire bus, and to respond to memory read, scratchpad read, scratchpad write, and scratchpad copy commands.

Self-Disablement

There are three modes of self-disablement which are provided in the chip of the chip used in the preferred embodiment.

Use of Separate Power-Supply Domains

The chip of the preferred embodiment is laid out in three separate power supply domains. Thus, one side may be operational when the other side is totally powered down. Thus, signal lines crossing the power boundary may be in a floating condition. To prevent the potential of a floating line from pulling an input buffer into its high-current region, weak loads are connected to the signal lines. To prevent the weak loads from dissipating excessive amounts of current, the signal lines running across the power boundary are fed through one-shot circuits before they cross the power boundary. Thus, the weak load provides no DC current draw. This relationship may be applied only to signals originating on one side of the power boundary, or alternatively, to signals originating on either side of the power boundary.

FIGS. 4A7–4A9 show three slightly different versions of the circuitry used to transmit signals across a power-supply-domain boundary, in the used in the preferred embodiment. FIG. 4A10 shows alternative circuitry, and FIGS. 4A11–4A16 illustrate its operation. A more detailed description appears in following section "Input/Output: Block IO".

Smart Socket for Microprocessors

FIG. 5 shows a plan view of an innovative socket which can be used in combination with the chip of the preferred embodiment.

The pattern of pin holes 503 in this particular socket is arranged to match a 40-pin DIP footprint, which is particularly convenient for use with an 8-bit microprocessor or microcontroller. However, of course, other standard pinout definitions can be used instead.

In the plan view shown, a small circuit board 507 is visible through openings in the module's top surface 505. Wiring traces on the circuit board 507 are routed so that a glob of solder can easily bridge any one of the solder-option-terminal pairs 501A/501B.

In the embodiment shown, a solder-option-terminal pair 501A/501B has been provided for each of the pin holes 503, except pins 20 and 40. The pin numbers are indicated for pins 1–6, to show the corresponding assignments of solder-option-terminal pairs 501A/501B with pin holes 503.

In this embodiment, the base of the socket module holds a lithium-cell battery and an integrated circuit which has a one-wire interface. (For example, in the preferred embodiment the integrated circuit is as shown in FIG. 4.) All of the terminals 501B are connected to the one-wire-bus terminal of this integrated circuit.

Power-On-Reset Circuit

Figures 4, 4B, 5, 6:
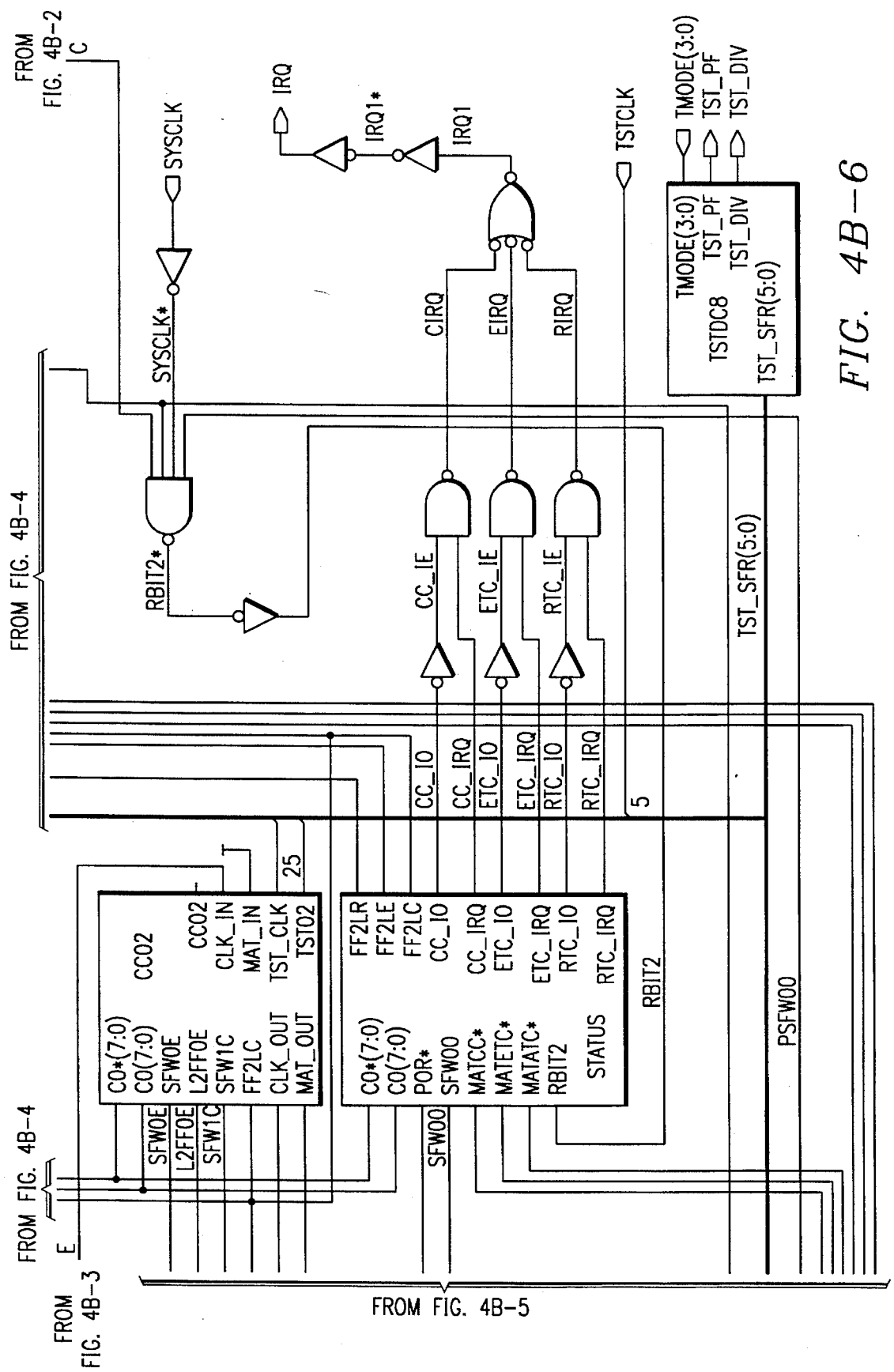
Figures 1, 4C:
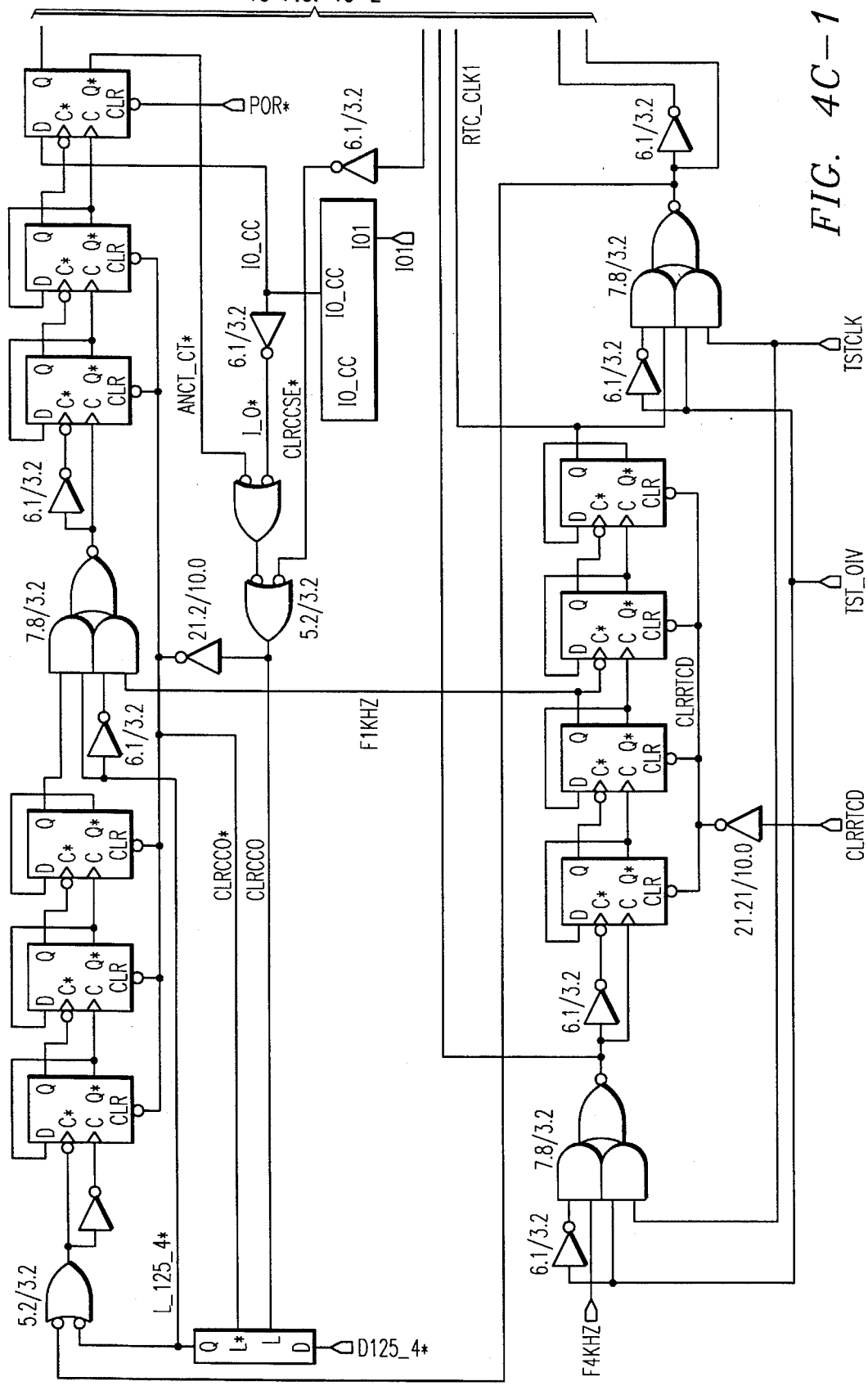
FIG. 4C shows the divider block DIV, which was referred to in FIG. 4.
Figures 2, 4C:
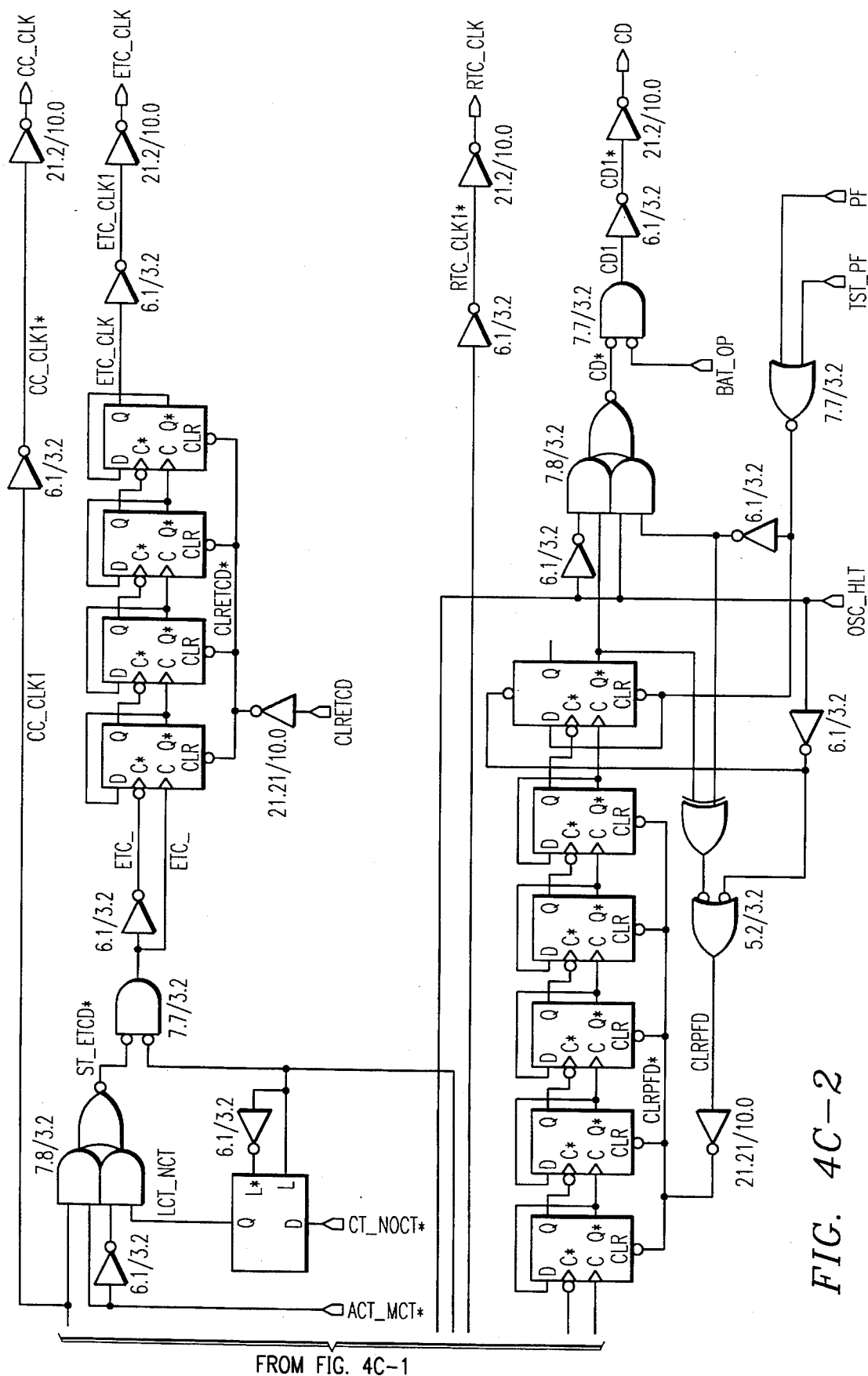
Figure 5:
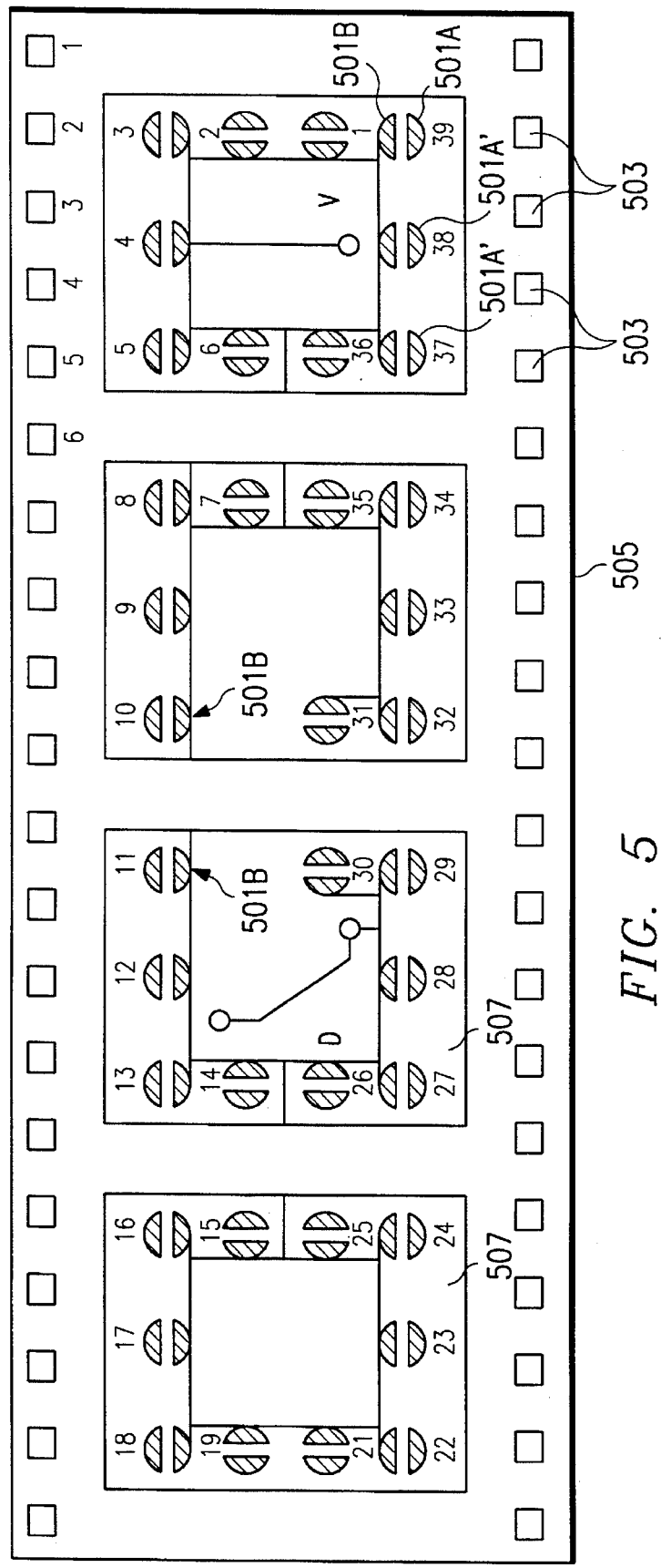
Figure 6A:
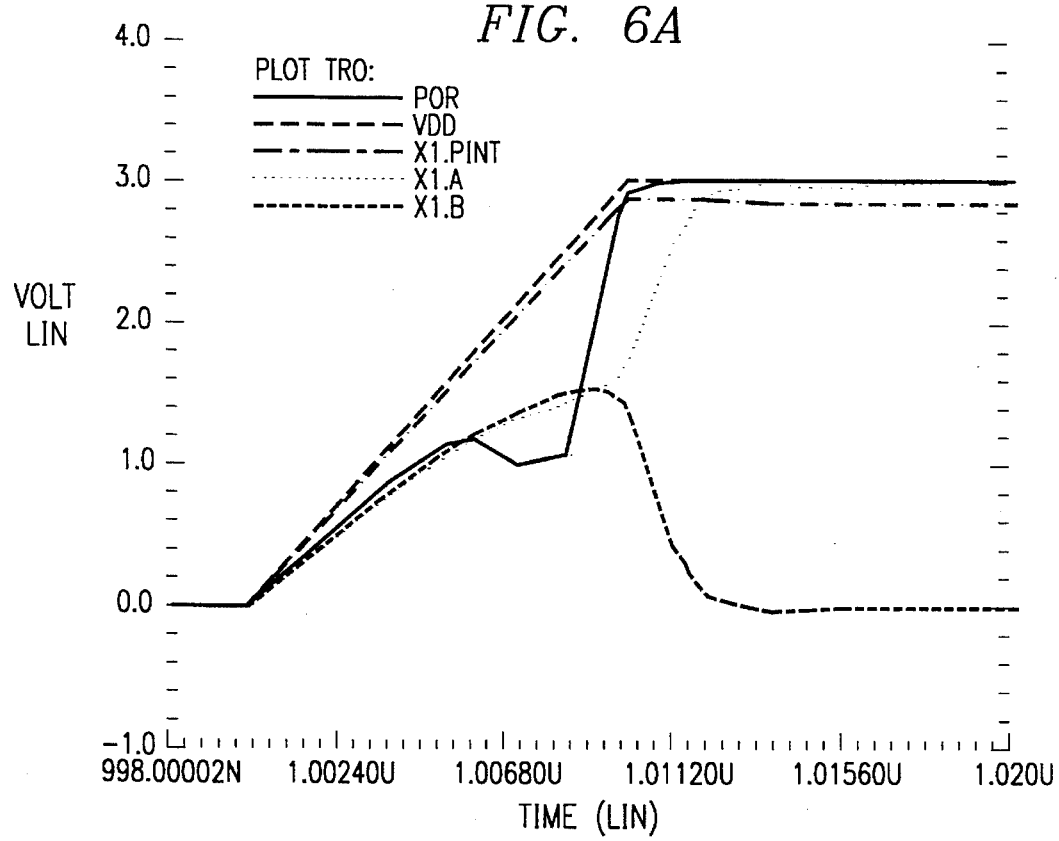

FIG. 4A6 shows the innovative power-on-reset circuit of the chip which is used in the preferred embodiment, and FIGS. 6A–6D show a detailed simulation of the timing of voltages appearing at various nodes in the power-on-reset circuit of FIG. 4A6. And FIG. 4A6a shows a variation.

Node PINT is pulled up by an integration capacitor to VDD2, and pulled down by a weak NMOS pull-down to ground. The capacitor, in the preferred embodiment, is a MOS capacitor of 40 microns square. The pull-down at node PINT, in the preferred embodiment, has a nominal width of 5 microns and a nominal length of 200 microns.

Node PINT, followed by an inverter chain, provides an initial pulse-generating circuit. This circuit element produces a pulse, as desired, when power is first applied. However, this circuit element will also produce a pulse on nodes PINT and PINT1 if a transient voltage increase is seen on the power supply line. The pull-down transistor on node PINT will provide an approximate reference voltage, since it will not turn on until node PINT exceeds its threshold voltage. The behavior of the voltage at node PINT is very similar to that of prior art power-on-reset circuits.

FIG. 6A shows the behavior of nodes PINT, VDD2, A, B, and POR2 as the power supply VDD comes up. In this graph (and in FIG. 6B), the right edge of the graph corresponds to a time about 20 nanoseconds after VDD2 begins its rise from zero Volts.

Nodes A and B are driven by a totally symmetric cross-coupled pair of gates. (In the preferred embodiment, these are NAND gates with $W_P/W_N$ sizes of 17.7/10.) Since this circuit is symmetric, the relation of nodes A and B, as power is supplied, will be unknown. Note that the particular divergence of nodes A and B is random and unpredictable. That is, if power is repeatedly reapplied to a given circuit, sometimes node A will go high, and sometimes node B will. Moreover, the delay before these nodes begin to diverge may also be somewhat variable. However, due to the cross-coupling of this circuit, it will settle into one of two possible states.

Nodes A and B are each separately connected to drive a respective highly asymmetrical inverter. In the preferred embodiment, the PMOS transistor of each inverter is relatively strong (with a nominal W/L, in the preferred embodiment, of 25/1.2), and the NMOS transistor of each inverter is relatively weak (nominal W/L, in the preferred embodiment, of 5/10). (By contrast, with the device and process parameters used in the preferred embodiment, a normal symmetrical inverter, with a trip point about halfway between VDD and ground, would have a PMOS width only about twice the NMOS width, with both at the minimum length of 1.2 microns.)

These two asymmetrical inverters produce outputs A* and B*. These two nodes A* and B* are each separately fed into a respective blocking gate, together with node PINT1. Again, the relative states of nodes A* and B* are initially unknown; but even after the metastable state resolves, at least one of these nodes will have a state which permits the blocking gate to propagation of the pulse from node PINT1. Until nodes A and B diverge, to produce a definite logic state which is propagated through, these asymmetric inverters provide an output which is dominated by their strong side (the pull-up side, in the preferred embodiment). Thus, in the preferred embodiment, nodes A* and B* will initially follow the power supply voltage up, until one of the nodes A or B goes low enough to switch the following inverter.

Figure 6B:
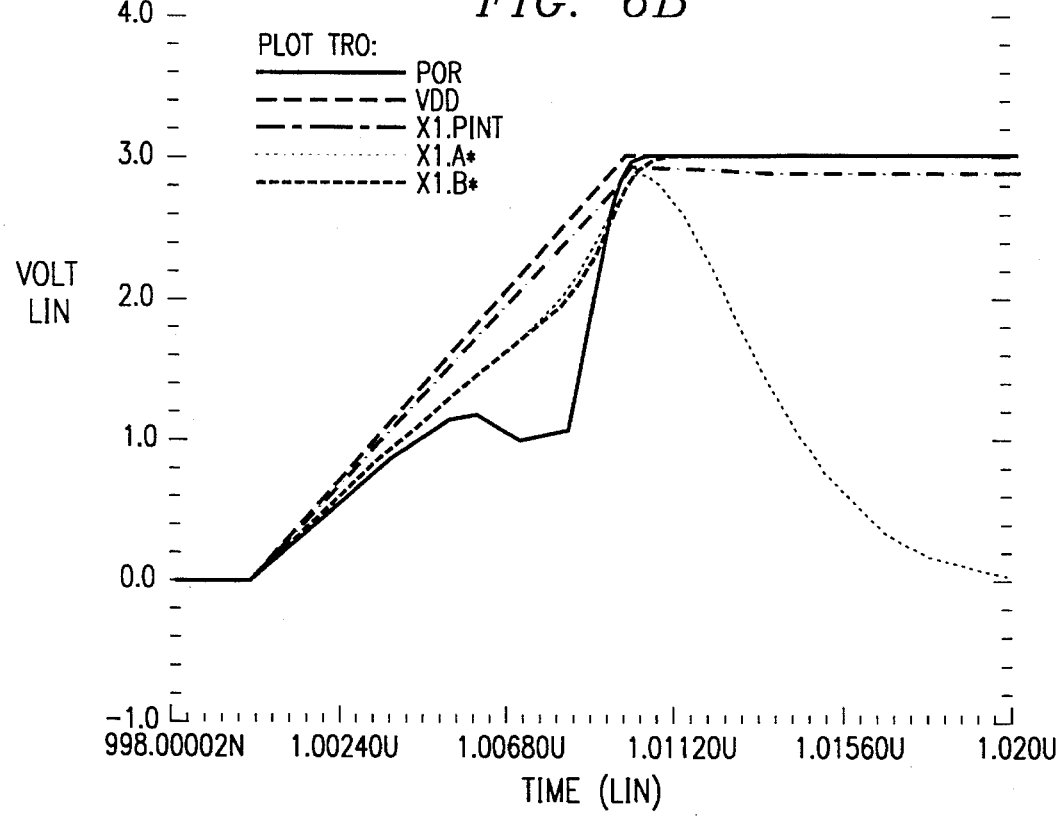

FIG. 6B shows the behavior of nodes PINT, VDD2, A*, B*, and POR2 as the power supply VDD comes up. Note that nodes A* and B* diverge somewhat later than nodes A and B.

The outputs C and D of the blocking gates are propagated into a combining gate which, in the preferred embodiment, is a NOR gate. Thus, if a reset pulse has propagated through either of the blocking gates, to either node C* or to node D*, it will propagate on through the combining gate to nodes POR1 and POR2.

Figure 6C:
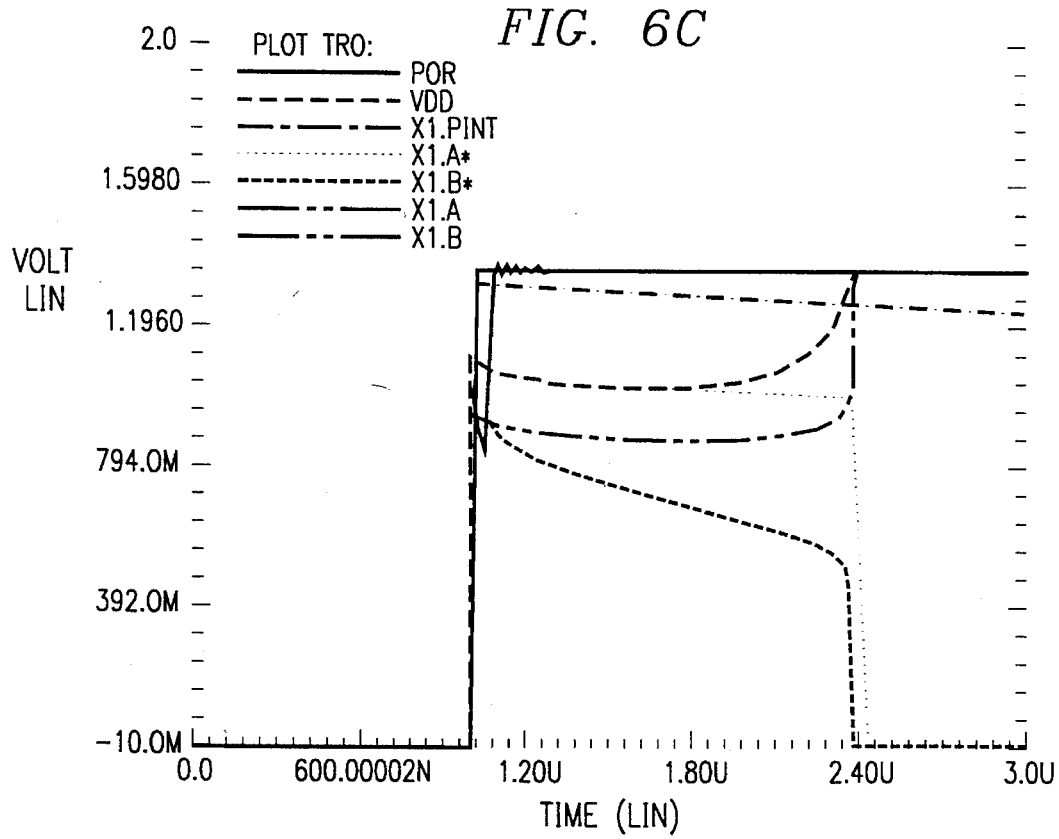

FIG. 6C shows the behavior of nodes PINT, VDD2, A*, B*, and POR2 over a longer period of time. In this graph, the right edge of the graph corresponds to a time about 2000 nanoseconds after VDD2 begins its rise from zero Volts.

Figure 6D:
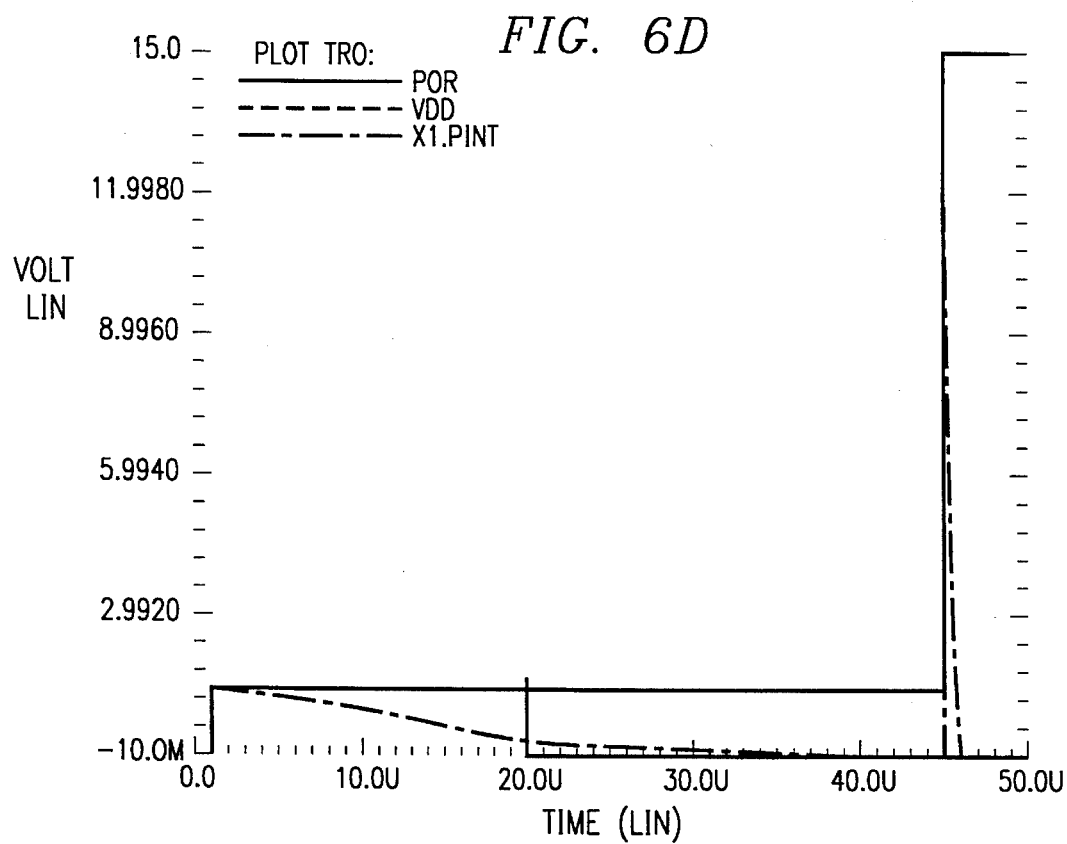

FIG. 6D shows the behavior of nodes VDD2, PINT, and POR2 over a much longer period of time. In this graph (and in FIG. 6B), the right edge of the graph corresponds to a time about 2000 nanoseconds after VDD2 begins its rise from zero Volts. In this graph, the right edge of the graph corresponds to a time about 50,000 nanoseconds (50 μsec) after VDD2 begins its rise from zero Volts.

Node PINT is followed by a strongly asymmetric inverter. This inverter, in the preferred embodiment, has dimensions of 5/10, 25/1.2, which gives it a threshold voltage of about 250 mV. Thus, after VDD has come up, this inverter will switch only if PINT declines to a very low level. When this inverter switches, node PINT1 will be driven low, and nodes C and D will be driven high (regardless of the state of nodes A* and B*). Both inputs C* and D* to the combining gate will therefore be low, and nodes POR1 (and POR2) will be driven high.

When node POR1 goes low, nodes A and B will both be driven high, and nodes A* and b* will be driven low. In this state, the combining gates' outputs C and D are forced high, regardless of the state of node PINT1. Thus, the circuit will now remain in a stable state for as long as the power supply is above the minimum, regardless of any further glitches which may occur.

This operation may be seen in FIG. 6D. The time scale of this Figure is long enough to show the slowly declining voltage of node PINT. When this gets down to about a quarter of a volt, the POR signal goes low and node POR1 goes low. In the example of FIG. 6D, it was assumed that a major power supply glitch occurred thereafter (at time 45 µsec), and this glitch pulled up the voltage of node PINT; but the simulation indicated that even this strong surge did not cause a POR signal to be generated.

It should be noted that the device sizings and ratios given are merely illustrative, and help to show the workings of the preferred embodiment in the fullest possible detail. All of the specific numbers given can be varied, in ways which will be readily apparent to those skilled in the art of integrated circuit design.

Moreover, signal polarities can be changed, logic gate types can be changed, and additional stages added or dropped in the signal propagation paths shown.

Further Details of Circuit Organization

FIG. 4 shows the high-level circuit organization of the chip used in the preferred embodiment. Note that this diagram includes circuit block IO, RAM, SFR, PF, POR, OSC, DIV, and CNTL as follows.

Input/Output: Block IO

FIGS. 4A-1 and 4A-2 shows the circuit organization of circuit block IO, which was referred to in FIG. 4. Note that this Figure itself contains blocks PWRCAP, BATTEST, RTOS, PORTARB, OWPROT, POR2, IOBUF, and OUTBUF.

FIG. 4A1 shows the circuit organization of circuit block PWRCAP, which was referred to in FIGS. 4A-1 and 4A-2. Note that this Figure itself contains six diodes, from each of the three incoming lines RST\, IO, and VCC, to each of the two power-storage capacitors shown. Storage capacitor CAP-VDD2 feeds the power supply line VDD2. Storage capacitor CAP-VDD3 feeds the power supply line VDD3. Connections to the primary on-chip power supply VDD are shown, as is conventional, by an upward lead to a short horizontal line. Connections to capacitor-fed supply VDD2 are shown by an upward lead to two horizontal lines, and connections to capacitor-fed supply VDD3 are shown by an upward lead to three horizontal lines.

FIGS. 4A2-1 through 4A2-6 shows the circuit organization of circuit sub-block RTOS, which was referred to in FIGS. 4A-1 through 4A-2. Note that this Figure itself contains a block labelled TPOSC, which is the actual oscillator. The other circuitry in block RTOS performs oscillator overhead and control functions.

FIG. 4A2a shows the circuit organization of circuit block TPOSC, which was referred to in FIGS. 4A2-1 through 4A2-6. This is a cross-coupled oscillator, which provides additional stability in characteristics. (Such oscillator characteristics are more fully reviewed in U.S. Pat. No. 4,868,525 (DSC-99), which is hereby incorporated by reference.) This oscillator provides the timing for operations over the one-wire bus. The primary clock oscillator is shown as block OSC in FIG. 4.

FIG. 4A3 shows the circuit organization of circuit block BATTEST, which was referred to in FIGS. 4A-1 and 4A-2. This circuit detects battery failure. Note that the circuitry shown crosses a power domain boundary: the portion on the left is powered by VDD, and the portion on the fight is powered by VDD2. Thus a level-translator circuit block LVLT__CS is used twice. This block is described below in detail.

Circuit block PORTARB, which was referred to in FIGS. 4A-1 and 4A-2, simply contains the circuitry for arbitration between the one-wire and three-wire ports. This arbitration circuitry normally gives the three-wire port priority over the one-wire port, but this priority can be reversed by a simple Fuse programmation.

FIGS. 4A4-1 and 4A-2 shows the circuit organization of circuit block OWPROT, which was referred to in FIG. 4A-1 and 4A-2. Note that this Figure itself contains sub-block OWCMD (which performs decoding in accordance with the one-wire protocol detailed below, and ROM memory ROM64, which contains laser-programmable fuses encoding the unique ID of each particular chip.

FIG. 4A5 shows the circuit organization of circuit block IOBUF, which was referred to in FIGS. 4A-1 and 4A-2. Note that this circuit falls across three power supply domains, and level translators of two types (detailed below) are used. An incoming signal on line IO is received by gates in power domain VDD3, and the corresponding output on line OUT is powered by supply VDD2.

FIG. 4A6 shows the circuit organization of circuit block POR2, which was referred to in FIG. 4A-1 and 4A-2. This Figure shows details of the preferred implementation of the innovative power-on-reset circuit which is used in the chip of the preferred embodiment. Various nodes of this circuit diagram are labelled to correspond to the voltage traces analyzed in detail below.

Circuit block OUTBUF, which was referred to in FIGS. 4A-1 and 4A-2, is a simple gated latch.

FIG. 4A7 shows the circuit organization of level-translator circuit block LVLT__CS, which is referred to in FIGS. 4A-1 and 4A-2 and elsewhere. This circuit is used to carry a signal across a power-domain boundary with a clear/set capability.

FIG. 4A8 shows the circuit organization of level-translator circuit block LVLT__IE, which is referred to in FIGS. 4A-1 and 4A-2 and elsewhere. This circuit is used to carry a signal across a power-domain boundary, where the equilibrate signal is at the same level as the supply level on the input side of the translator.

FIG. 4A9 shows the circuit organization of level-translator circuit block LVLT__OE, which is referred to in FIGS. 4A-1 and 4A-2 and elsewhere. This circuit is used to carry a signal across a power-domain boundary, where the equilibrate signal is at the same level as the supply level on the output side of the translator.

FIG. 4A10 shows the circuit organization of level-translator circuit block LVLT__IS, which is referred to in FIGS. 4A-1 and 4A-2 and elsewhere. This circuit is used to carry a signal across a power-domain boundary and employs a one-shot architecture so that no clear and set is required. In particular, the logic to the left of the vertical broken line is one power supply domain which has power supplied from one source and the logic to the right of the broken line is a second power supply domain has a second power source.

The level translator of FIG. 4A10 operates as follows. First consider a steady low at the input IN. Inverter 451 will then drive NOR gate 461 low, and inverters 455–457 will drive exclusive OR (XOR) gate 463 high. Thus n-channel FET 471 will be turned on and n-channel FET 472 turned off; this will put memory cell 481 into the state which outputs a high to inverter 482 and a low at OUT. (Similarly, when the input at IN is a steady high, inverters 455–457 still drive XOR gate 463 high which, despite inverter 451 now low, drives NOR gate 461 low, and memory cell 481 still outputs a high to inverter 482 and a low at OUT.) Now when the input at IN makes a transition from low to high, the input to XOR gate 463 from inverter 453 switches from high to low before the input from inverter 457 switches from low to high. In fact, the input from inverter 457 switches from low to high only after the propagation delay due to inverters 455–457. Thus XOR gate 463 switches from high to low and then back to high with the low-going pulse of duration equal to the propagation delay of the inverters 455–457. That is, XOR gate 463 plus inverters 455–457 form a one-shot. Now while XOR is low, NOR gate 461 is high due to inverter 451 also being low. Thus FET 471 is turned off and FET 472 turned on, and this makes memory cell 481 switch state and FET 472 concurrently pulls down the input of inverter 482 so OUT rapidly goes high. But once XOR returns high, this drives NOR gate 461 low and FETs 471–472 switch back to 471 turned on and 472 turned off. Then memory cell 481 switches back to its first state and OUT goes low; however, the switching delay of memory cell 481 makes the high pulse at OUT last a little longer than the low-going pulse width of the one-shot. Lastly, high impedance n-channel FET 477 prevents the gate of 472 from floating when NOR gate 461 is not powered.

FIG. 4A11 simulates this pulse generation at OUT with a 5 volt power supply for the lefthand portion of FIG. 4A10 and a 4 volt power supply for the righthand portion. Note that an IN input falling from high to low does not generate an output pulse because NOR gate 461 will remain low during the low-going one-shot pulse, and memory cell 481 will retain its state because FET 472 will remain off. See FIG. 4A12.

FIG. 4A13–4A16 show an input transition from low to high and the resulting output pulse for various power supply voltages for the two power supply domains.

Note that the level translators of FIGS. 4A7–9 just set the memory cell so that OUT tracks IN, rather than generating a pulse at OUT from a rising edge at IN. Indeed, FIGS. 4A7–9 show level translators which generate (with the control signals IS, IC, inactive . . .) a high going pulse to set the memory low from a rising edge input at I and a high going pulse to reset the memory cell from a falling edge input at I. For a steady high or low input at I, the one-shot is not active and two lows are fed to the set and reset pulldown n-channel FETs of the memory cell, so the memory cell remains unchanged.

Memory: Block RAM

The circuit block RAM, which was referred to in FIG. 4, is entirely conventional. This block contains a low-power SRAM array, with associated conventional decoding, timing, and buffer logic. As shown above in FIG. 3, the counter array and RAM array are in fact physically integrated; but, in the circuit organization of FIG. 4, the counter circuitry is included in the block "SFR" and not in the block "RAM." (Note that the top-level circuit diagram of FIG. 4 shows some column lines running between block SFR and block RAM.)

Special Function Registers: Block SFR

FIGS. 4B-1 through 4B-6 shows the special function register block SFR, which was referred to in FIG. 4. This block contains the three counter chains, with associated logic for accessing them. Note that this Figure contains sub-blocks SFDECODE, TSTOCB, XFER, MATCH, RTC00-04, ETC00-04, CC00-03, and CONTROL.

FIG. 4B1 shows the circuit organization of block XFER which is referred to in FIGS. 4B-1 through 4B-6. This circuitry receives a read-enable signal READRM, and the three clock signals RTC_CLK (for the real-time clock), ETC_CLK (for the elapsed-time clock), and CC_CLK (for the cycle counter). When an attempted user read occurs, the circuitry shown drives the appropriate FF2L line (FF2LR, FF2LE, or FF2LC) high, as long as the corresponding tipple-done line (RTC_RD, ETC_RD, or CC_RD) has already gone high. (The FF2L is used to transfer the most current data into the user-accessible latches, as described elsewhere herein.)

FIG. 4B2 shows the circuit organization of block MATCH, which was referred to in FIGS. 4B-1 through 4B-6. This block detects the occurrence of an alarm condition in any of the counters.

Circuit block SFDECODE, which was referred to in FIGS. 4B-1 through 4B-6, merely contains straightforward decode logic.

Circuit block TSTDC0, which was referred to in FIGS. 4B-1 through 4B-6, is connected to decode a 4-bit test mode command TMODE, and accordingly to drive of the lines TST_SFR0-4, TST_PF, and/or TST·DIV.

Circuit block STATUS, which was referred to in FIGS. 4B-1 through 4B-6, is simply a collection of 8 latches (3 of them resettable).

FIG. 4B3-1 through 4B3-3 shows the circuit organization of block CONTROL, which was referred to in FIG. 4 through 4B-6. In addition to performing routine control functions, note that this circuitry generates a signal LOCK when a match occurs within any of the three counters.

Circuit blocks RTC00-04, ETC00-04, and CC00-03 are simply the three counter chains. FIG. 4B4 shows the actual detailed implementation of one bit of these counter chains. The lines MRTC are chained together to provide a match-detect signal MAT_OUT.

Power Fail Detection: Block PF

Circuit block PF, which was referred to in FIG. 4, simply compares the backup battery voltage VBATB against the system supply voltage VCC, and accordingly generates a power-fail warning signal PF, which is received by circuit block DIV.

Power on Reset: Block POR

Circuit block POR, which was referred to in FIG. 4, is identical to circuit block POR2 shown in FIG. 4A6, except that block POR is connected to VDD rather than to VDD2. This block generates an on-chip reset signal POR, which is routed to the other circuit blocks.

Oscillator: Block OSC

Circuit block OSC, which was referred to in FIG. 4, includes a crystal-controlled oscillator. In the preferred embodiment, this is essentially the same as that described in U.S. Pat. No. 4,871,982, which is hereby incorporated by reference. Block OSC also divides down the 32.768 KHz oscillation frequency to a 4.096 KHz square wave (F4KHZ) in FIG. 4 which feeds divider block DIV. The oscillator runs continuously.

Divider: Block DIV

Circuit block DIV, which was referred to in FIG. 4, divides down the output of the oscillator block OSC, to produce the real-time-clock increment pulses RTC_CLK at 256 Hz. This block also produces elapsed-time-clock pulses ETC_CLK conditionally, and cycle-counter pulses CC_CLK when transitions are detected (as described elsewhere herein), and handles oscillator-halt commands. FIG. 4C illustrates block DIV and shows node F4 KHZ (lefthand edge) for receiving the 4.096 KHz oscillator block OSC output. The 4.096 KHz square wave drives counter DIVRTC which divides it down to 256 Hz and outputs this at RTC_CLK to run the real time clock (RTC). The TST_DIV input provides multiplexing to permit a testclock signal at TSTCLK to be used instead of the oscillator output.

Similarly, counter DIVETC divides down the 4.096 KHz from block OSC to 256 Hz and outputs this at node ETCCLK to run the elapsed time counter (OTC); however, NOR gate 410 blocks the 4.096 KHz to DIVETC essentially when voltage on the one-wire bus is below a threshold. In particular, the one-wire bus connects to input node IO1 in FIG. 4C. Node IO1 drives low current buffer IO_CC to sharpen up slowly varying voltage levels (described in the following paragraphs), and the buffer output feeds the D input of flip-flop IOFF. Flip-flop IOFF is clocked at either 8 Hz or 256 Hz (multiplexer 420 driven by D125_4*) and thus switches, with small delay, high when the one-wire bus voltage rises above a threshold and switches, with small delay, low when the bus voltage falls below a threshold. This flip-flop output, through inverting multiplexer 430 (ACT_MCT* selects), drives an input of NOR gate 410. Hence, when flip-flop IOFF is low, the 4.096 KHz clock is blocked from divider DIVETC. Note that the output of flip-flop IOFF also appears at node CC_CLK to drive the power cycle counter to keep track of the number of times the one-wire bus power cycles up and down.

FIGS. 4C 1 shows a known CMOS buffer with hysteresis which could be used as buffer IO_CC; however, the current draw and power dissipation of this buffer can be too large for battery powered circuitry when the input is slowly varying. In particular, FIGS. 4C2 simulates an input which ramps up from 0 volts to 5 volts over a 10 second interval and then ramps down back to 0 volts during the next 10 seconds. The output switches from 0 to 3 volts (the battery supply) when the input rises to 1.7 volts, and the output falls back to 0 when the input falls to 1.5 volts. FIGS. 4C3–4C4 provide more detail of the current draw for a rising input voltage: FIG. 4C3 simulates the output voltage as a function of the input voltage, and FIG. 4C4 simulates the corresponding current draw from the battery also as a function of the input voltage. The peak current draw is roughly $3 \times 10^{-5}$ amps when the two input p-channel FETs having a gate width-to-length ratio of about 8 and the n-channel FETs have a ratio of about one third that of the p-channel FETs. The current draw for the input falling is analogous.

In contrast, FIG. 4C5 shows the CMOS buffer of block IO_CC. This buffer also has a transfer curve like that of FIG. 4C2 which sharpens the input but draws little current compared to the buffer of FIG. 4C1. Explicitly, FIG. 4C6 simulates the output voltage as a function of the input voltage (almost identical to FIG. 4C3) and FIG. 4C7 simulates the corresponding current draw from the battery also as a function of the input voltage. The peak current increase is about $6 \times 10^{-9}$ amps for the two input p-channel FETs having a gate width-to-length ratio of about 0.16 and the n-channel FETs again with a ratio about one third that of the p-channel FETs. Thus the buffer of FIG. 4C5 would draw only about 1% of the current of the buffer of FIG. 4C1 if the FETs had equivalent gate width-to-length ratios.

The buffer of FIG. 4C5 operates as follows. First, the power supply is taken to be about 3 volts, and the n-channel FETs have threshold voltages of about 1.0 volt and the p-channel FETs have a threshold of about −1.0 volt. Input p-channel FETs 401–402 have a gate width-to-length ratio of about 0.16 and n-channel FETs 411–412 have a ratio of about 0.055 so that all of these FETs have about the same on resistance. The hysteresis feedback FETs 403 and 413 have the same ratios as FETs 401–402 and 411–412, respectively. P-channel FETs 404, 405, and 406 have ratios about 1/40, 1/50, and 1/60 of p-channel FETs 401–402 and effectively provide resistors due to the grounding of their gates; similarly, n-channel FETs 414, 415, and 416 have ratios about 1/40, 1/50, and 1/60 of n-channel FETs 411–412, respectively and likewise provide resistors due to the connection of their gates to the power supply. Inverters 421, 422, and 423 have FETs with ratios equal to, double, and quadruple, respectively, those of corresponding FETs 401–402 and 411–412.

Now the current drawn by a CMOS inverter when switching normally goes to charging or discharging the load capacitance; however, in the case of a very slowly changing input, the direct short-to-ground current when the p-channel and n-channel FETs are roughly equiconductive will dominate. That is, the voltage at the output node has time to fall (load capacitance discharging) to roughly Vdd/2 while the input remains in the vicinity of the equiconductive input, and then the direct short-to-ground current flows limited only by the channel resistivity of the p-channel and n-channel FETs. For the buffers of FIGS. 4C1 and 4C5, the p-channel and n-channel FETs are equiconductive at an input of about Vdd/2. Thus when the input at IO in FIG. 4C5 is rising from 0 to 1.5 volts (Vdd/2), FETs 401–402 are turned on, output node IO* is at 3 volts, and FETs 411–412 begin turning on. Once FETs 411–412 begin conducting, the capacitance at node IO* (the input capacitance of inverter 421) begins discharging through FETs 411–412 so the voltage on node IO* falls and current begins to flow through FETs 401–402. Now this current flow implies voltage drops in FETs 404–406 and 414–416 which decrease the magnitudes of the drain-to-source and gate-to-source voltages of FETs 401–402 and 411–412. This limits the current to roughly 1% of the current flow which would occur without FETs 404–406 and 414–416 because the gate width-to-length ratios of the series combinations is about 100 times smaller for FETs 404–406 and 414–416 than for FETs 401–402 and 411–412. However, node IO* still discharges sufficiently quickly because the current flow through FETs 401–402 and 404–406 depends upon the voltage at node IO* falling; that is, the direct short-to-ground current requires output node IO* to have fallen to something on the order of Vdd/2. FIGS. 4C4 and 4C7 show that for both buffers relatively significant current begins flowing when the input reaches about 1.2 volts and the current linearly increases until the input reaches about 1.7 volts at which time the pulldown by the hysteresis feedback p-channel FET (403 in FIG. 4C5) turns off the lower p-channel FET (402 in FIG. 4C5) to stop the current and output node IO* quickly falls low.

The voltage drops in FETs 404–406 and 414–416 also drop the voltage powering inverters 421–422–423 with the inverter 421 having the greatest decrease and inverter 423 the least. In effect, an input at node IO drives a chain of four inverters (401–402 plus 411–412 forms the first inverter) with the inverters having increasing applied voltages. And because the inverter chain inverters have successively smaller series resistors (FETs 404–406 and 414–416), they have successively increasing current limits. However, the switching time of the inverters successively decreases because each inverter sharpens (in time) its input signal's rise or fall; and this means that the larger limited current flows for a shorter time and primarily charges or discharges a load capacitance. In other words, the voltage at node IO* falls faster than the input voltage at node IO rises, despite the limiting of the current in the first inverter. Similarly, inverter 421 makes the voltage at node IO1 rise faster than its input at node IO* falls, inverter 422 speeds up node IO1* relative to node IO1, and inverter 423 has node 102 switching faster than node IO1*. Thus by the time the input transition at node IO reaches node IO2, the transition is rapid and inverter 424 may use full Vdd power without any current limitations.

In short, the preferred embodiment buffer of FIG. 4C5 uses current limitation to conserve battery power which otherwise would be dissipated during slowly varying inputs, and compensates for the expected slower transitions of limited current by using successively higher current (and thus faster) inverters.

Of course, variations of the circuit of FIG. 4C5 may retain the same power dissipation limiting properties. For example, a single resistive p-channel FET or many could replace FETs 404–406, a single resistive n-channel FET or many could replace FETs 414–416, the number of voltage limited inverters (421–423 in FIG. 4C5) could be increased or decreased with different inverters possibly having a common p-channel FET or n-channel FET source connections, the hysteresis feedback could be eliminated, the resistive FETs could be asymmetrical in that only p-channels or only n-channels are used or p-channels with much greater resistance or n-channels with much greater resistance are used, polysilicon or substrate resistors could replace one or more of the resistive FETs, the gate width-to-length ratios could be varied provided the resistive FETs have at least an order of magnitude smaller ratio, and so forth.

Control: Block CNTL

Circuit block CNTL, which was referred to in FIG. 4, contains a large amount of miscellaneous logic of no particular interest. This logic is simply straightforward implementations of the various functions described herein.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

It should also be noted that the disclosed innovations can easily be adapted to other integrated circuit architectures which include additional functions in addition to timekeeping.

It should also be noted that the disclosed integrated circuit architecture, while particularly advantageous for clocks and other elapsed-time circuits, can also be applied to integrated circuits of other types.

It should also be noted that the claimed innovations are not by any means limited to the specific bus protocol described. While the protocol of the preferred embodiment does appear (as of the effective filing date of this application) to have substantial advantages over alternative protocols, it may be anticipated that further developments and improvements in bus protocols will continue. Thus, many of the disclosed inventions can be used with other serial protocols, or with non-serial bus interfaces.

The present application contains several novel teachings which all help to provide reliable communications, over a low-data-rate noisy data channel, without risk of data corruption. These teachings are believed to combine synergistically (as in the preferred embodiment); but it is also possible to use some but not all of these teachings and still obtain advantages.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A low power input buffer, comprising:
   (a) an input node, an output node, a power supply node, and a ground node, said power supply node adapted to be electrically coupled to a power supply selected from the group consisting of a battery-powered power supply or a signal powered power supply;
   (b) a first inverter having a signal input and an output and a second inverter having a signal input and an output, the signal input of said first inverter electrically coupled to said input node, the output of said first inverter electrically coupled to the signal input of said second inverter, and the output of second inverter electrically coupled to said output node;
   (c) said first inverter with power input electrically coupled through a first resistor to said power supply node; and
   (d) said second inverter with power input electrically coupled to said power supply node.

2. The buffer of claim 1, wherein:
   (a) said first resistor comprises a p-channel field effect transistor with a gate electrically coupled to said ground node.

3. The buffer of claim 1, wherein:
   (a) said first inverter comprises a first p-channel field effect transistor having a gate, drain, and source and a first n-channel field effect transistor having a gate and a drain, said gate of said first p-channel field effect transistor electrically coupled to said first inverter signal input and said drain of said first p-channel field effect transistor electrically coupled to the drain of said first n-channel field effect transistor, the gate of said first n-channel field effect transistor electrically coupled to said first inverter signal input, and said first resistor electrically coupling the source of said first p-channel field effect transistor to said power supply node.

4. The buffer of claim 3, further comprising:
(a) said first n-channel field effect transistor having a source; and
(b) a second resistor electrically coupling the source of said first n-channel field effect transistor to said ground node.

5. The buffer of claim 4, wherein:
(a) said first inverter comprises (i) a second p-channel field effect transistor having a gate, drain, and source, said gate of said second p-channel field effect transistor electrically coupled to said first inverter signal input, said source of said second p-channel field effect transistor electrically coupled to said drain of said first p-channel field effect transistor, said drain of said second p-channel field effect transistor electrically coupled to the output of said first inverter and to the drain of a second n-channel field effect transistor, said second n-channel field effect transistor with gate electrically coupled to said first inverter signal input and with source electrically coupled to said drain of said first n-channel field effect transistor, (ii) a third p-channel field effect transistor having a drain, source, and gate, said gate of said third p-channel field effect transistor electrically coupled to said first inverter output, with source of said third p-channel field effect transistor electrically coupled to said first p-channel field effect transistor source, and with drain of said third p-channel field effect transistor electrically coupled to said source of said first n-channel field effect transistor, and (iii) a third n-channel field effect transistor having a gate, source, and drain, said gate of said third n-channel field effect transistor electrically coupled to said first inverter output, with source of said third n-channel field effect transistor electrically coupled to said source of said first n-channel field effect transistor, and said drain of said third n-channel field effect transistor electrically coupled to said source of said first p-channel field effect transistor, whereby said first inverter has input hysteresis circuit electrically coupled between said signal input and said output.

6. The buffer of claim 5, further comprising:
(a) a third inverter having a signal input and an output, said third inverter electrically coupled between said first and second inverters with signal input electrically coupled to said output of said first inverter and with output electrically coupled to said signal input of said second inverter, said third inverter with power input electrically coupled through said first resistor to said power supply node and with ground input electrically coupled to said second resistor.

7. The buffer of claim 6, further comprising:
(a) a fourth inverter having a signal input and an output, said fourth inverter electrically coupled between said first and third inverters with signal input electrically coupled to said output of said first inverter and with output electrically coupled to said signal input of said third inverter, said fourth inverter with power input electrically coupled to a tap on said first resistor and with ground input electrically coupled to a tap on said second resistor.

8. The buffer of claim 7, wherein:
(a) said first resistor comprises first and second p-channel resistive field effect transistors, each of said first and second p-channel resistive field effect transistors having a gate, source, and drain, said gate of said first p-channel resistive field effect transistor electrically coupled to said ground node, said source of said first p-channel resistive field effect transistor electrically coupled to said power supply node and said drain of said first p-channel resistive field effect transistor electrically coupled to the source of said second p-channel resistive field effect transistor, said gate of said second p-channel resistive field effect transistor electrically coupled to said ground node and said drain electrically coupled to said source of said first p-channel field effect transistor, said tap on said first resistor is said drain of said first p-channel resistive field effect transistor.

9. The buffer of claim 7, wherein:
(a) said second resistor includes first and second n-channel resistive field effect transistors, each of which has a corresponding gate, source, and drain, said gate of said first n-channel resistive field effect transistor electrically coupled to said power supply node, said source of said first n-channel resistive field effect transistor electrically coupled to said ground node and said drain of said first n-channel resistive field effect transistor electrically coupled to the source of said second n-channel resistive field effect transistor, said gate of second n-channel resistive field effect transistor electrically coupled to said power supply node and said drain of said second n-channel resistive field effect transistor electrically coupled to said source of said first n-channel field effect transistor, said tap on said second resistor is said drain of said first n-channel resistive field effect transistor.

10. The low power input buffer of claim 1, wherein a diode is electrically coupled between said power supply and said power supply node.

11. The low power input buffer of claim 1, wherein said first inverter is a CMOS inverter and said second inverter is a CMOS inverter.

12. An integrated circuit, comprising:
(a) a first plurality of field effect transistors (FETs) powered by a first power supply;
(b) a second plurality of FETs powered by a second power supply;
(c) a level translator coupling signals from said first plurality to said second plurality, said level translator including FETs from said second plurality which form a memory cell and FETs from said first plurality which form a one-shot which sets said memory cell.

13. The integrated circuit of claim 12, wherein:
(a) said level translator generates a high going pulse on a first line to said memory from a rising edge input.

14. The integrated circuit of claim 13, wherein:
(a) said level translator generates a high going pulse on a second line to said memory from a falling edge input.

15. The integrated circuit of claim 12, further comprising an alternate power supply electrically coupled to at least one of said first and second power supplies.

16. The integrated circuit of claim 15, further wherein said alternate power supply is a parasitic, signal powered power supply.

17. A low power input buffer, comprising:
(a) an input node, an output node, a power supply node, and a ground node;
(b) a first inverter having a signal input and an output and a second inverter having a signal input and an output, the signal input of said first inverter electrically coupled to said input node, the output of said first inverter electrically coupled to the signal input of said second inverter, and the output of second inverter electrically coupled to said output node;

(c) said first inverter with power input electrically coupled through a first resistor to said power supply node, said first resistor comprising a p-channel field effect transistor with a gate electrically coupled to said ground node;

(d) said second inverter with power input electrically coupled to said power supply node;

(e) said first inverter comprises a first p-channel field effect transistor having a gate, drain, and source and a first n-channel field effect transistor having a gate and a drain, said gate of said first p-channel field effect transistor electrically coupled to said first inverter signal input and said drain of said first p-channel field effect transistor electrically coupled to the drain of said first n-channel field effect transistor, the gate of said first n-channel field effect transistor electrically coupled to said first inverter signal input, and said first resistor electrically coupling the source of said first p-channel field effect transistor to said power supply node;

(f) said first n-channel field effect transistor having a source; and (g) a second resistor electrically coupling the source of said first n-channel field effect transistor to said ground node.

18. The low power input buffer of claim 17, wherein:
(a) said first inverter comprises
  (i) a second p-channel field effect transistor having a gate, drain, and source, said gate of said second p-channel field effect transistor electrically coupled to said first inverter signal input, said source of said second p-channel field effect transistor electrically coupled to said drain of said first p-channel field effect transistor, said drain of said second p-channel field effect transistor electrically coupled to the output of said first inverter and to the drain of a second n-channel field effect transistor, said second n-channel field effect transistor with gate electrically coupled to said first inverter signal input and with source electrically coupled to said drain of said first n-channel field effect transistor,
  (ii) a third p-channel field effect transistor having a drain, source, and gate, said gate of said third p-channel field effect transistor electrically coupled to said first inverter output, with source of said third p-channel field effect transistor electrically coupled to said first p-channel field effect transistor source, and with drain of said third p-channel field effect transistor electrically coupled to said source of said first n-channel field effect transistor, and
  (iii) a third n-channel field effect transistor having a gate, source, and drain, said gate of said third n-channel field effect transistor electrically coupled to said first inverter output, with source of said third n-channel field effect transistor electrically coupled to said source of said first n-channel field effect transistor, and said drain of said third n-channel field effect transistor electrically coupled to said source of said first p-channel field effect transistor, whereby said first inverter has input hysteresis circuit electrically coupled between said signal input and said output.

19. The low power input buffer of claim 12, further comprising:

(a) a third inverter having a signal input and an output, said third inverter electrically coupled between said first and second inverters with signal input electrically coupled to said output of said first inverter and with output electrically coupled to said signal input of said second inverter, said third inverter with power input electrically coupled through said first resistor to said power supply node and with ground input electrically coupled to said second resistor.

20. The low power input buffer of claim 19, further comprising:

(a) a fourth inverter having a signal input and an output, said fourth inverter electrically coupled between said first and third inverters with signal input electrically coupled to said output of said first inverter and with output electrically coupled to said signal input of said third inverter, said fourth inverter with power input electrically coupled to a tap on said first resistor and with ground input electrically coupled to a tap on said second resistor.

21. The low power input buffer of claim 20, wherein (a) said first resistor comprises first and second p-channel resistive field effect transistors, each of said first and second p-channel resistive field effect transistor having a gate, source, and drain, said gate of said first p-channel resistive field effect transistor electrically coupled to said ground node, said source of said first p-channel resistive field effect transistor electrically coupled to said power supply node and said drain of said first p-channel resistive field effect transistor electrically coupled to the source of said second p-channel resistive field effect transistor, said gate of said second p-channel resistive field effect transistor electrically coupled to said ground node and said drain electrically coupled to said source of said first p-channel field effect transistor, said tap on said first resistor is said drain of said first p-channel resistive field effect transistor.

22. The low power input buffer of claim 20, wherein:

(a) said second resistor includes first and second n-channel resistive field effect transistors, each of which has a corresponding gate, source, and drain, said gate of said first n-channel resistive field effect transistor electrically coupled to said power supply node, said source of said first n-channel resistive field effect transistor electrically coupled to said ground node and said drain of said first n-channel resistive field effect transistor electrically coupled to the source of said second n-channel resistive field effect transistor, said gate of second n-channel resistive field effect transistor electrically coupled to said power supply node and said drain of said second n-channel resistive field effect transistor electrically coupled to said source of said first n-channel field effect transistor, said tap on said second resistor is said drain of said first n-channel resistive field effect transistor.

23. The low power input buffer of claim 17, further comprising an alternate power supply adapted to be electrically coupled to said power supply node.

24. The low power input buffer of claim 23, wherein said alternate power supply is a parasitic, signal powered power supply.

25. The low power input buffer of claim 24, wherein a diode is electrically coupled between said parasitic, signal powered power supply and said power supply node.

26. The low power input buffer of claim 17, further comprising an alternate power supply electrically coupled to said power supply node.

27. The low power input buffer of claim 26, wherein said alternate power supply is a parasitic, signal powered power supply.

28. The low power input buffer of claim 27, wherein a diode is electrically coupled between said parasitic, signal powered power supply and said power supply node.

29. The low power input buffer of claim 17, wherein said first inverter is a CMOS inverter and said second inverter is a CMOS inverter.

30. A low power input buffer, comprising:
   (a) an input node, an output node, a power supply node, and a ground node, said power supply node adapted to be electrically coupled to a power supply;
   (b) a first inverter having a signal input and an output and a second inverter having a signal input and an output, the signal input of said first inverter electrically coupled to said input node, the output of said first inverter electrically coupled to the signal input of said second inverter, and the output of second inverter electrically coupled to said output nodes
   (c) said first inverter with power input electrically coupled through a first resistor to said power supply node;
   (d) said second inverter with power input electrically coupled to said power supply nodes and
   (e) a diode is electrically coupled between said power supply and said power supply node.

31. The low power input buffer of claim 30, wherein:
   (a) said first resistor comprises a p-channel field effect transistor with a gate electrically coupled to said ground node.

32. The low power input buffer of claim 30, wherein:
   (a) said first inverter comprises a first p-channel field effect transistor having a gate, drain, and source and a first n-channel field effect transistor having a gate and a drain, said gate of said first p-channel field effect transistor electrically coupled to said first inverter signal input and said drain of said first p-channel field effect transistor electrically coupled to the drain of said first n-channel field effect transistor, the gate of said first n-channel field effect transistor electrically coupled to said first inverter signal input, and said first resistor electrically coupling the source of said first p-channel field effect transistor to said power supply node.

33. The low power input buffer of claim 32, further comprising:
   (a) said first n-channel field effect transistor having a source; and
   (b) a second resistor electrically coupling the source of said first n-channel field effect transistor to said ground node.

34. The low power input buffer of claim 33, wherein:
   (a) said first inverter comprises (i) a second p-channel field effect transistor having a gate, drain, and source, said gate of said second p-channel field effect transistor electrically coupled to said first inverter signal input, said source of said second p-channel field effect transistor electrically coupled to said drain of said first p-channel field effect transistor, said drain of said second p-channel field effect transistor electrically coupled to the output of said first inverter and to the drain of a second n-channel field effect transistor, said second n-channel field effect transistor with gate electrically coupled to said first inverter signal input and with source electrically coupled to said drain of said first n-channel field effect transistor, (ii) a third p-channel field effect transistor having a drain, source, and gate, said gate of said third p-channel field effect transistor electrically coupled to said first inverter output, with source of said third p-channel field effect transistor electrically coupled to said first p-channel field effect transistor source, and with drain of said third p-channel field effect transistor electrically coupled to said source of said first n-channel field effect transistor, and (iii) a third n-channel field effect transistor having a gate, source, and drain, said gate of said third n-channel field effect transistor electrically coupled to said first inverter output, with source of said third n-channel field effect transistor electrically coupled to said source of said first n-channel field effect transistor, and said drain of said third n-channel field effect transistor electrically coupled to said source of said first p-channel field effect transistor, whereby said first inverter has input hysteresis circuit electrically coupled between said signal input and said output.

35. The low power input buffer of claim 34, further comprising:
   (a) a third inverter having a signal input and an output, said third inverter electrically coupled between said first and second inverters with signal input electrically coupled to said output of said first inverter and with output electrically coupled to said signal input of said second inverter, said third inverter with power input electrically coupled through said first resistor to said power supply node and with ground input electrically coupled to said second resistor.

36. The low power input buffer of claim 35, further comprising:
   (a) a fourth inverter having a signal input and an output, said fourth inverter electrically coupled between said first and third inverters with signal input electrically coupled to said output of said first inverter and with output electrically coupled to said signal input of said third inverter, said fourth inverter with power input electrically coupled to a tap on said first resistor and with ground input electrically coupled to a tap on said second resistor.

37. The low power input buffer of claim 36, wherein:
   (a) said first resistor comprises first and second p-channel resistive field effect transistors, each of said first and second p-channel resistive field effect transistors having a gate, source, and drain, said gate of said first p-channel resistive field effect transistor electrically coupled to said ground node, said source of said first p-channel resistive field effect transistor electrically coupled to said power supply node and said drain of said first p-channel resistive field effect transistor electrically coupled to the source of said second p-channel resistive field effect transistor, said gate of said second p-channel resistive field effect transistor electrically coupled to said ground node and said drain electrically coupled to said source of said first p-channel field effect transistor, said tap on said first resistor is said drain of said first p-channel resistive field effect transistor.

38. The low power input buffer of claim 36, wherein:
   (a) said second resistor includes first and second n-channel resistive field effect transistors, each of which has a corresponding gate, source, and drain, said gate of said first n-channel resistive field effect transistor electrically coupled to said power supply node, said source of said first n-channel resistive field effect transistor electrically coupled to said ground node and said drain of said first n-channel resistive field effect transistor electrically coupled to the source of said second n-channel resistive field effect transistor, said gate of second n-channel resistive field effect transistor electrically coupled to said power supply node and said drain of said second n-channel resistive field effect transistor electrically coupled to said source of said first n-channel field effect transistor, said tap on said second resistor is said drain of said first n-channel resistive field effect transistor.

39. The low power input buffer of claim 30, further comprising an alternate power supply adapted to be electrically coupled to said power supply node.

40. The low power input buffer of claim 39, wherein said alternate power supply is a parasitic, signal powered power supply.

41. The low power input buffer of claim 40, wherein a diode is electrically coupled between said parasitic, signal powered power supply and said power supply node.

42. The low power input buffer of claim 33, further comprising an alternate power supply electrically coupled to said power supply node.

43. The low power input buffer of claim 42, wherein said alternate power supply is a parasitic, signal powered power supply.

44. The low power input buffer of claim 42, wherein a diode is electrically coupled between said parasitic, signal powered power supply and said power supply node.

45. The low power input buffer of claim 30, wherein said first inverter is a CMOS inverter and said second inverter is a CMOS inverter.

46. The low power input buffer of claim 30, wherein said power supply node and said input node are combined into a signal node.

* * * * *